(12) United States Patent
Kim et al.

(10) Patent No.: US 12,137,604 B2
(45) Date of Patent: *Nov. 5, 2024

(54) ORGANOMETALLIC COMPOUND AND ORGANIC LIGHT-EMITTING DEVICE INCLUDING THE SAME

(71) Applicant: Samsung Electronics Co., Ltd., Suwon-si (KR)

(72) Inventors: Soyeon Kim, Seoul (KR); Ohyun Kwon, Seoul (KR); Jiyoun Lee, Anyang-si (KR); Yongsuk Cho, Hwaseong-si (KR); Jongwon Choi, Yongin-si (KR); Dmitry Kravchuk, Suwon-si (KR); Seungyeon Kwak, Suwon-si (KR); Myungsun Sim, Suwon-si (KR); Sunghun Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1001 days.

This patent is subject to a terminal disclaimer.

(21) Appl. No.: 17/036,088

(22) Filed: Sep. 29, 2020

(65) Prior Publication Data
US 2021/0193937 A1    Jun. 24, 2021

(30) Foreign Application Priority Data
Dec. 20, 2019    (KR) .................. 10-2019-0171890

(51) Int. Cl.
*H01L 51/00*    (2006.01)
*C07F 15/00*    (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ...... H10K 85/342; H10K 50/12; H10K 50/11; C07F 15/0033; C09K 11/06; C09K 2211/185; C09K 2211/1029
See application file for complete search history.

(56) References Cited

U.S. PATENT DOCUMENTS 6,465,115 B2    10/2002    Shi et al.
6,596,415 B2    7/2003    Shi et al.
(Continued)

FOREIGN PATENT DOCUMENTS

CN    104871334 A    8/2015
CN    104885248 B    4/2017
(Continued)

OTHER PUBLICATIONS

English Abstract of JP 2000-003782.
(Continued)

*Primary Examiner* — Michael M Dollinger
(74) *Attorney, Agent, or Firm* — CANTOR COLBURN LLP

(57) ABSTRACT

Provided are an organometallic compound represented by Formula 1 and an organic light-emitting device including the same:

(Continued)

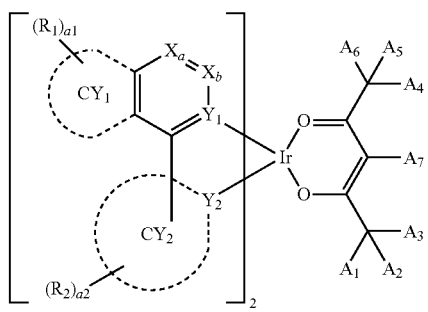

<Formula 1> wherein, in Formula 1, $Y_1$, $Y_2$, $X_a$, $X_b$, ring $CY_1$, ring $CY_2$, $R_1$, $R_2$, $A_1$ to $A_7$, a1, and a2 are as defined in the specification.

19 Claims, 1 Drawing Sheet

(51) Int. Cl.
    *C09K 11/06*     (2006.01)
    *H10K 85/30*     (2023.01)
    *H10K 50/11*     (2023.01)
    *H10K 101/10*     (2023.01)

(52) U.S. Cl.
    CPC ............ *C09K 2211/1007* (2013.01); *C09K 2211/1029* (2013.01); *C09K 2211/185* (2013.01); *H10K 50/11* (2023.02); *H10K 2101/10* (2023.02)

(56) References Cited

U.S. PATENT DOCUMENTS

| | | | |
|---|---|---|---|
| 7,279,704 B2 * | 10/2007 | Walters ............... | H05B 33/14 |
| | | | 257/40 |
| 9,005,771 B2 | 4/2015 | Ma et al. | |
| 10,038,152 B2 | 7/2018 | Kosuge et al. | |
| 2001/0019782 A1 | 9/2001 | Igarashi et al. | |
| 2010/0289406 A1 | 11/2010 | Ma et al. | |
| 2014/0034914 A1 * | 2/2014 | Takada ............... | H10K 50/11 |
| | | | 257/40 |
| 2015/0255734 A1 | 9/2015 | Alleyne et al. | |
| 2015/0295188 A1 | 10/2015 | Kosuge et al. | |
| 2015/0303386 A1 | 10/2015 | Kishino et al. | |
| 2015/0364701 A1 | 12/2015 | Horiuchi et al. | |
| 2015/0364702 A1 * | 12/2015 | Abe ............... | H10K 85/615 |
| | | | 546/4 |
| 2016/0181550 A1 * | 6/2016 | Yamada ............... | C07F 15/0033 |
| | | | 257/40 |
| 2020/0308205 A1 | 10/2020 | Lee et al. | |
| 2023/0397488 A1 | 12/2023 | Choi et al. | |

FOREIGN PATENT DOCUMENTS

| | | | | |
|---|---|---|---|---|
| CN | 111377974 A | | 7/2020 | |
| CN | 111747992 A | | 10/2020 | |
| EP | 3301088 A1 * | | 4/2018 | ........... C07D 215/06 |
| EP | 3715352 A1 | | 9/2020 | |
| JP | 2000003782 A | | 1/2000 | |
| JP | 2014141425 A | | 8/2014 | |
| KR | 20120023780 A | | 3/2012 | |
| KR | 101468065 B1 | | 12/2014 | |
| WO | 2014104386 A1 | | 7/2014 | |
| WO | 2014112658 A1 | | 7/2014 | |
| WO | 2014115528 A1 | | 7/2014 | |
| WO | 2019221446 A1 | | 11/2019 | |
| WO | 2019221487 A1 | | 11/2019 | |

OTHER PUBLICATIONS

English Abstract of KR101468065.
M. A. Baldo, et al., Highly efficient phosphorescent emission from organic electroluminescent devices, Nature, vol. 395, Sep. 10, 1998, 151-154.
M. A. Baldo, et al., Very high-efficiency green organic light-emitting devices based on electrophosphorescence, Appl. Phys. Lett. 75, 4-6 (1999).
Qin Wang, et al., Effects of charged self-assembled quantum dots on two-dimensional quantum transport, Applied Physics Letters, vol. 76, No. 13, Mar. 27, 2000.
Raymond C. Kwong, et al., High operational stability of electrophosphorescent devices, Applied Physics Letters, vol. 81, No. 1, Jul. 1, 2002.
Sergey Lamansky, et al, Highly Phosphorescent Bis-Cyclometalated Iridium Complexes: Synthesis, Photophysical Characterization, and Use in Organic Light Emitting Diodes, J. Am. Chem. Soc. 2001, 123, 4304-4312.
Sergey Lamansky, et al, Synthesis and Characterization of Phosphorescent Cyclometalated Iridium Complexes, Inorg. Chem. 2001, 40, 1704-1711.
Bin Ma, et al., 2-Azatriphenylene materials for organic light emitting diodes, XP055791157, Mar. 30, 2021, 3 pp.
EESR dated Apr. 12, 2021 issued in EP Patent Application No. 20214448.1.
Seo Ywon Kim, et al., XP055791155, Mar. 30, 2021, 31 pp.
Suh S D et al., Preparation of transition metal complex for organic light emitting diode, XP055791156, Mar. 30, 2021, 8 pp.
English Translation of Office Action dated Jan. 8, 2024, issued in corresponding CN Patent Application No. 202011501235.0, 11 pp.
Office Action dated Jan. 8, 2024, issued in corresponding CN Patent Application No. 202011501235.0, 9 pp.
English Translation of Office Action dated Jul. 30, 2024, issued in corresponding KR Patent Application No. 10-2019-0171890, 11 pp.
Office Action dated Jul. 30, 2024, issued in corresponding KR Patent Application No. 10-2019-0171890, 12 pp.

* cited by examiner

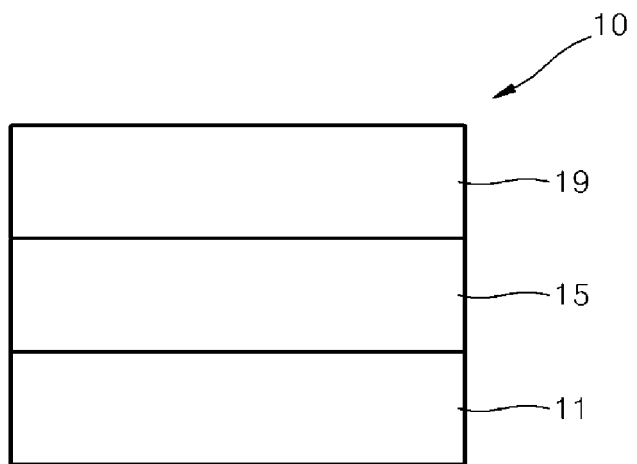

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2019-0171890, filed on Dec. 20, 2019, in the Korean Intellectual Property Office, the disclosure of which is incorporated herein in its entirety by reference.

BACKGROUND

1. Field

One or more embodiments relate to an organometallic compound and an organic light-emitting device including the same.

2. Description of the Related Art

Organic light-emitting devices are self-emission devices, which have better characteristics in terms of a viewing angle, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

Aspects of the present disclosure provide an organometallic compound and an organic light-emitting device including the same.

Additional aspects will be set forth in part in the description which follows and, in part, will be apparent from the description, or may be learned by practice of the presented embodiments.

According to an aspect of an embodiment, provided is an organometallic compound represented by Formula 1.

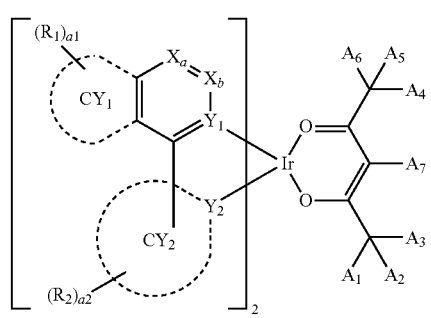

<Formula 1>

In Formula 1, $Y_1$ is N, $Y_2$ is C, and ring $CY_1$ is a group represented by Formula 1-1 or 1-2,

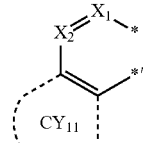

1-1

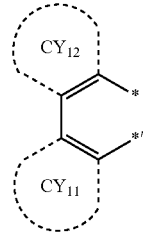

1-2 in Formulae 1, 1-1 and 1-2, ring $CY_2$, ring $CY_{11}$, and ring $CY_{12}$ are each independently a $C_5$-$C_{30}$ carbocyclic group or a $C_1$-$C_{30}$ heterocyclic group, in Formula 1, $X_a$ is N or $C(T_a)$, and $X_b$ is N or $C(T_b)$, in Formula 1-1, $X_1$ is N or $C(R_{11})$, and $X_2$ is N or $C(R_{12})$, in Formulae 1-1 and 1-2, * and *' are condensation sites to the adjacent 6-membered ring of Formula 1, in Formula 1, $R_1$, $R_2$, $T_a$, $T_b$, and $A_1$ to $A_7$ are each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), $R_{11}$ and $R_{12}$ are the same as defined above in connection with $R_1$, a1 is an integer of 1 to 20, and when a1 is 2 or greater, two or more of $R_1$(s) are identical to or different from each other, a2 is an integer of 0 to 20, and when a2 is 2 or greater, two or more of $R_2$(s) are identical to or different from each other, at least one of $R_1$(s) in number of a1 is a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, or a substituted or unsubstituted monovalent non-aromatic condensed polycyclic group, two or more of $R_1(s)$ in number of a1 are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $R_2(s)$ in number of a2 are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, $R_1$ and $R_2$ are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $A_1$ to $A_7$ are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, $R_{1a}$ is the same as defined in connection with $A_7$, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof, —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$), or any combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group unsubstituted or substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

According to an aspect of another embodiment, an organic light-emitting device includes a first electrode, a second electrode, and an organic layer disposed between the first electrode and the second electrode and including an emission layer, wherein the organic layer includes at least one organometallic compound represented by Formula 1.

In one or more embodiment, the organometallic compound may serve as a dopant in the emission layer of the organic layer.

BRIEF DESCRIPTION OF THE DRAWING

These and/or other aspects will become apparent and more readily appreciated from the following description of the embodiments, taken in conjunction with FIGURE is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1.

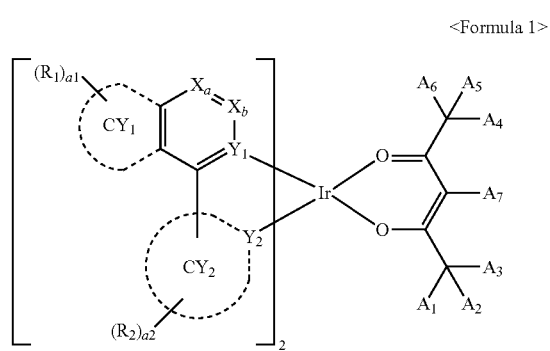

<Formula 1>

In Formula 1, $Y_1$ may be N, $Y_2$ may be C, and ring $CY_1$ may be a group represented by Formula 1-1 or 1-2.

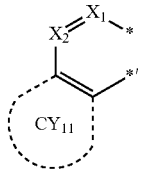

1-1

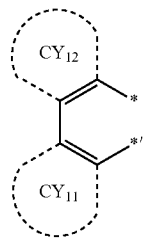
1-2

In Formulae 1, 1-1, and 1-2, ring $CY_2$, ring $CY_{11}$, and ring $CY_{12}$ may each independently be a $C_5$-$C_{30}$ carbocyclic group or a $C_1$-$C_{30}$ heterocyclic group.

For example, in Formulae 1, 1-1, and 1-2, ring $CY_2$, ring $CY_{11}$, and ring $CY_{12}$ may each independently be: i) a first ring; ii) a second ring; iii) a condensed ring in which two or more first rings are condensed to each other; iv) a condensed ring in which two or more second rings are condensed to each other; or v) a condensed ring in which one or more first rings and one or more second rings are condensed to each other, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazol group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornene group, a bicyclo[1.1.1]pentane group, a bicyclo[2.1.1]hexane group, a bicyclo[2.2.1]heptane group (norbornane group), a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, in Formulae 1, 1-1 and 1-2, ring $CY_2$, ring $CY_{11}$ and ring $CY_{12}$ may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazol group, a benzopyrazole group, a benzimidazole group, a benzoxazole group, a benzothiazole group, a benzoxadiazole group, a benzothiadiazol group, a 5,6,7,8-tetrahydroisoquinoline group, a 5,6,7,8-tetrahydroquinoline group, an adamantane group, norbornane group, or a norbornene group.

In one or more embodiments, in Formula 1, ring $CY_2$ may be a benzene group, a naphthalene group, a 1,2,3,4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

In one or more embodiments, in Formulae 1-1 and 1-2, ring CY-n and ring $CY_{12}$ may each independently be a benzene group, a naphthalene group, a 1,2,3,4-tetrahydronaphthalene group, a pyridine group, a pyrimidine group, a quinoline group, an isoquinoline group, a quinazoline group, or a quinoxaline group.

In Formula 1, $X_a$ may be N or $C(T_a)$, and $X_b$ may be N or $C(T_b)$.

For example, in Formula 1, $X_a$ may be $C(T_a)$, and $X_b$ may be $C(T_b)$.

In other embodiments, in Formula 1, $X_a$ may be $C(T_a)$, and $T_a$ may not be hydrogen.

In Formula 1-1, $X_1$ may be N or $C(R_{11})$, and $X_2$ may be N or $C(R_{12})$.

For example, in Formula 1-1, $X_1$ may be $C(R_{11})$, and $X_2$ may be $C(R_{12})$.

In other embodiments, in Formula 1-1, $X_1$ may be $C(R_{11})$, and $R_{11}$ may not be hydrogen.

In other embodiments, in Formula 1-1, $X_2$ may be $C(R_{12})$, and $R_{12}$ may not be hydrogen.

In Formulae 1-1 and 1-2, * and *' may be condensation sites to the adjacent 6-membered ring of Formula 1.

In Formula 1, $R_1$, $R_2$, $T_a$, $T_b$ and $A_1$ to $A_7$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), R$_{11}$ and R$_{12}$ will be understood with reference to the description of R$_1$ herein.

Q$_1$ to Q$_9$ may be the same as described above herein.

In Formula 1, a1, which indicates the number of R$_1$(s), may be an integer of 1 to 20. For example, a1 may be an integer of 1 to 8. When a1 is 2 or greater, two or more of R$_1$ (s) may be identical to or different from each other.

In Formula 1, a2, which indicates the number of R$_2$(s), may be an integer of 0 to 20. For example, a2 may be 0, 1, 2, 3, or 4. When a2 is 2 or greater, two or more of R$_2$(s) may be identical to or different from each other. In one or more embodiments, a2 may be 2.

In one or more embodiments, in Formula 1, R$_1$, T$_a$, and T$_b$ each may not include a fluoro group (—F).

In one or more embodiments, in Formula 1, R$_1$, R$_2$, T$_a$ and T$_b$ each may not include a fluoro group (—F).

For example, R$_1$, R$_2$, T$_a$, T$_b$, and A$_1$ to A$_7$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, C$_1$-C$_{20}$ alkyl group, or a C$_1$-C$_{20}$ alkoxy group;

a C$_1$-C$_{20}$ alkyl group or a C$_1$-C$_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a deuterated C$_1$-C$_{20}$ alkyl group, a fluorinated C$_1$-C$_{20}$ alkyl group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group (norbornanyl group), a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.1]heptyl group, a (C$_1$-C$_{20}$ alkyl)bicyclo[2.2.2]octyl group, a silolanyl group, a phenyl group, a (C$_1$-C$_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a silolanyl group, a phenyl group, a (C$_1$-C$_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a deuterated C$_1$-C$_{20}$ alkyl group, a fluorinated C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.1]heptyl group, a (C$_1$-C$_{20}$ alkyl)bicyclo[2.2.2]octyl group, a silolanyl group, a phenyl group, a (C$_1$-C$_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$) or —P(Q$_8$)(Q$_9$), and Q$_1$ to Q$_9$ may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, sec isopentyl group, a phenyl group, a biphenyl group, or a naphthyl group, each unsubstituted or substituted with deuterium, a C$_1$-C$_{20}$ alkyl group, a phenyl group, or any combination thereof.

In one or more embodiments, R$_1$, R$_2$, T$_a$, T$_b$, and A$_1$ to A$_7$ may each independently be hydrogen, deuterium, a substituted or unsubstituted C$_1$-C$_{20}$ alkyl group, a substituted or unsubstituted C$_3$-C$_{10}$ cycloalkyl group, a substituted or unsubstituted C$_1$-C$_{10}$ heterocycloalkyl group, a substituted or unsubstituted a phenyl group, —Si(Q$_3$)(Q$_4$)(Q$_5$), or —Ge(Q$_3$)(Q$_4$)(Q$_5$).

In one or more embodiments, R$_1$, R$_2$, T$_a$, T$_b$, and A$_1$ to A$_7$ may each independently be:

hydrogen or deuterium;

a C$_1$-C$_{30}$ alkyl group, a C$_3$-C$_{10}$ cycloalkyl group, or a phenyl group, each unsubstituted or substituted with deuterium, a C$_1$-C$_{30}$ alkyl group, a deuterated C$_1$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, a biphenyl group or any combination thereof; or —Si(Q$_3$)(Q$_4$)(Q$_5$), or —Ge(Q$_3$)(Q$_4$)(Q$_5$).

In one or more embodiments, in Formula 1, at least one of R$_1$(s) in number of a1 (for example, one, two, or three of R$_1$(s) in number of a1) may a group having three or more carbons (for example, 3 to 20 carbons, 4 to 20 carbons, or 5 to 20 carbons).

In one or more embodiments, in Formula 1, at least one of R$_1$(s) in number of a1 (for example, one, two, or three of R$_1$(s) in number of a1) may each independently be a C$_1$-C$_{30}$ alkyl group, a C$_3$-C$_{10}$ cycloalkyl group, or a phenyl group, each unsubstituted or substituted with deuterium, a C$_1$-C$_{30}$ alkyl group, a deuterated C$_1$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, a biphenyl group or any combination thereof.

In one or more embodiments, in Formula 1, at least one of R$_1$(s) in number of a1 (for example, one, two, or three of R$_1$(s) in number of a1) may each independently be a group represented by Formula 2.

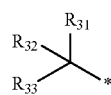

In Formula 2,

R$_{31}$ to R$_{33}$ may each independently be hydrogen, deuterium, a C$_1$-C$_{30}$ alkyl group, a deuterated C$_1$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, or a biphenyl group, and * is a binding site to an adjacent atom.

For example, in Formula 2, at least one of R$_{31}$ to R$_{33}$ may not be hydrogen.

In one or more embodiments, the group represented by Formula 2 may satisfy at least one of <Condition A> and <Condition B>:

<Condition A> in Formula 2, two or more of R$_{31}$ to R$_{33}$ are each independently a C$_1$-C$_{30}$ alkyl group, a deuterated C$_1$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, or a biphenyl group; and <Condition B> in Formula 2, one or more of R$_{31}$ to R$_{33}$ are each independently a C$_2$-C$_{30}$ alkyl group, a deuterated C$_2$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, or a biphenyl group.

In one or more embodiments, in Formula 1, a2 may be 2.

In one or more embodiments, in Formula 1, a2 may be 2, two R$_2$(s) may each independently be a substituted or unsubstituted C$_1$-C$_{60}$ alkyl group.

In one or more embodiments, in Formula 1, the number of carbons in a group represented by *—C(A$_1$)(A$_2$)(A$_3$) may be 5 or greater (for example, 5 to 20, 6 to 20, or 7 to 20).

In one or more embodiments, in Formula 1, the number of carbons in a group represented by *—C(A$_4$)(A$_5$)(A$_6$) may be 5 or greater (for example, 5 to 20, 6 to 20, or 7 to 20).

In one or more embodiments, in Formula 1, at least one of A$_1$ to A$_6$ may each independently be a substituted or unsubstituted C$_1$-C$_{60}$ alkyl group, a substituted or unsubstituted C$_3$-C$_{10}$ cycloalkyl group, a substituted or unsubstituted C$_2$-C$_{10}$ heterocycloalkyl group, a substituted or unsubstituted C$_6$-C$_{60}$ aryl group, a substituted or unsubstituted C$_2$-C$_{60}$ heteroaryl group, a substituted or unsubstituted monovalent non-aromatic condensed polycyclic group, or a substituted or unsubstituted monovalent non-aromatic condensed heteropolycyclic group.

In other embodiments, in Formula 1, A$_1$ and A$_4$ may each independently include at least one carbon (for example, two or more carbons).

In other embodiments, in Formula 1, A$_2$ to A$_5$ may each independently include at least one carbon (for example, two or more carbons).

In other embodiments, in Formula 1, A$_1$ to A$_6$ may each independently include at least one carbon (for example, two or more carbons).

In other embodiments, in Formula 1, at least one of A$_1$ to A$_6$ may include carbon.

For example, the organometallic compound represented by Formula 1 may satisfy at least one of <Condition 1> to <Condition 3>:

<Condition 1> in Formula 1, A$_1$ to A$_6$ are each independently a substituted or unsubstituted C$_1$-C$_{60}$ alkyl group, a substituted or unsubstituted C$_3$-C$_{10}$ cycloalkyl group, a substituted or unsubstituted C$_2$-C$_{10}$ heterocycloalkyl group, a substituted or unsubstituted C$_6$-C$_{60}$ aryl group, a substituted or unsubstituted C$_2$-C$_{60}$ heteroaryl group, a substituted or unsubstituted monovalent non-aromatic condensed polycyclic group, or a substituted or unsubstituted monovalent non-aromatic condensed heteropolycyclic group (for example, a $C_1$-$C_{30}$ alkyl group, a $C_3$-$C_{10}$ cycloalkyl group, or a phenyl group, each unsubstituted or substituted with deuterium, a $C_1$-$C_{30}$ alkyl group, a deuterated $C_1$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, a biphenyl group or any combination thereof;

<Condition 2> in Formula 1, at least one of $A_1$ to $A_6$ are each independently a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group (for example, a $C_2$-$C_{30}$ alkyl group, a $C_3$-$C_{10}$ cycloalkyl group, or a phenyl group, each unsubstituted or substituted with deuterium, a $C_1$-$C_{30}$ alkyl group, a deuterated $C_1$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, a biphenyl group, or any combination thereof; and <Condition 3> in Formula 1, $A_7$ is a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group (for example, a $C_1$-$C_{30}$ alkyl group, a $C_3$-$C_{10}$ cycloalkyl group, or a phenyl group, each unsubstituted or substituted with deuterium, a $C_1$-$C_{30}$ alkyl group, a deuterated $C_1$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, a biphenyl group, or any combination thereof.

In one or more embodiments, the organometallic compound represented by Formula 1 may satisfy at least one of <Condition 1> and <Condition 2>.

When the organometallic compound represented by Formula 1 satisfies at least one of <Condition 1> and <Condition 2> as described above, the organometallic compound represented by Formula 1 may have relatively large steric hindrance, thus reducing triplet-triplet extinction. Accordingly, an electronic device, for example, an organic light-emitting device, using the organometallic compound represented by Formula 1, may have improved internal quantum luminescence efficiency.

In one or more embodiments, the organometallic compound represented by Formula 1 may satisfy at least one of <Condition 4> and <Condition 5>:

<Condition 4> in Formula 1, two or more of $A_1$ to $A_3$ of the group represented by *—$C(A_1)(A_2)(A_3)$ are linked with C in the group represented by *—$C(A_1)(A_2)(A_3)$ to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (norbornane group), a bicyclo[2.2.2]octane group, a cyclopentane group, a cyclohexane group, or a cyclohexene group, each unsubstituted or substituted with at least one $R_{1a}$);

<Condition 5> in Formula 1, two or more of $A_4$ to $A_6$ of the group represented by *—$C(A_4)(A_5)(A_6)$ are linked with C in the group represented by *—$C(A_4)(A_5)(A_6)$ to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (norbornane group), a bicyclo[2.2.2]octane group, a cyclopentane group, a cyclohexane group, or a cyclohexene group, each unsubstituted or substituted with at least one $R_{1a}$).

In one or more embodiments, in Formula 1, the group represented by *—$C(A_1)(A_2)(A_3)$ and the group represented by *—$C(A_4)(A_5)(A_6)$ may be identical to each other.

In one or more embodiments, in Formula 1, the group represented by *—$C(A_1)(A_2)(A_3)$ and the group represented by *—$C(A_4)(A_5)(A_6)$ may be different from each other.

In one or more embodiments, in Formula 1, the following case may be excluded: 1) $A_7$ is hydrogen, and 2) the group represented by *—$C(A_1)(A_2)(A_3)$ and the group represented by *—$C(A_4)(A_5)(A_6)$ are both a methyl group.

In one or more embodiments, in Formula 1, the following case may be excluded: 1) $A_7$ is hydrogen, and 2) all of $A_1$ to $A_6$ are a methyl group.

In one or more embodiments, in Formula 1, $R_1$, $R_2$, $T_a$, $T_b$, and $A_1$ to $A_7$ may each independently be hydrogen, deuterium, —$CH_3$, —$CD_3$, —$CD_2H$, —$CDH_2$, a group represented by one of Formulae 9-1 to 9-39, a group represented by one of Formulae 9-1 to 9-39 in which at least one hydrogen is substituted with deuterium, a group represented by one of Formulae 9-201 to 9-233, a group represented by one of Formulae 9-201 to 9-233 in which at least one hydrogen is substituted with deuterium, a group represented by one of Formulae 10-1 to 10-126, a group represented by one of Formulae 10-1 to 10-126 in which at least one hydrogen is substituted with deuterium, a group represented by one of Formulae 10-201 to 10-343, a group represented by one of Formulae 10-201 to 10-343 in which at least one hydrogen is substituted with deuterium, —Si($Q_3$)($Q_4$)($Q_5$), or —Ge($Q_3$)($Q_4$)($Q_5$) (wherein $Q_3$ to $Q_5$ will be understood with reference to the description thereof herein).

In one or more embodiments, in Formula 1, at least one of $R_1$(s) in number of a1 (for example, one, two, or three of $R_1$(s) in number of a1) may be —$CH_3$, —$CD_3$, —$CD_2H$, —$CDH_2$, a group represented by one of Formulae 9-1 to 9-39, a group represented by one of Formulae 9-1 to 9-39 in which at least one hydrogen is substituted with deuterium, a group represented by one of Formulae 9-201 to 9-233, a group represented by one of Formulae 9-201 to 9-233 in which at least one hydrogen is substituted with deuterium, a group represented by one of Formulae 10-1 to 10-11, or a group represented by one of Formulae 10-1 to 10-11 in which at least one hydrogen is substituted with deuterium.

In one or more embodiments, in Formula 2, $R_{31}$ to $R_{33}$ may each independently be hydrogen, deuterium, —$CH_3$, —$CD_3$, —$CD_2H$, —$CDH_2$, a group represented by one of Formulae 9-1 to 9-39, a group represented by one of Formulae 9-1 to 9-39 in which at least one hydrogen is substituted with deuterium, a group represented by one of Formulae 9-201 to 9-227, a group represented by one of Formulae 9-201 to 9-227 in which at least one hydrogen is substituted with deuterium, a group represented by one of Formulae 10-1 to 10-9 and 10-12 to 10-126, or a group represented by one of Formulae 10-1 to 10-9 and 10-12 to 10-126 in which at least one hydrogen is substituted with deuterium.
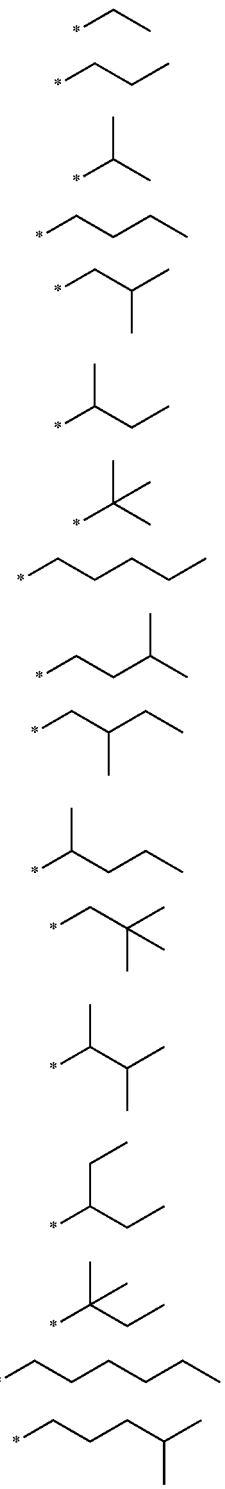
9-1
9-2
9-3
9-4
9-5
9-6
9-7
9-8
9-9
9-10
9-11
9-12
9-13
9-14
9-15
9-16
9-17
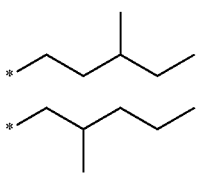
9-18
9-19
9-20
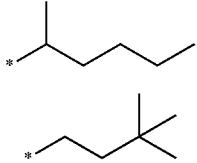
9-21
9-22
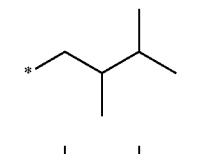
9-23
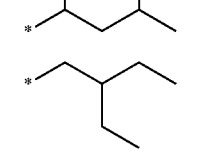
9-24
9-25
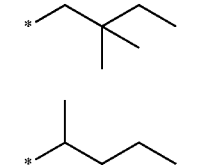
9-26
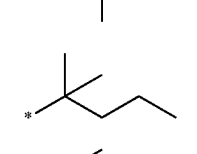
9-27
9-28
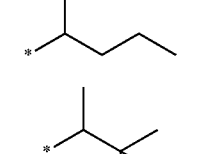
9-29
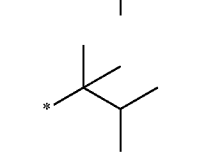
9-30
9-31
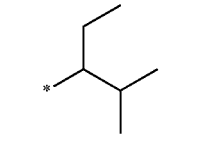
9-32
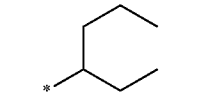

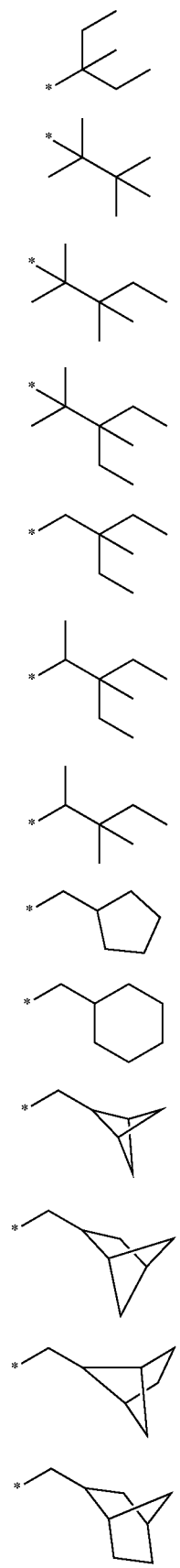
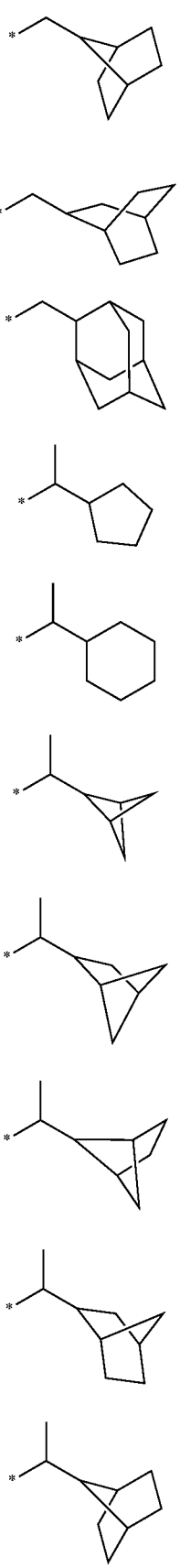

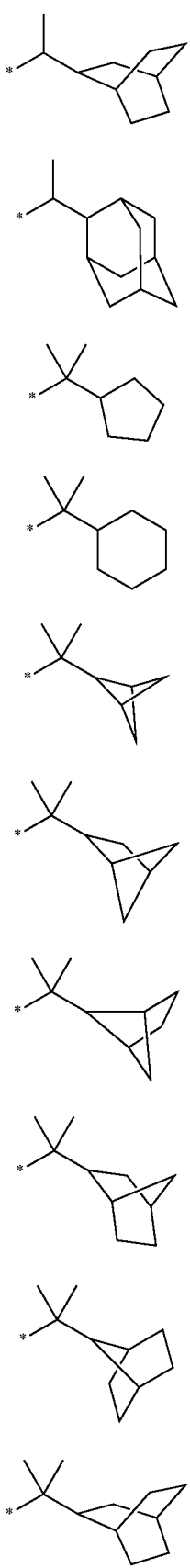
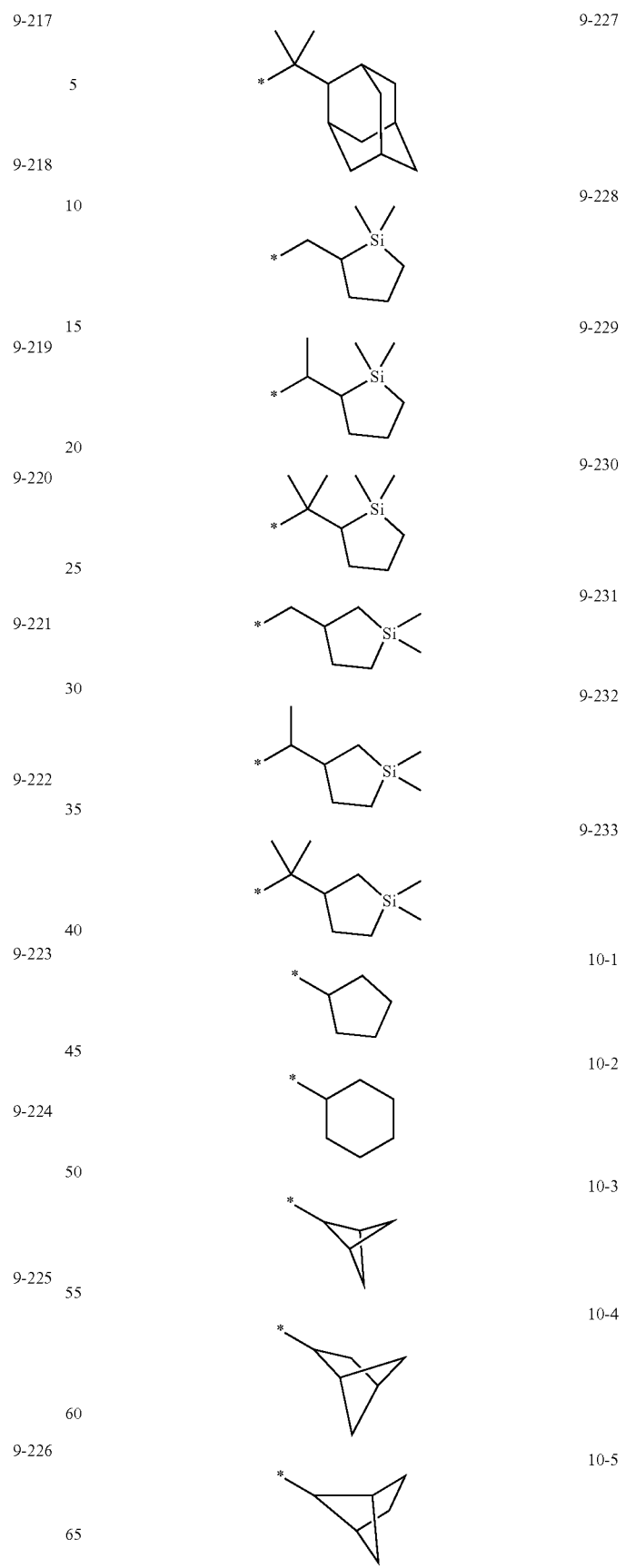

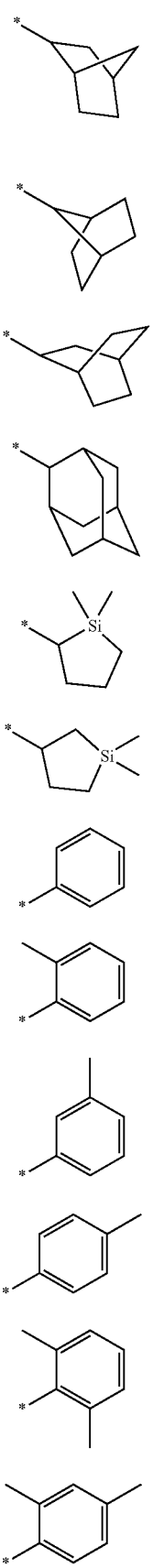
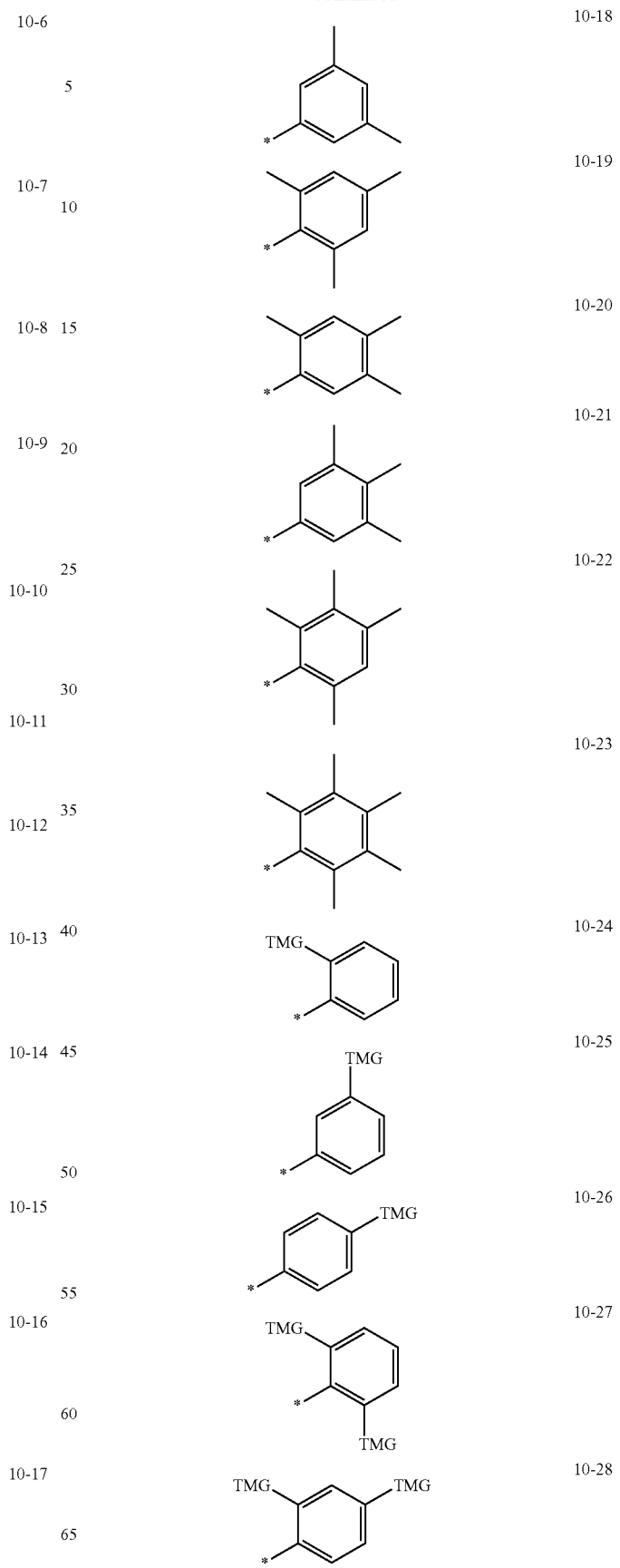

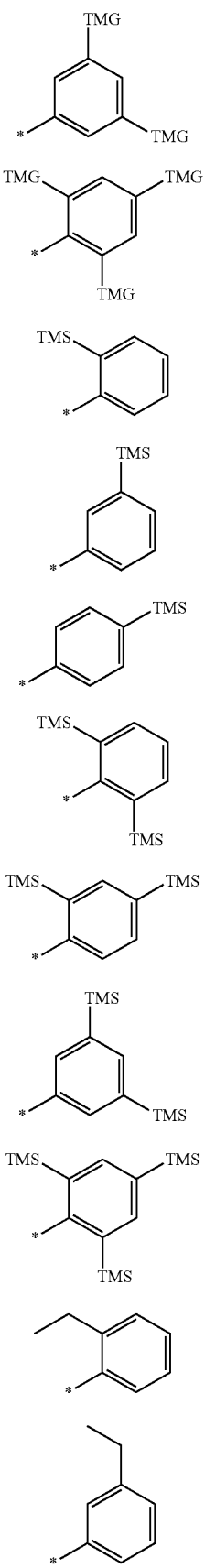
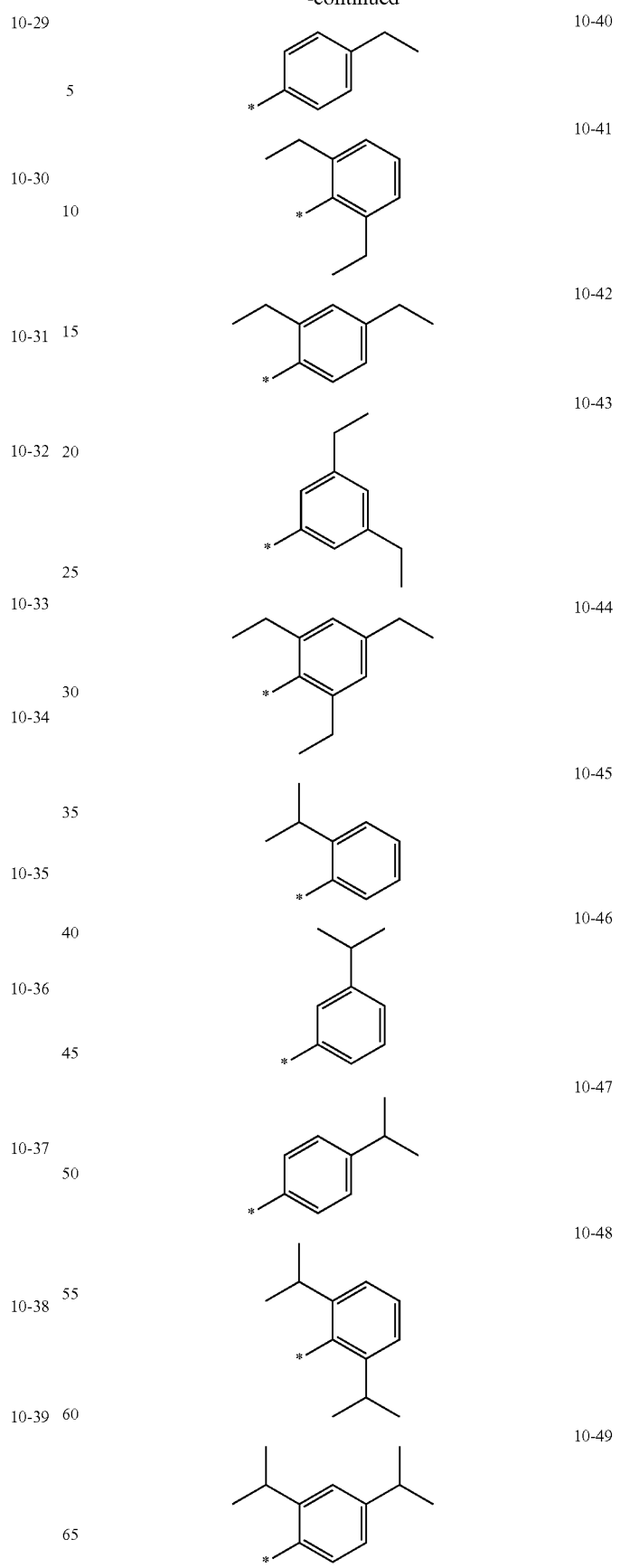

10-50
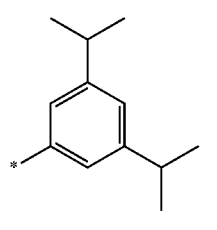
10-51
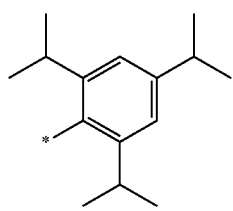
10-52
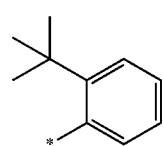
10-53
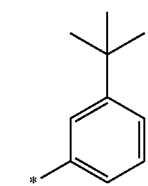
10-54
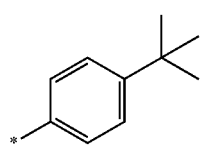
10-55
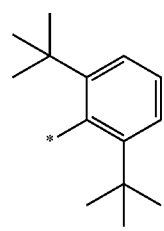
10-56
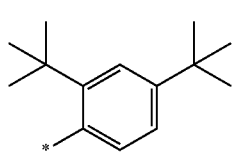
10-57
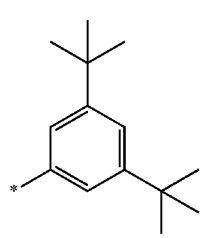
10-58
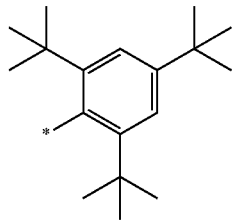
10-59
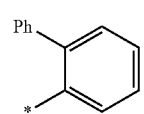
10-60
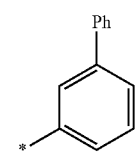
10-61
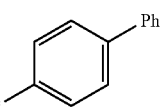
10-62
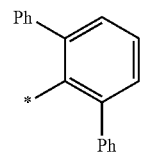
10-63
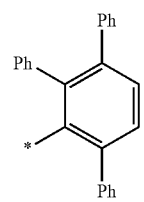
10-64
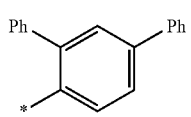
10-65
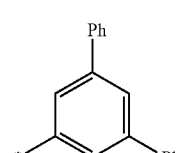
10-66
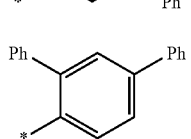
10-67
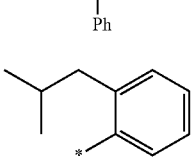

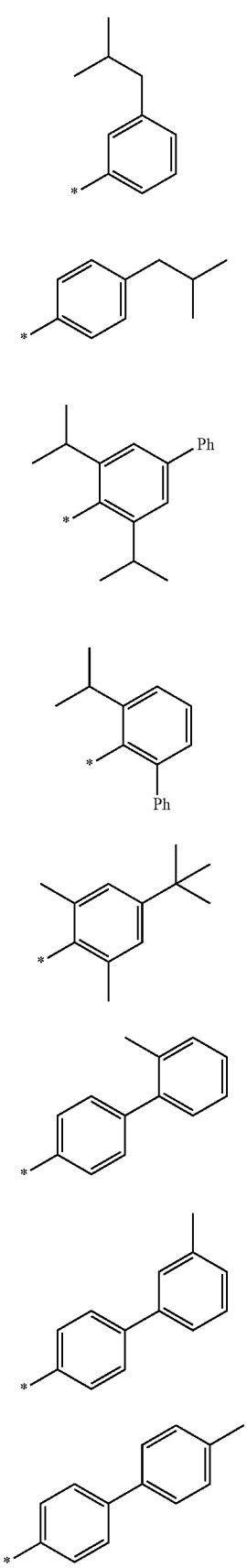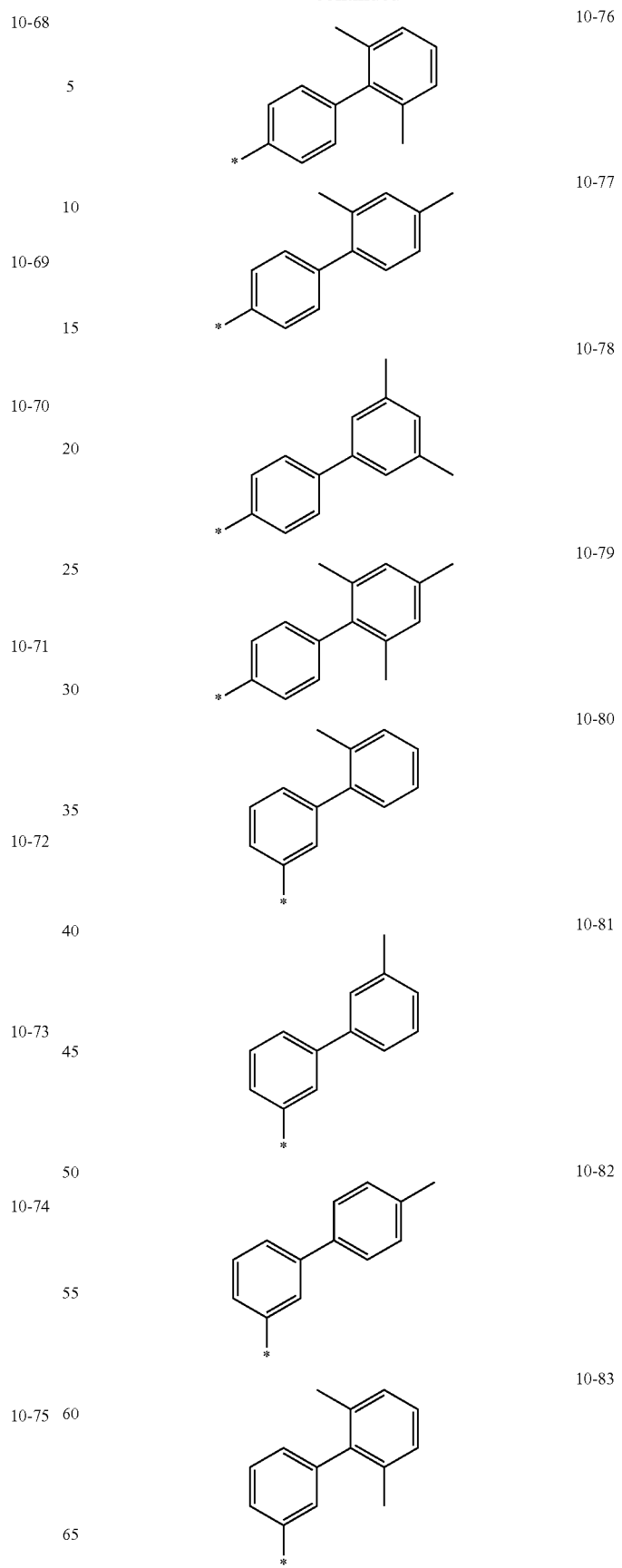

-continued
10-84
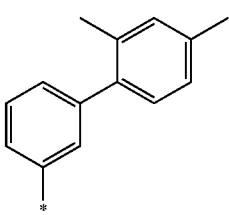
10-85
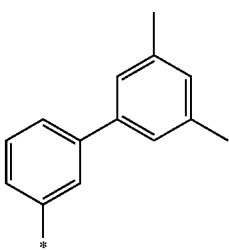
10-86
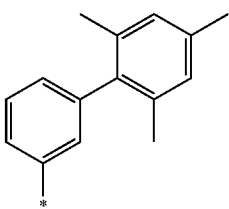
10-87
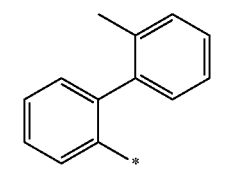
10-88
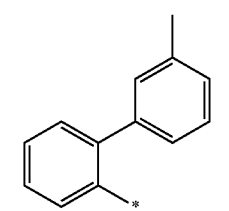
10-89
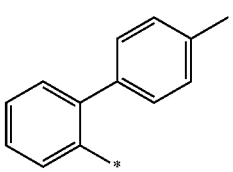
10-90
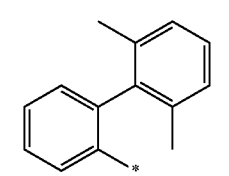
10-91
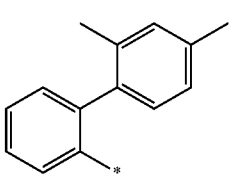
-continued
10-92
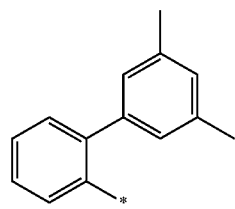
10-93
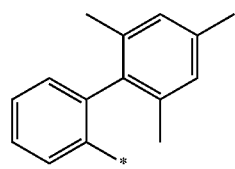
10-94
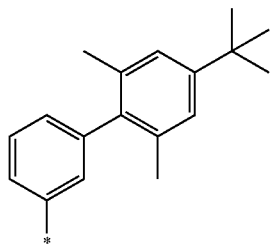
10-95
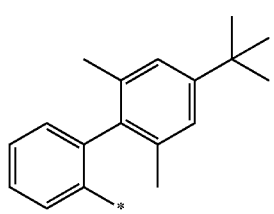
10-96
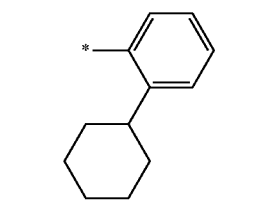
10-97
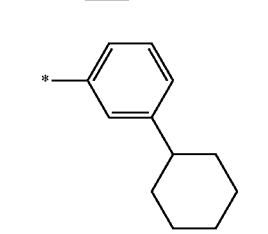
10-98
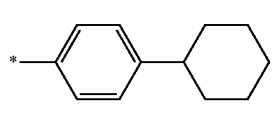
10-99
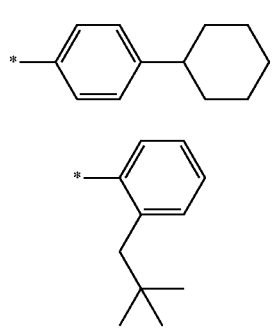

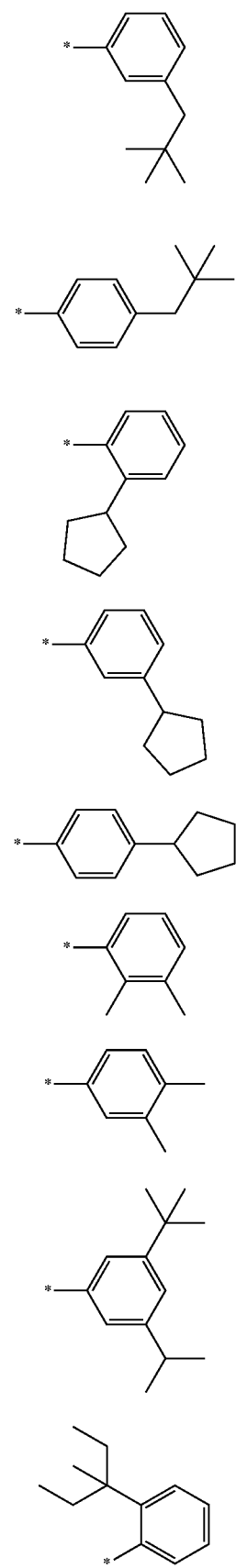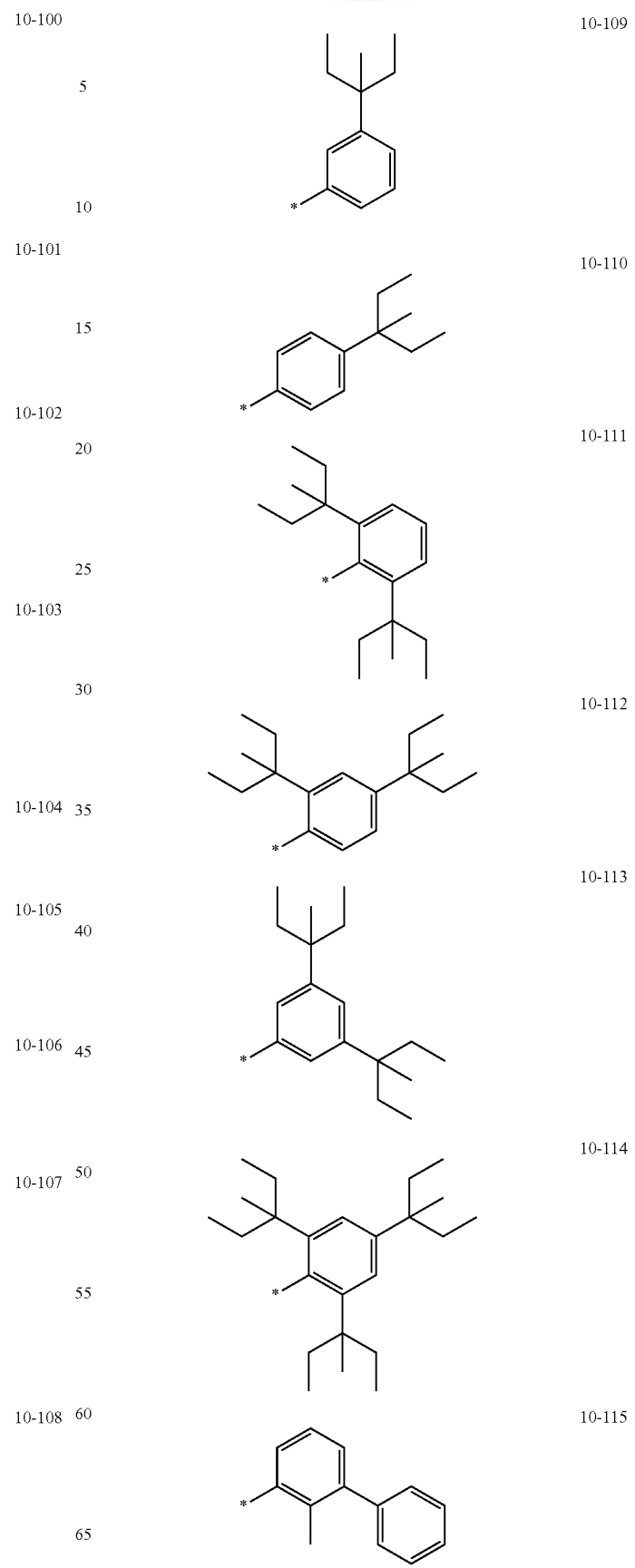

10-116
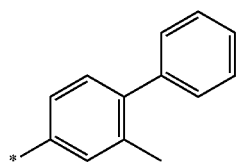
10-117
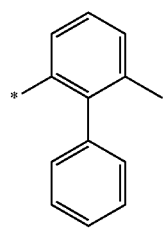
10-118
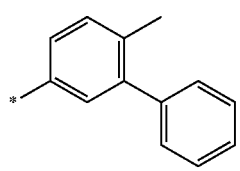
10-119
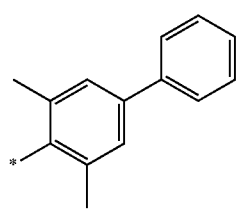
10-120
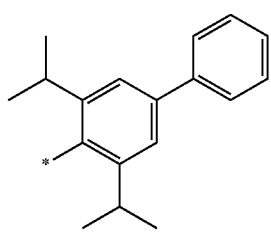
10-121
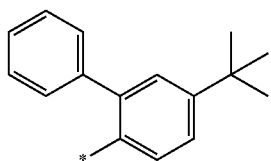
10-122
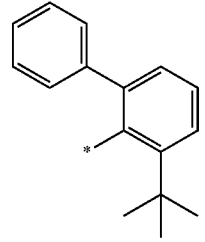
10-123
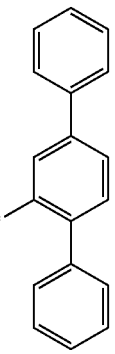
10-124
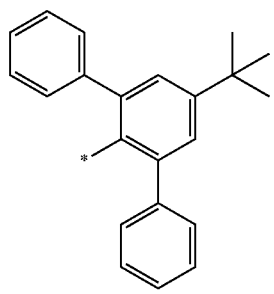
10-125
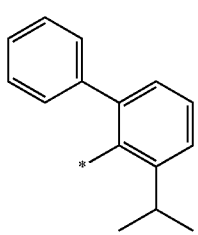
10-126
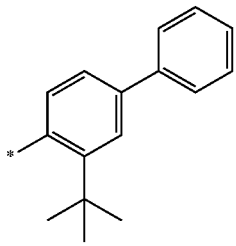
10-201
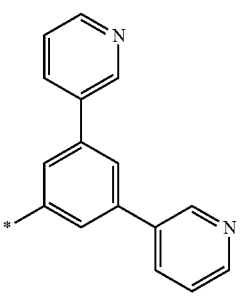

10-202

10-203

10-204

10-205

10-206

10-207

10-208

10-209

10-210

10-211

10-212

10-213

10-214

10-215

10-216

10-217

10-218

10-219

10-220

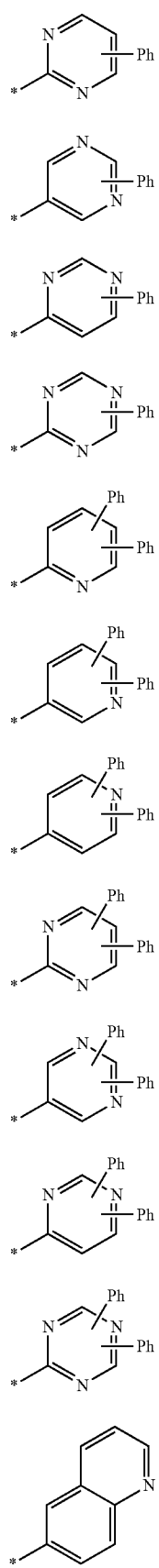
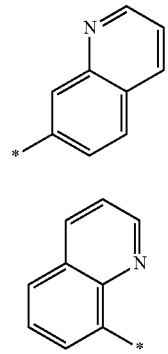

10-241 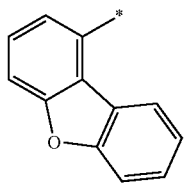
10-242 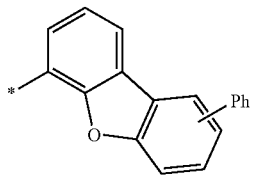
10-243 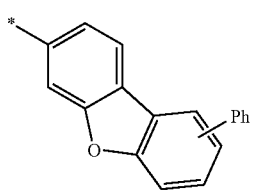
10-244 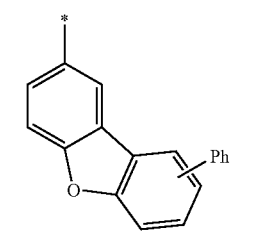
10-245 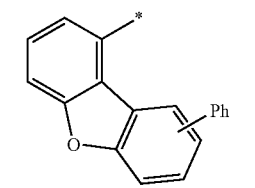
10-246 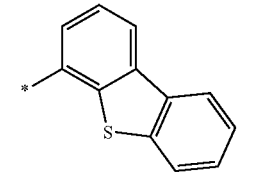
10-247 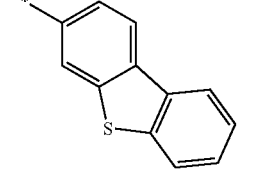
10-248 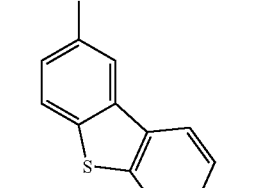
10-249 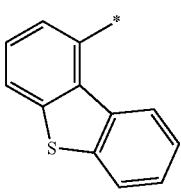
10-250 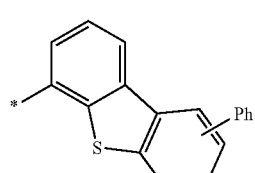
10-251 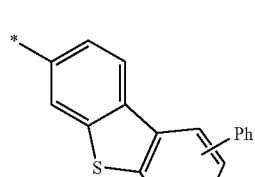
10-252 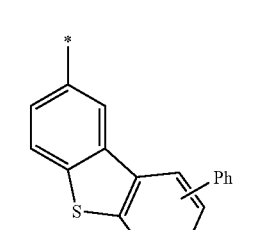
10-253 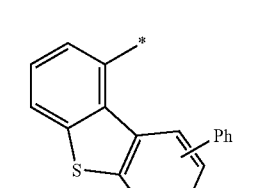
10-254 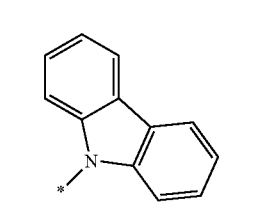
10-255 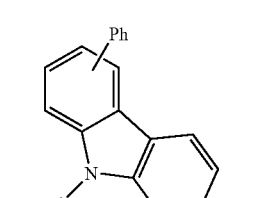
10-256 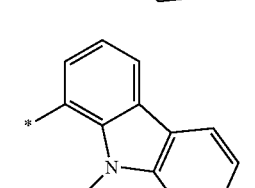

10-257 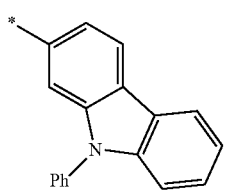
10-258 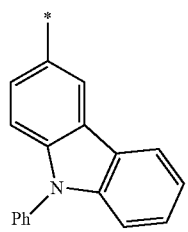
10-259 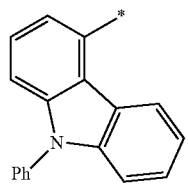
10-260 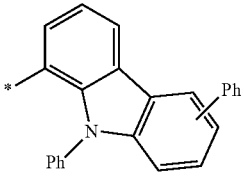
10-261 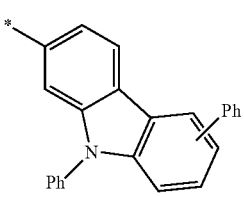
10-262 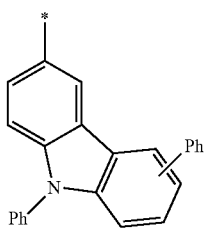
10-263 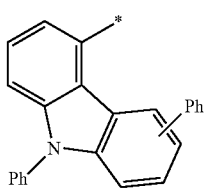
10-264 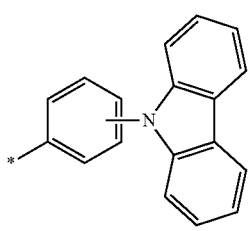
10-265 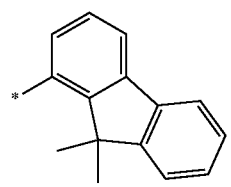
10-266 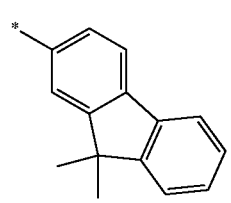
10-267 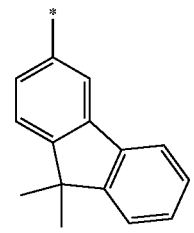
10-268 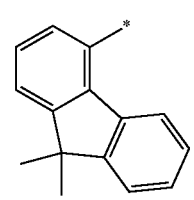
10-269 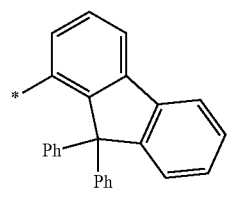
10-270 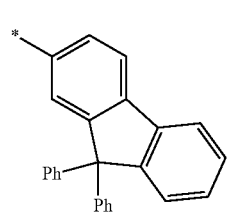

-continued
10-271 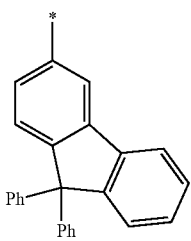
10-272 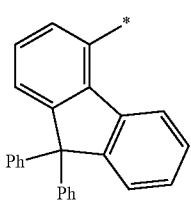
10-273 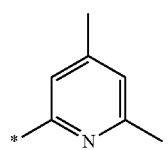
10-274 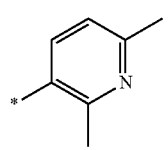
10-275 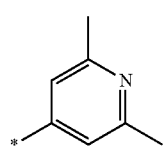
10-276 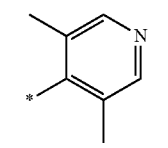
10-277 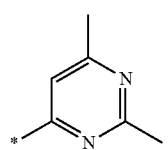
10-278 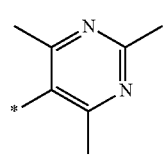
10-279 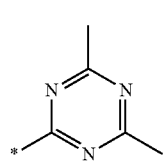
-continued
10-280 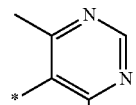
10-281 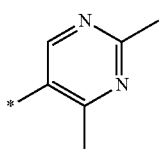
10-282 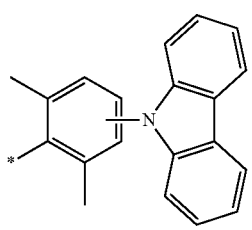
10-283 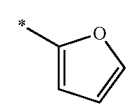
10-284 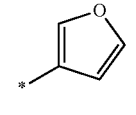
10-285 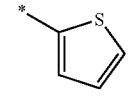
10-286 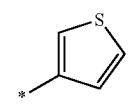
10-287 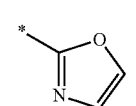
10-288 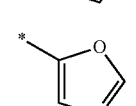
10-289 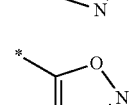
10-290 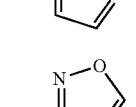
10-291 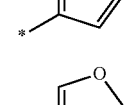
10-292

| | |
|---|---|
| 10-293 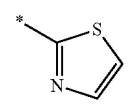 | 10-306 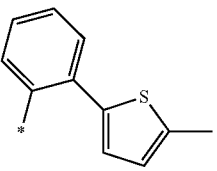 |
| 10-294 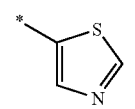 | 10-307 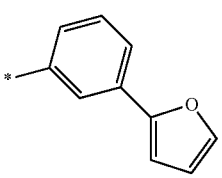 |
| 10-295 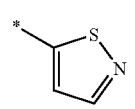 | 10-308 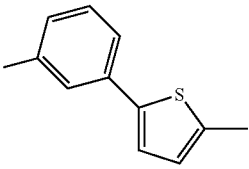 |
| 10-296 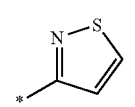 | 10-309 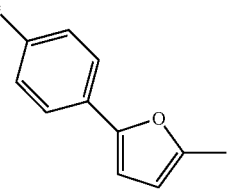 |
| 10-297 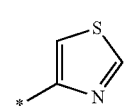 | 10-310 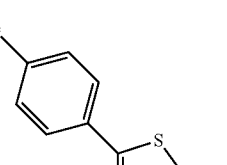 |
| 10-298 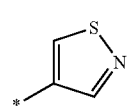 | |
| 10-299 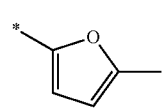 | |
| 10-300 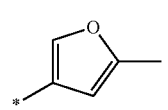 | 10-311 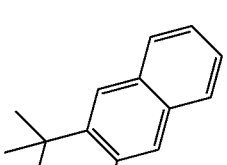 |
| 10-301 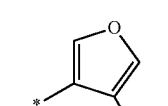 | |
| 10-302 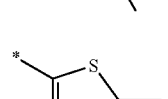 | 10-312 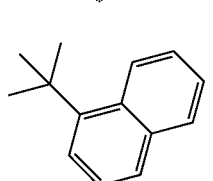 |
| 10-303 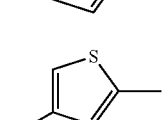 | |
| 10-304 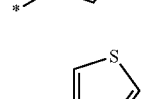 | 10-313 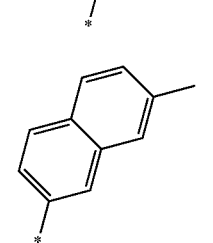 |
| 10-305 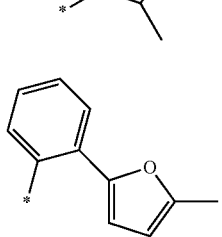 | |

| | |
|---|---|
| 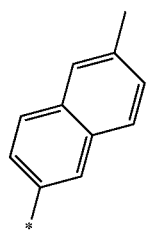 | 10-314 |
| 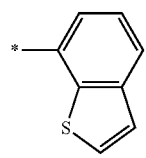 | 10-315 |
| 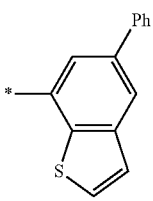 | 10-316 |
| 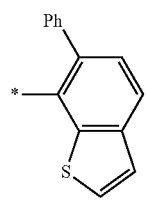 | 10-317 |
| 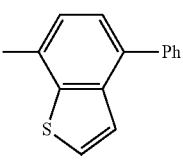 | 10-318 |
| 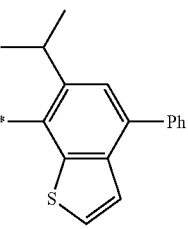 | 10-319 |
| 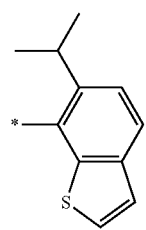 | 10-320 |
| 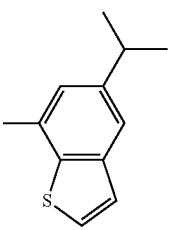 | 10-321 |
| 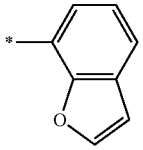 | 10-322 |
| 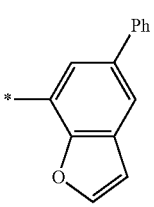 | 10-323 |
| 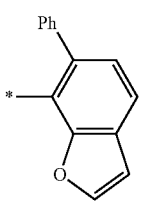 | 10-324 |
| 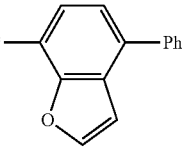 | 10-325 |
| 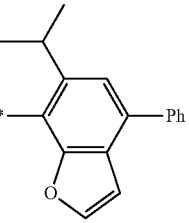 | 10-326 |
| 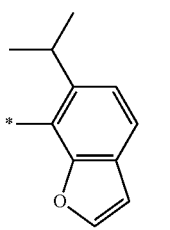 | 10-327 |

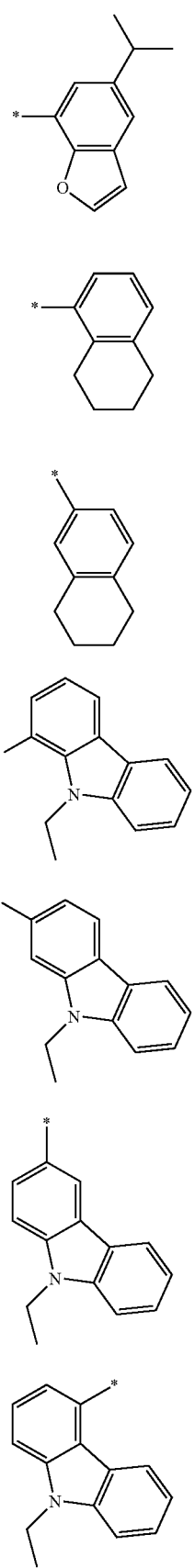
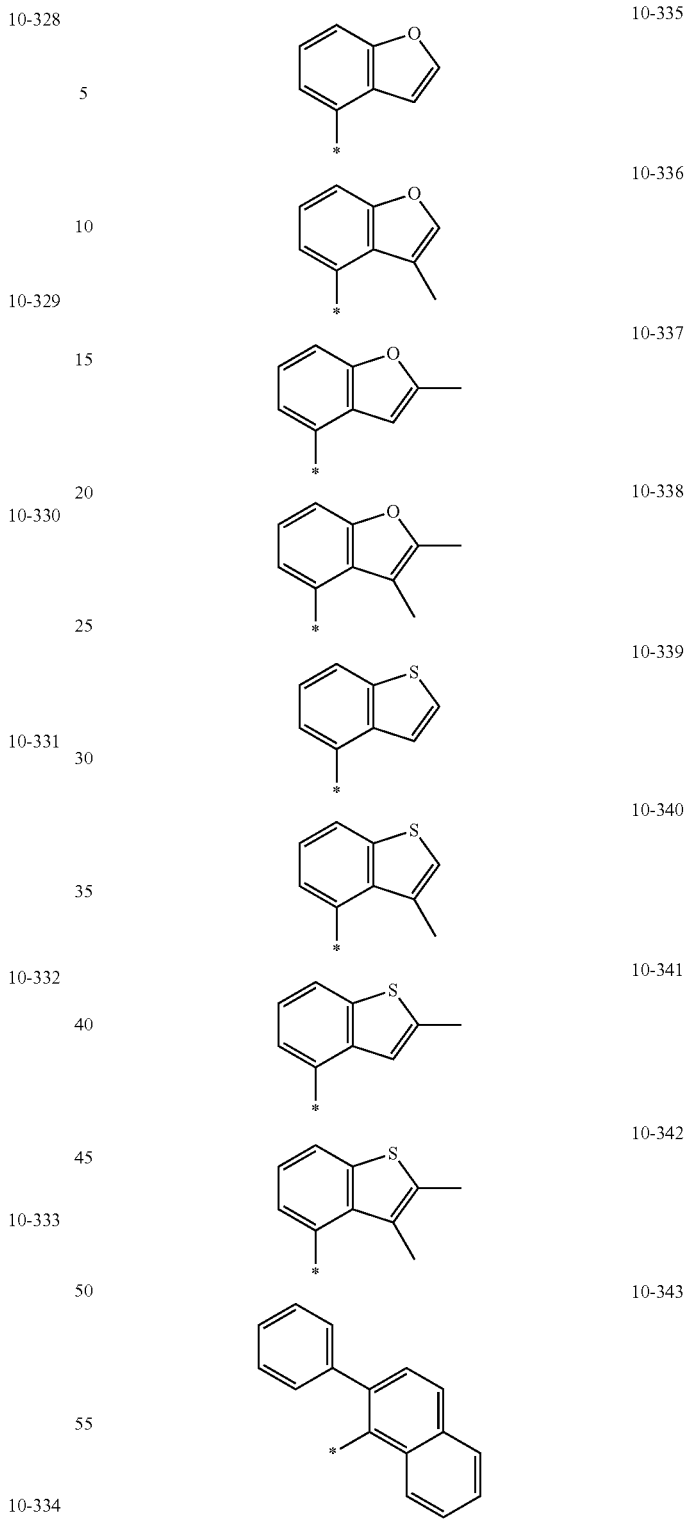
In Formulae 9-1 to 9-39, Formulae 9-201 to 9-233, Formulae 10-1 to 10-126, and Formulae 10-201 to 10-343, * is a binding site to an adjacent atom, Ph indicates a phenyl group, TMS indicates a trimethylsilyl group, and TMG indicates a trimethylgermyl group.
The "group represented by one of Formulae 9-1 to 9-39 in which at least one hydrogen is substituted with deuterium"

and the "group represented by one of Formulae 9-201 to 9-233 in which at least one hydrogen substituted is with deuterium" may be, for example, a group represented by one of Formulae 9-501 to 9-514 and Formulae 9-601 to 9-635.
9-501
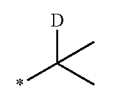
9-502
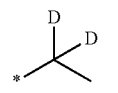
9-503
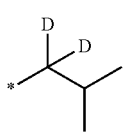
9-504
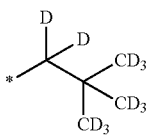
9-505
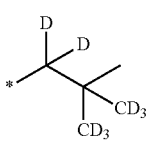
9-506
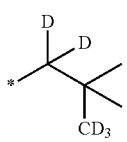
9-507
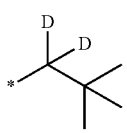
9-508
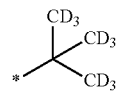
9-509
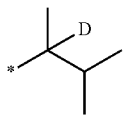
9-510
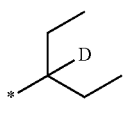
9-511
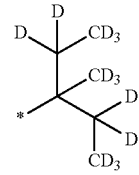
-continued
9-512
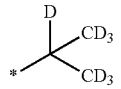
9-513
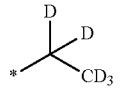
9-514
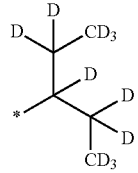
9-601
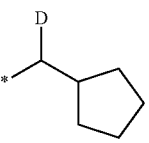
9-602
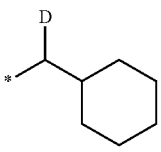
9-603
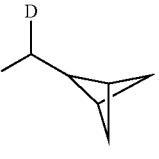
9-604
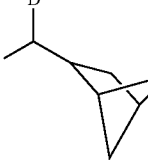
9-605
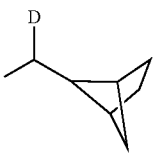
9-606
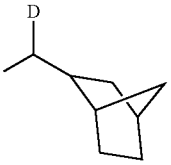
9-607
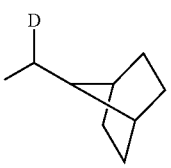

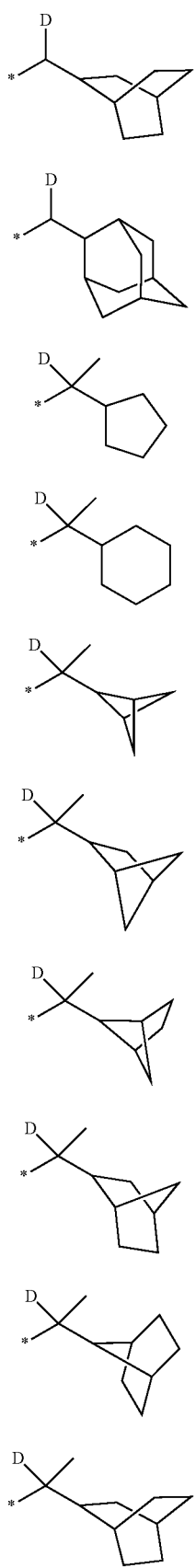

9-628 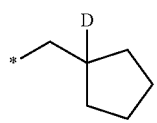
9-629 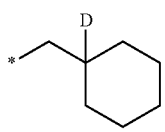
9-630 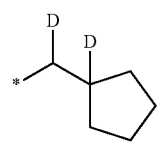
9-631 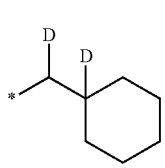
9-632 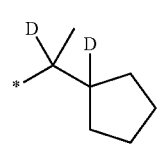
9-633 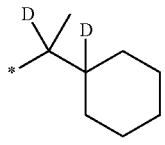
9-634 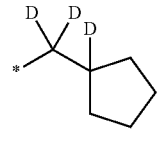
9-635 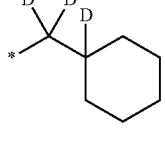
The "group represented by one of Formulae 10-1 to 10-126 in which at least one hydrogen is substituted with deuterium" and the "group represented by one of Formulae IQ-201 to 10-343 in which at least one hydrogen is substituted with deuterium" may be, for example, a group represented by one of Formulae 10-501 to 10-553.
10-501 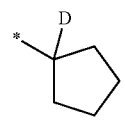
10-502 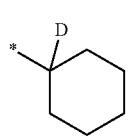
10-503 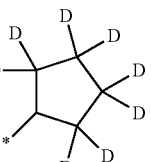
10-504 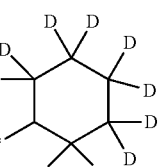
10-505 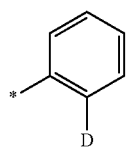
10-506 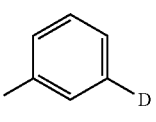
10-507 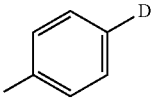
10-508 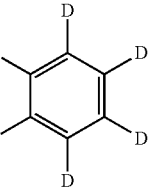
10-509 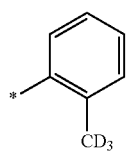
10-510 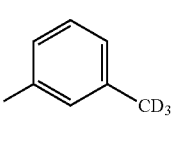
10-511 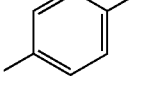

-continued
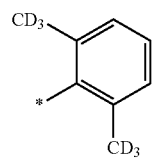 10-512
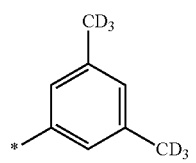 10-513
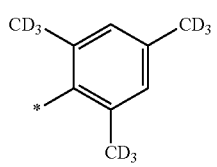 10-514
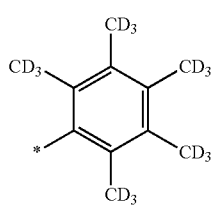 10-515
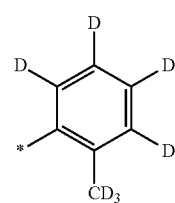 10-516
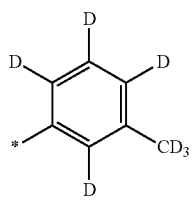 10-517
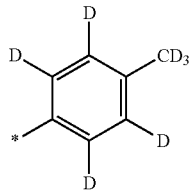 10-518
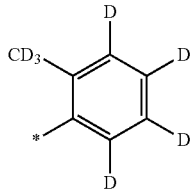 10-519
-continued
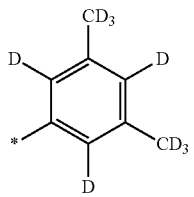 10-520
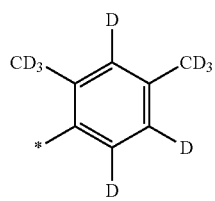 10-521
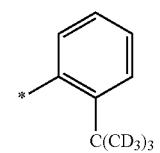 10-522
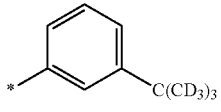 10-523
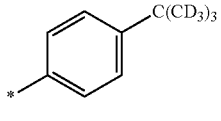 10-524
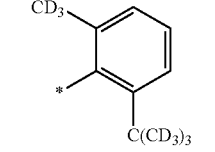 10-525
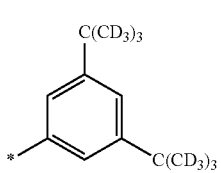 10-526
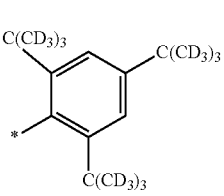 10-527
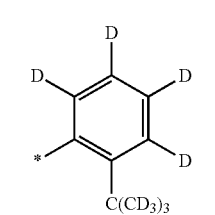 10-528

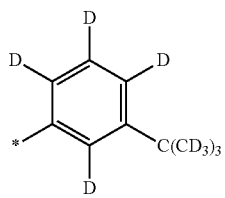
10-529
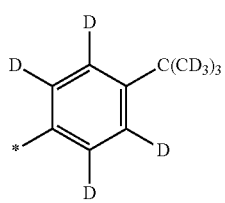
10-530
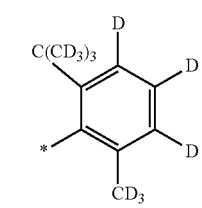
10-531
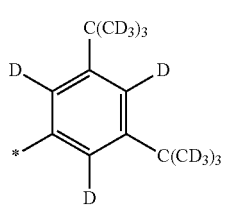
10-532
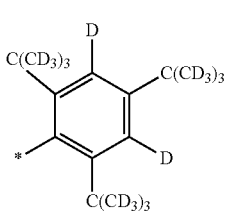
10-533
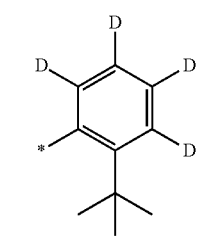
10-534
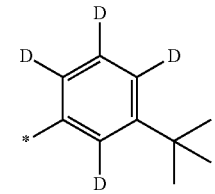
10-535
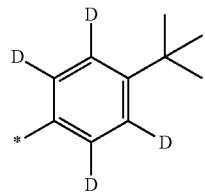
10-536
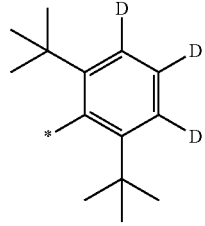
10-537
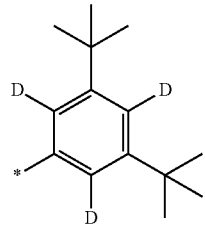
10-538
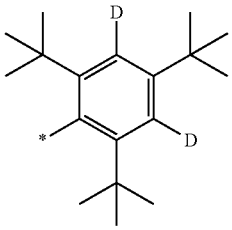
10-540
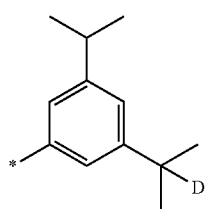
10-541
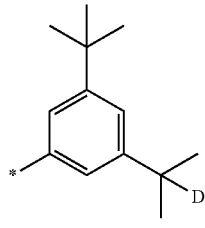
10-542
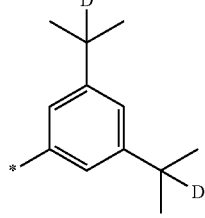
10-543

10-544 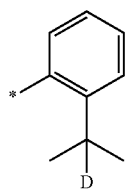

10-545 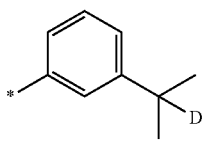

10-546 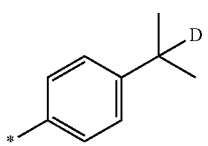

10-547 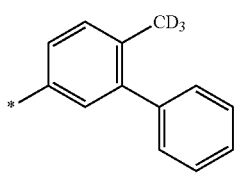

10-548 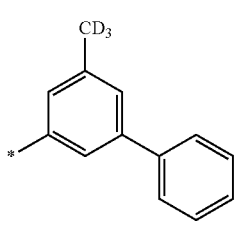

10-549 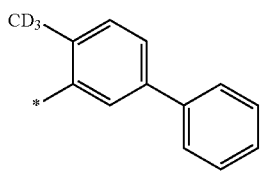

10-550 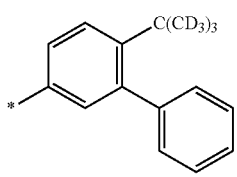

10-551 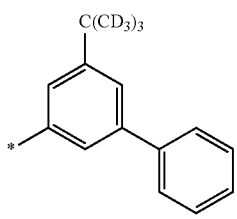

10-552 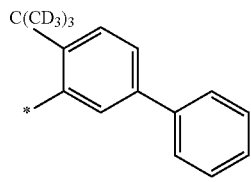

10-553 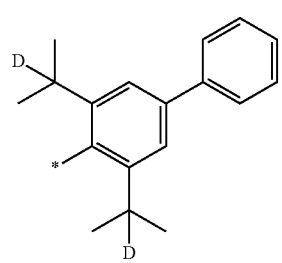

In Formula 1, 1) two or more of $R_1$(s) in number of a1 may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$; 2) two or more of $R_2$(s) in number of a2 may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$; 3) $R_1$ and $R_2$ may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$; 4) two or more of $A_1$ to $A_7$ may optionally be linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$. Here, $R_{1a}$ will be understood with reference to the description of $A_7$ herein.

In one or more embodiments, in Formula 1, a group represented by

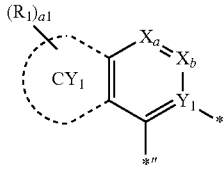

may be a group represented by one of Formulae 3-1 to 3-48.

3-1 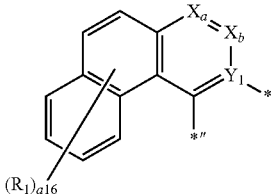

-continued

| | |
|---|---|
| (R₁)ₐ₁₅ | 3-2 |
| (R₁)ₐ₁₅ | 3-3 |
| (R₁)ₐ₁₅ | 3-4 |
| (R₁)ₐ₁₅ | 3-5 |
| (R₁)ₐ₁₅ | 3-6 |
| (R₁)ₐ₁₅ | 3-7 |
| (R₁)ₐ₁₄ | 3-8 |

-continued

| | |
|---|---|
| (R₁)ₐ₁₄ | 3-9 |
| (R₁)ₐ₁₈ | 3-10 |
| (R₁)ₐ₁₇ | 3-11 |
| (R₁)ₐ₁₇ | 3-12 |
| (R₁)ₐ₁₇ | 3-13 |
| (R₁)ₐ₁₇ | 3-14 |
| (R₁)ₐ₁₇ | 3-15 |
| (R₁)ₐ₁₇ | 3-16 |

-continued
3-17
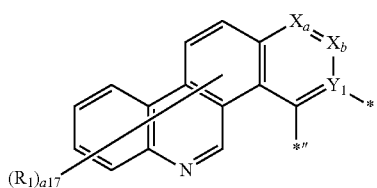
3-18
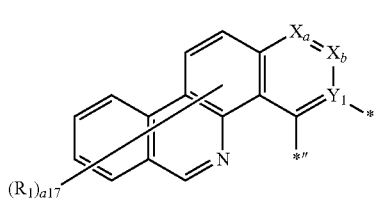
3-19
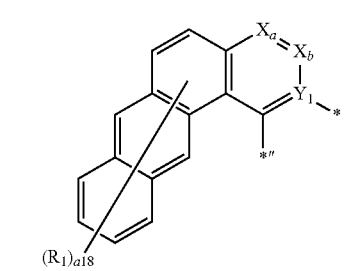
3-20
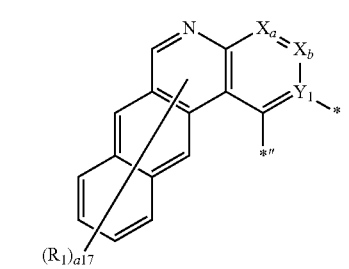
3-21
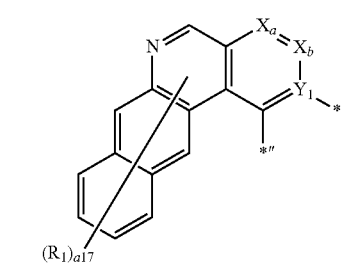
3-22
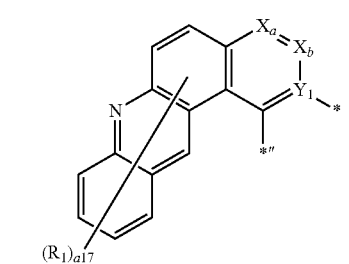
-continued
3-23
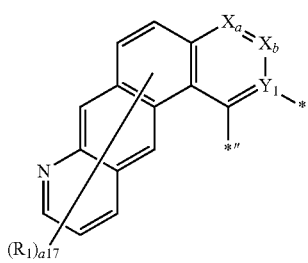
3-24
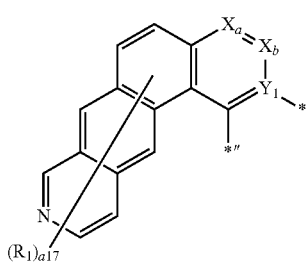
3-25
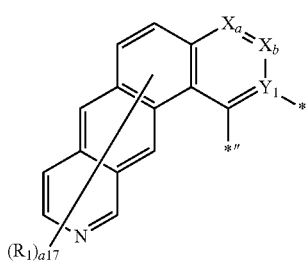
3-26
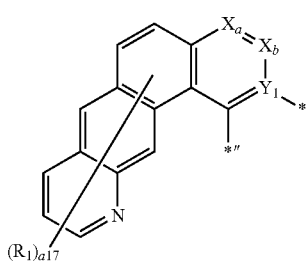
3-27
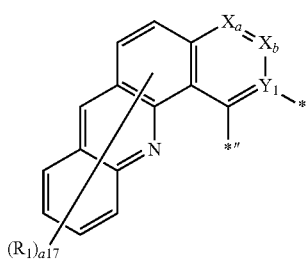
3-28
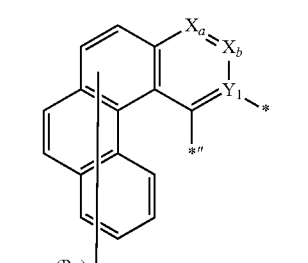

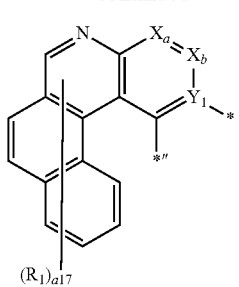
3-29
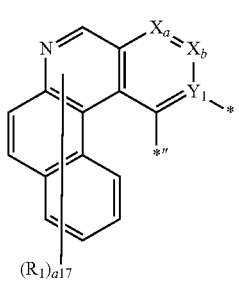
3-30
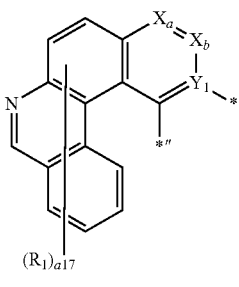
3-31
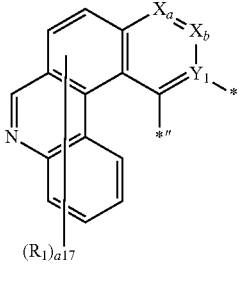
3-32
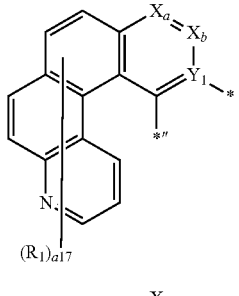
3-33
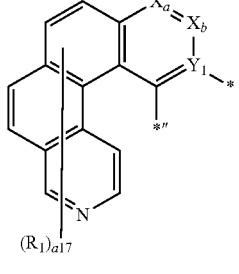
3-34
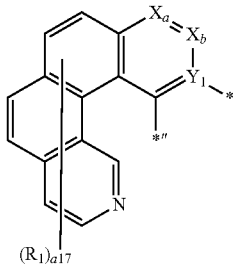
3-35
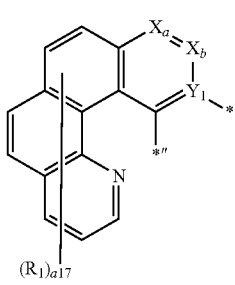
3-36
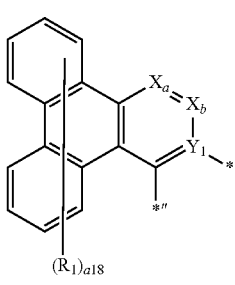
3-37
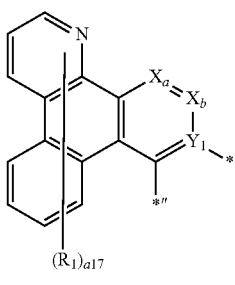
3-38
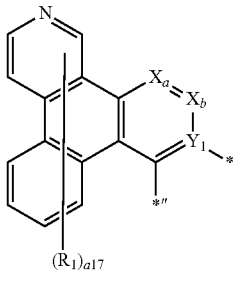
3-39

3-40 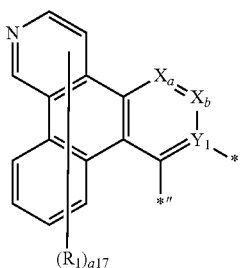

3-41 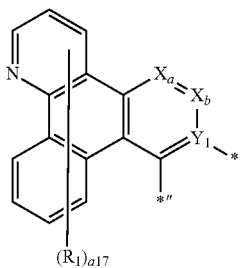

3-42 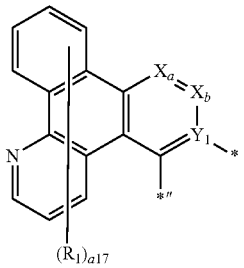

3-43 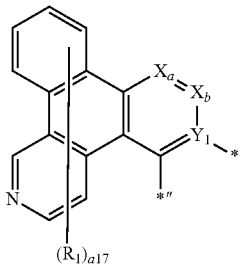

3-44 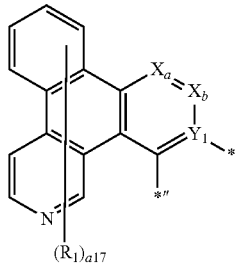

3-45 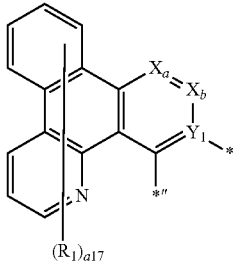

3-46 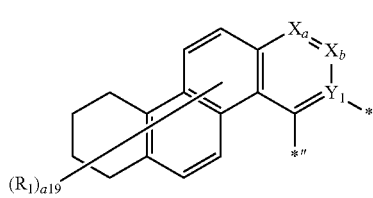

3-47 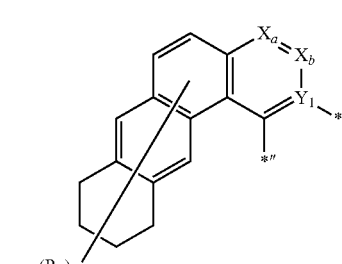

3-48 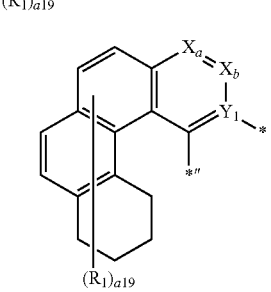

In Formulae 3-1 to 3-48,
$Y_1$, $X_a$, $X_b$ and $R_1$ will be understood with reference to the descriptions thereof herein;
a19 may be an integer of 0 to 12,
a18 may be an integer of 0 to 8,
a17 may be an integer of 0 to 7,
a16 may be an integer of 0 to 6,
a15 may be an integer of 0 to 5,
a14 may be an integer of 0 to 4,
\* may be a binding site to Ir in Formula 1, and,
\*'' may be a binding site to an adjacent atom in Formula 1.

In one or more embodiments, in Formula 1, the group represented by

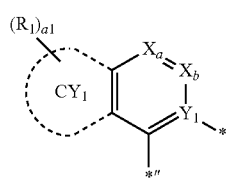

may be a group represented by one of Formulae 4-1 to 4-126.

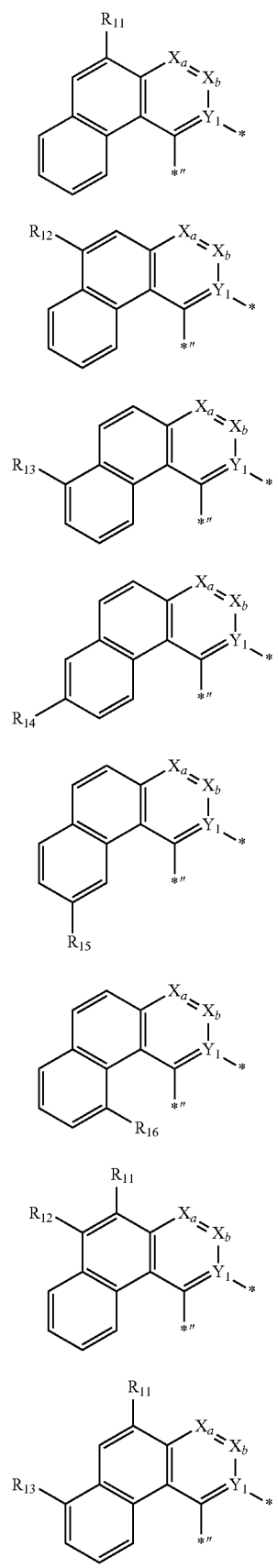
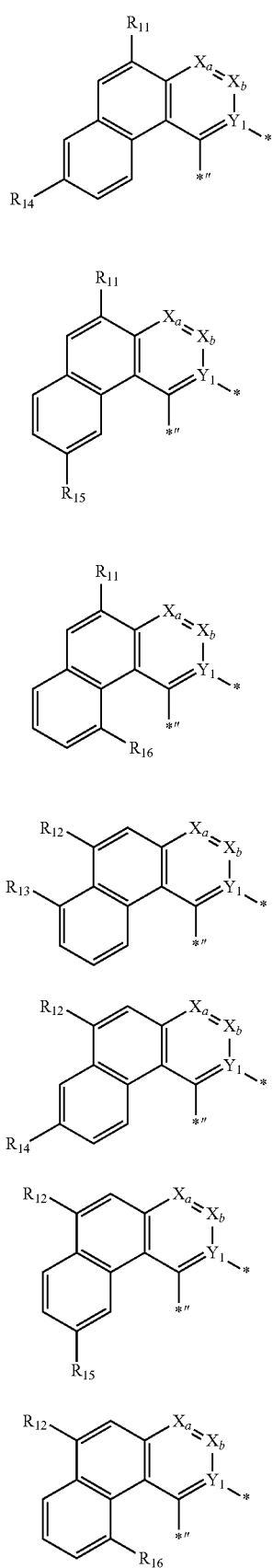

-continued
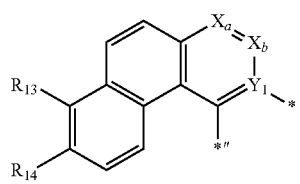 4-16
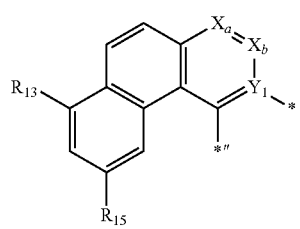 4-17
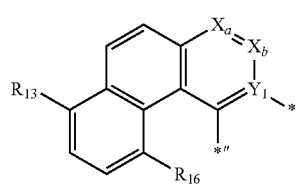 4-18
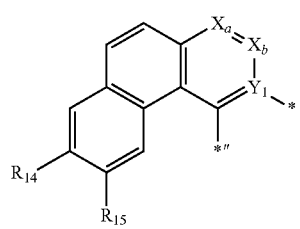 4-19
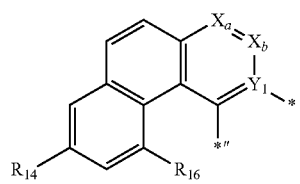 4-20
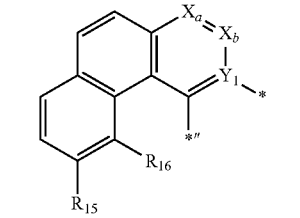 4-21
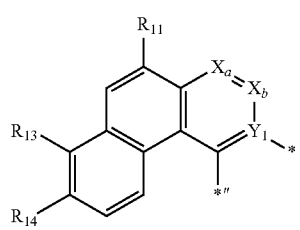 4-22
-continued
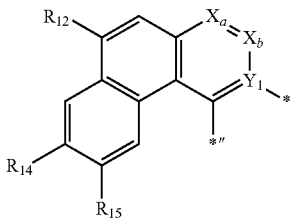 4-23
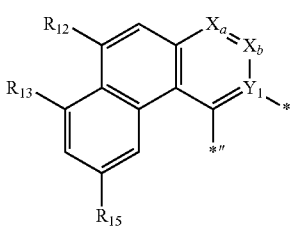 4-24
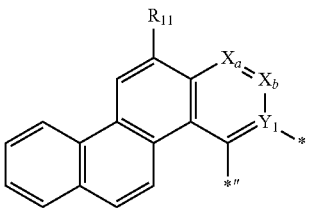 4-25
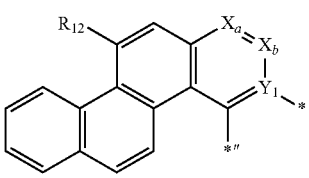 4-26
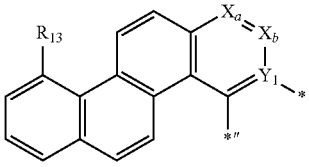 4-27
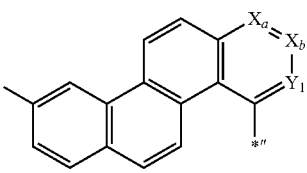 4-28
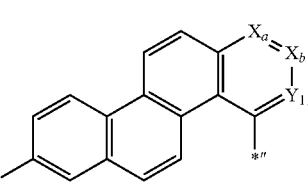 4-29
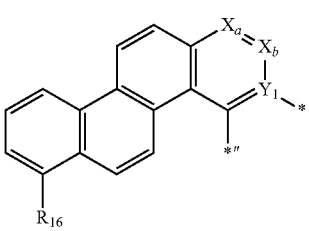 4-30

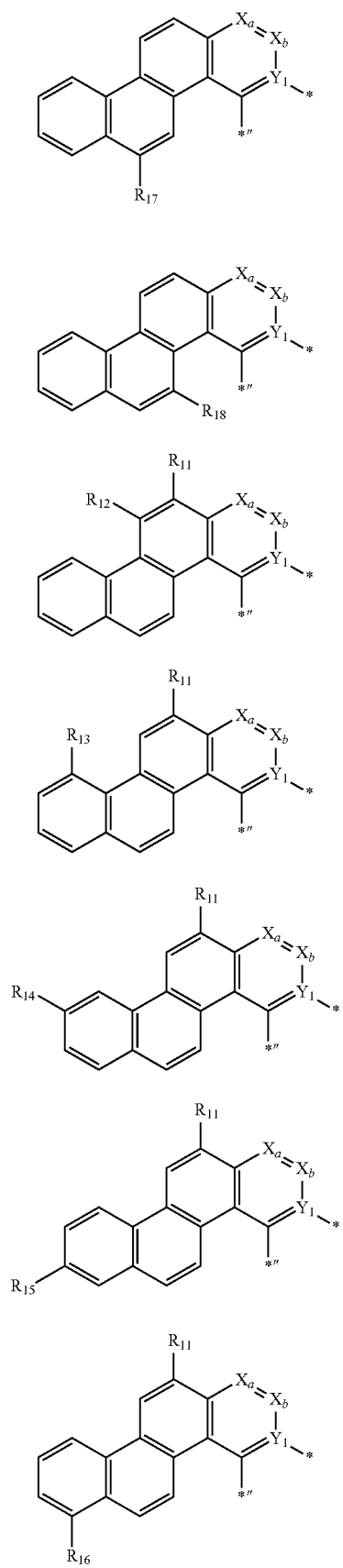
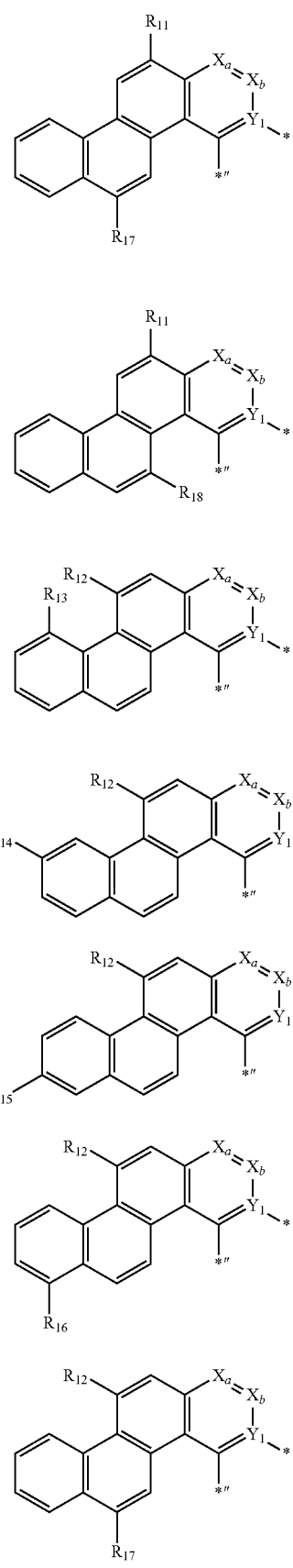

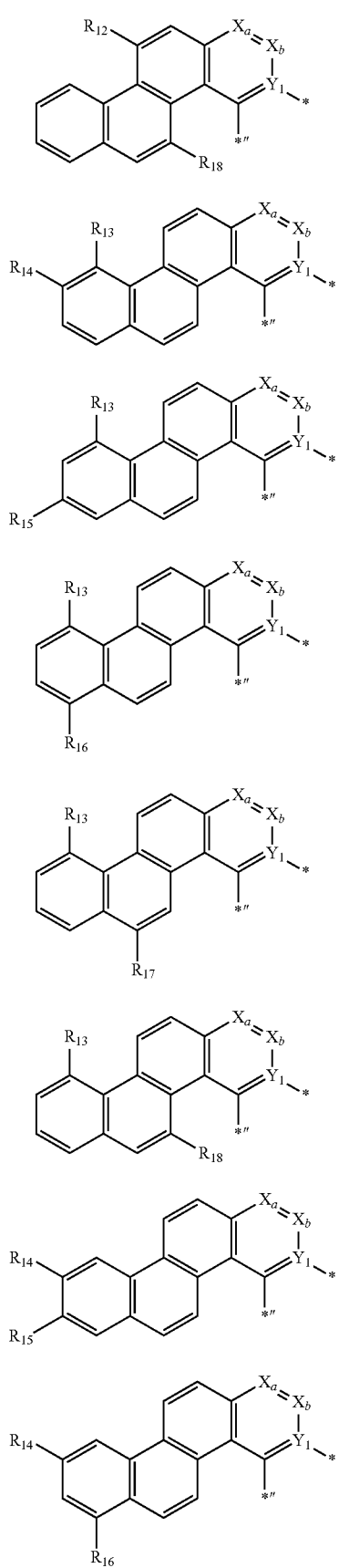
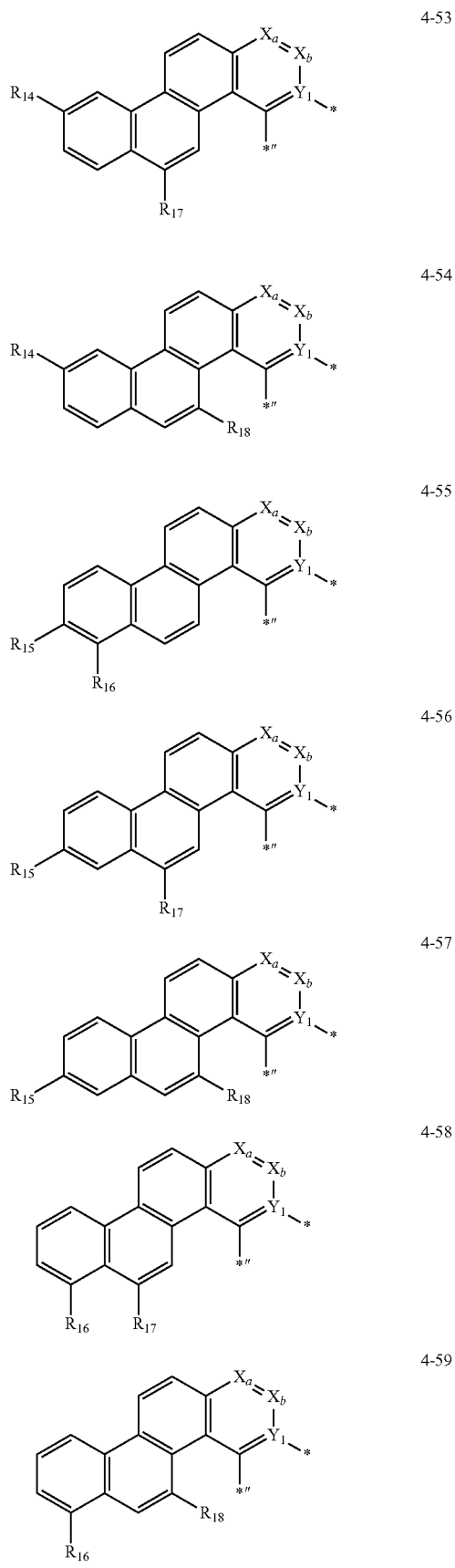

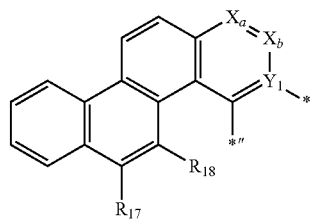
4-60
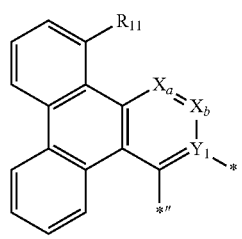
4-61
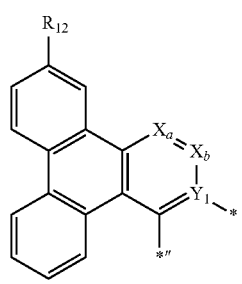
4-62
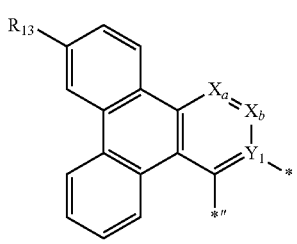
4-63
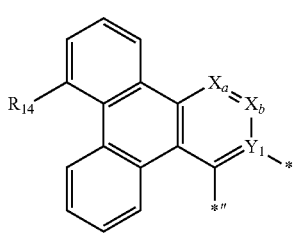
4-64
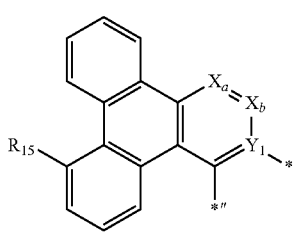
4-65
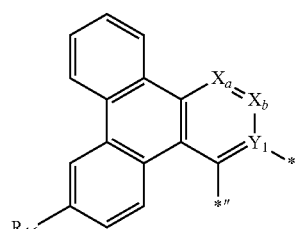
4-66
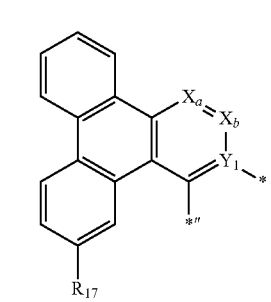
4-67
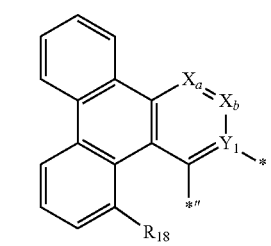
4-68
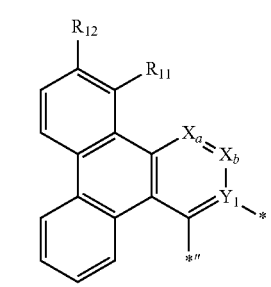
4-69
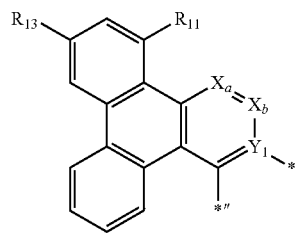
4-70
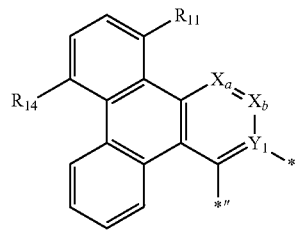
4-71

4-72
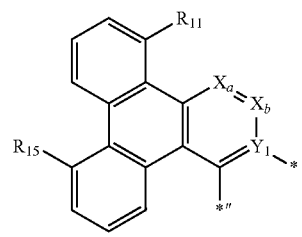
4-73
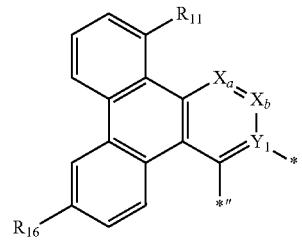
4-74
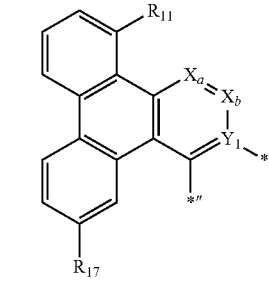
4-75
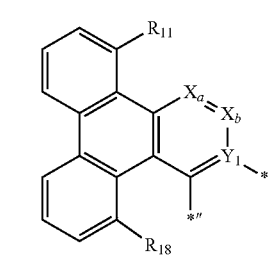
4-76
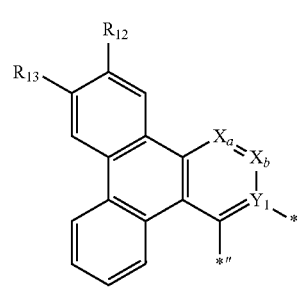
4-77
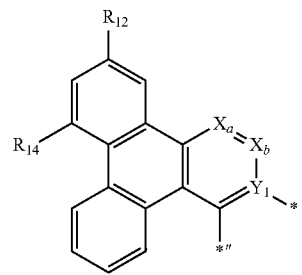
4-78
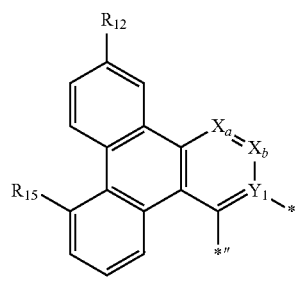
4-79
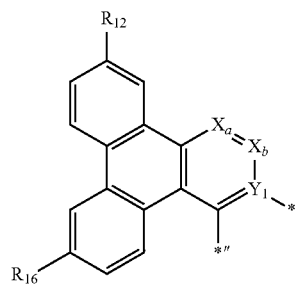
4-80
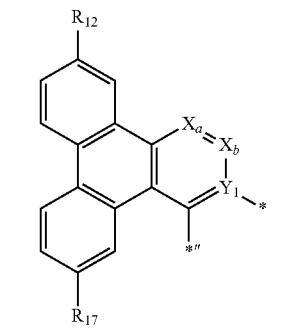
4-81
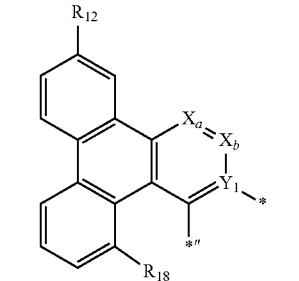
4-82
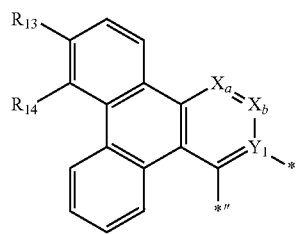

4-83
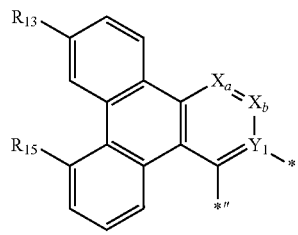
4-84
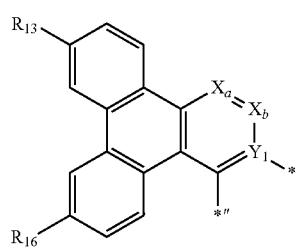
4-85
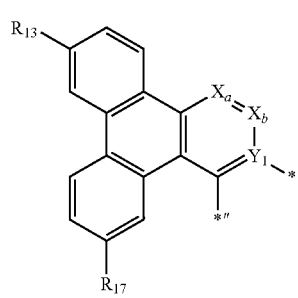
4-86
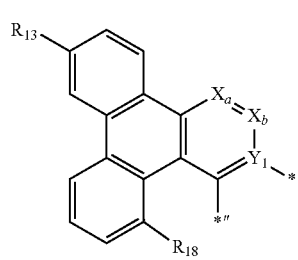
4-87
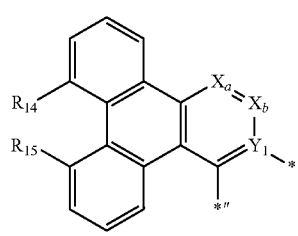
4-88
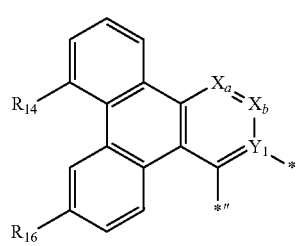
4-89
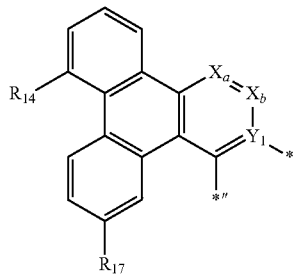
4-90
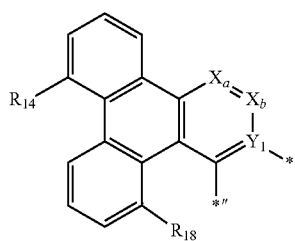
4-91
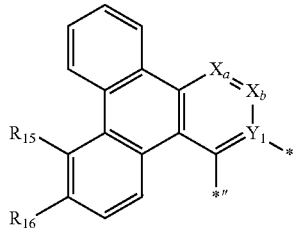
4-92
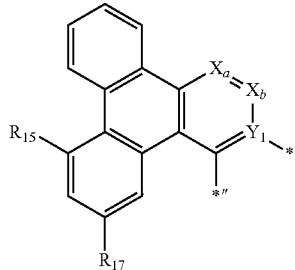
4-93
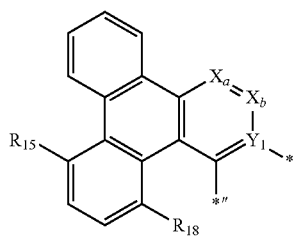
4-94
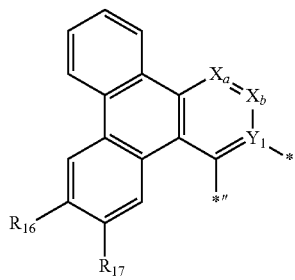

-continued
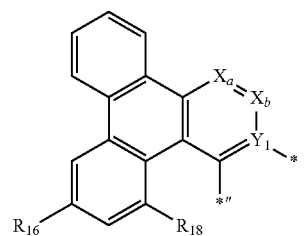
4-95
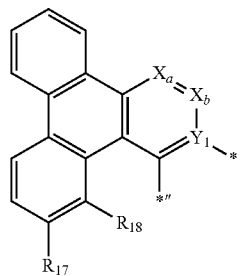
4-96
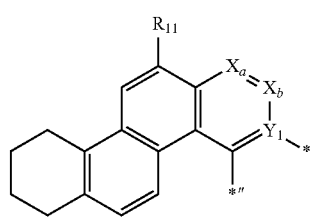
4-97
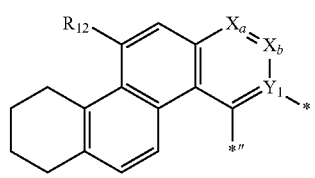
4-98
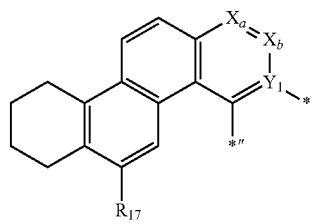
4-99
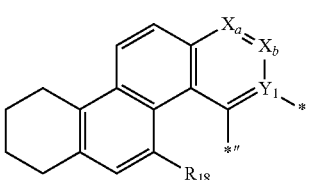
4-100
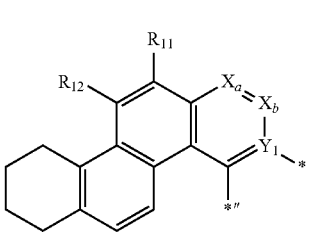
4-101
-continued
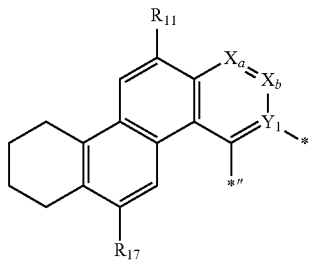
4-102
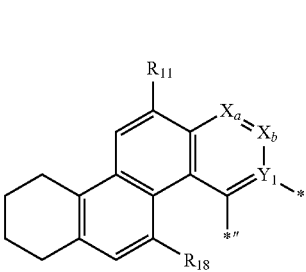
4-103
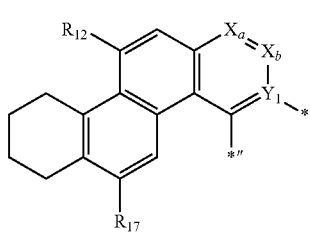
4-104
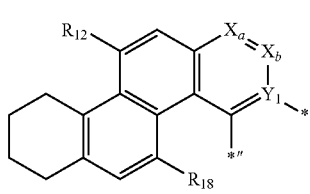
4-105
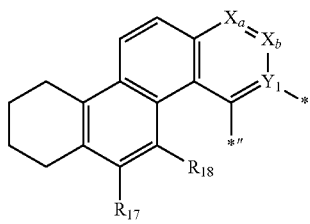
4-106
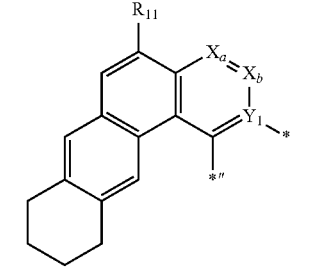
4-107

4-108 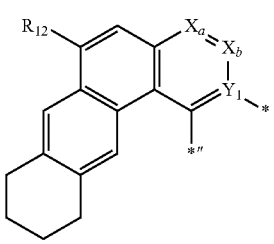
4-109 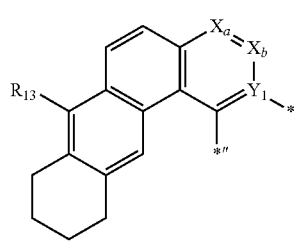
4-110 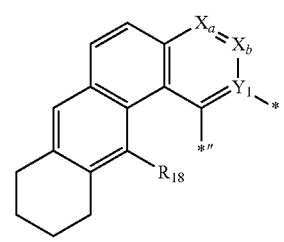
4-111 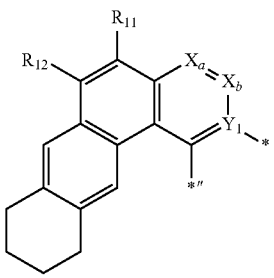
4-112 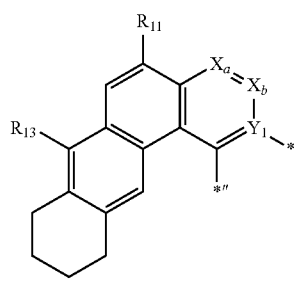
4-113 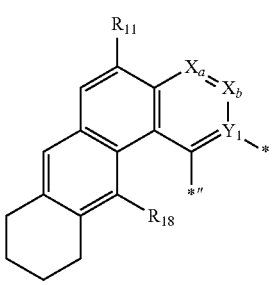
4-114 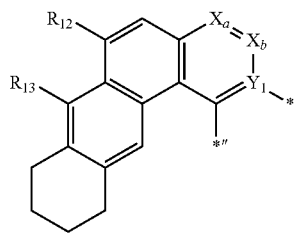
4-115 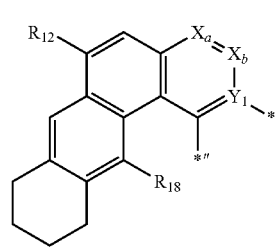
4-116 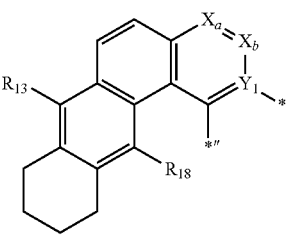
4-117 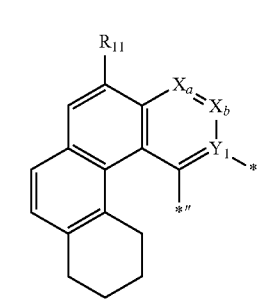
4-118 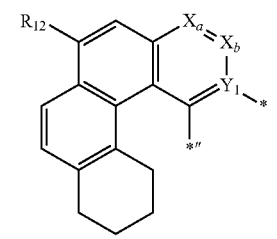
4-119 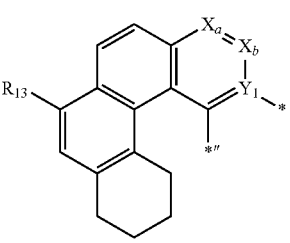

4-120 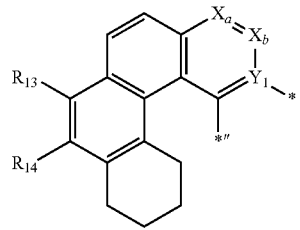

4-121 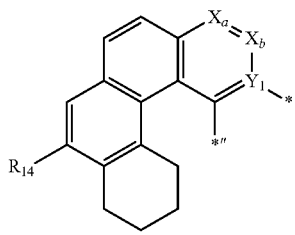

4-122 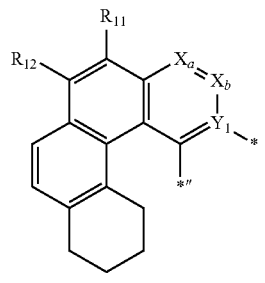

4-123 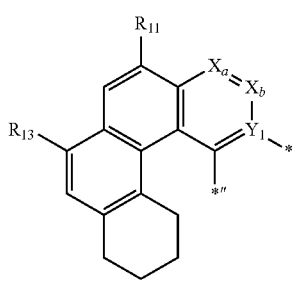

4-124 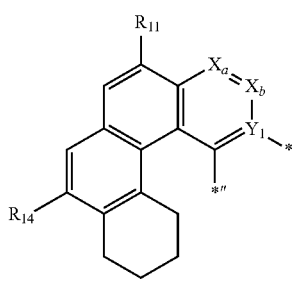

4-125 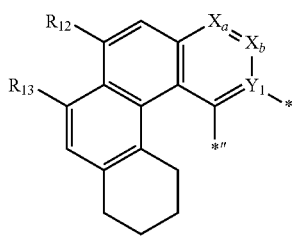

4-126 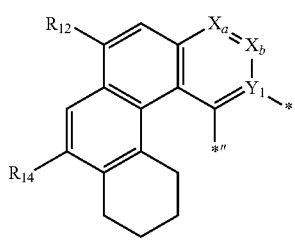

In Formulae 4-1 to 4-126, $Y_1$, $X_a$, and $X_b$ will be understood with reference to the descriptions thereof herein, $R_{11}$ to $R_{18}$ may each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, or a substituted or unsubstituted monovalent non-aromatic condensed polycyclic group, ' may be a binding site to Ir in Formula 1, and " may be a binding site to an adjacent atom in Formula 1.

For example, in Formulae 4-1 to 4-126, $R_{11}$ to $R_{18}$ may each independently be a group having three or more carbons.

In other embodiments, in Formulae 4-1 to 4-126, $R_{11}$ to $R_{18}$ may each independently be a $C_1$-$C_{30}$ alkyl group, a $C_3$-$C_{10}$ cycloalkyl group, or a phenyl group, each unsubstituted or substituted with deuterium, a $C_1$-$C_{30}$ alkyl group, a deuterated $C_1$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, a biphenyl group, or any combination thereof.

In one or more embodiments, in Formula 1, a group represented by

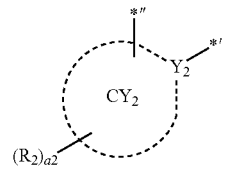

may be a group represented by one of Formulae CY2-1 to CY2-7.

CY2-1

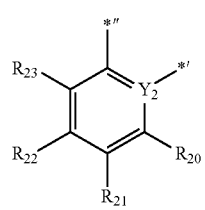

CY2-2

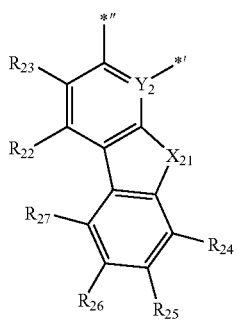

CY2-3

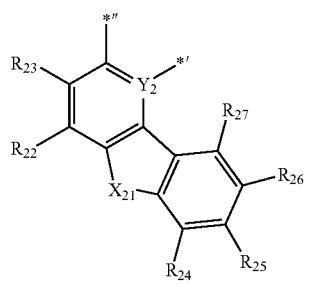

CY2-4

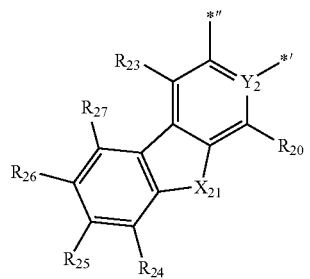

CY2-5

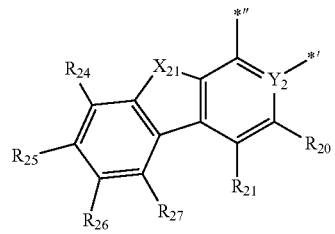

CY2-6

CY2-7

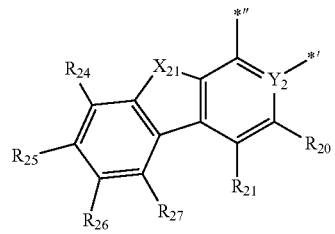

In Formulae CY1-1 to CY2-7,
$Y_2$ may be C,
$X_{21}$ may be O, S, $N(R_{28})$, $C(R_{28})(R_{29})$, or $Si(R_{28})(R_{29})$,
$R_{20}$ to $R_{29}$ will be understood with reference to the description of $R_2$ herein,
' may be a binding site to Ir in Formula 1, and
" may be a binding site to an adjacent atom in Formula 1.

For example, in Formula CY2-1, $R_{21}$ and $R_{23}$ may each independently be hydrogen or deuterium.

In other embodiments, in Formula CY2-1, $R_{20}$ and $R_{22}$ may be identical to each other.

In other embodiments, in Formula CY2-1, $R_{20}$ and $R_{22}$ may be different from each other.

In other embodiments, in Formula CY2-1, $R_{20}$ and $R_{22}$ may be different from each other, and the number of carbons in $R_{22}$ may be larger than the number of carbons in $R_{20}$.

For example, in Formula CY2-1, $R_{20}$ and $R_{22}$ may each independently be a $C_1$-$C_{30}$ alkyl group, a $C_3$-$C_{10}$ cycloalkyl group, or a phenyl group, each unsubstituted or substituted with deuterium, a $C_1$-$C_{30}$ alkyl group, a deuterated $C_1$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, a biphenyl group, or any combination thereof.

In one or more embodiments, the organometallic compound represented by Formula 1 may be at least one of Compounds 1 to 54.

1

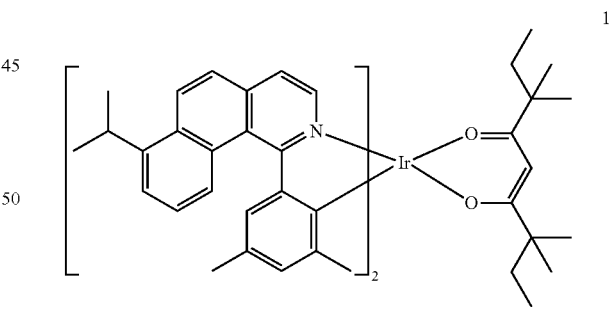

2

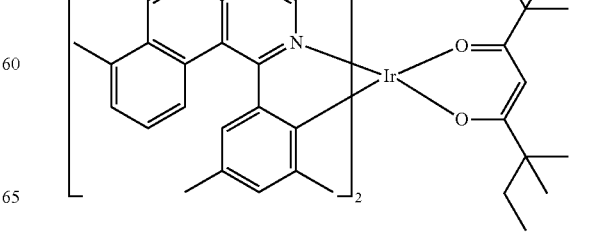

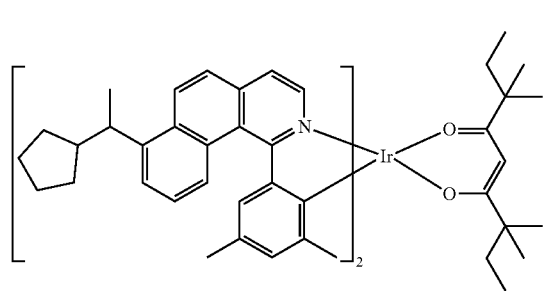
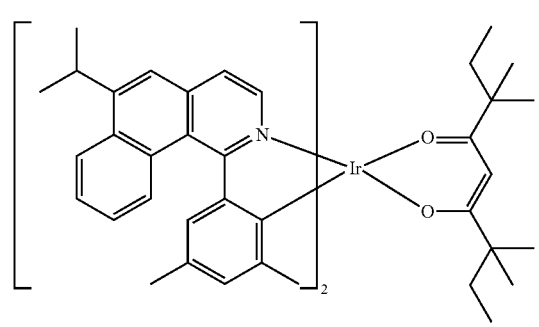
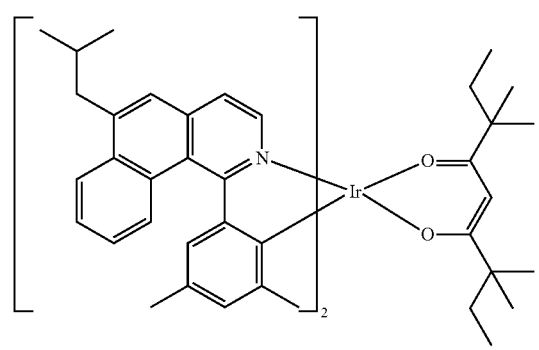
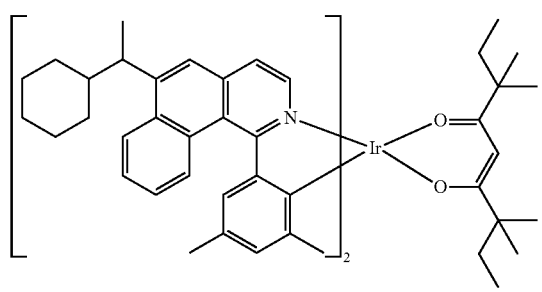
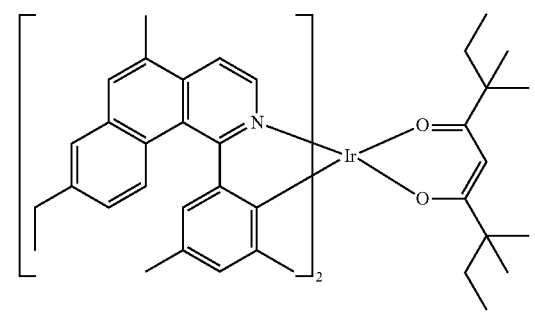
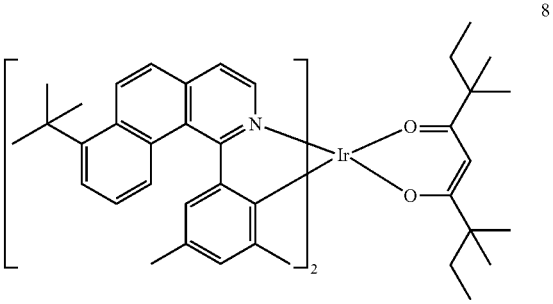
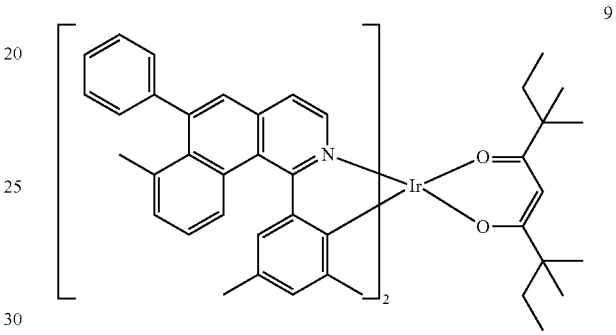
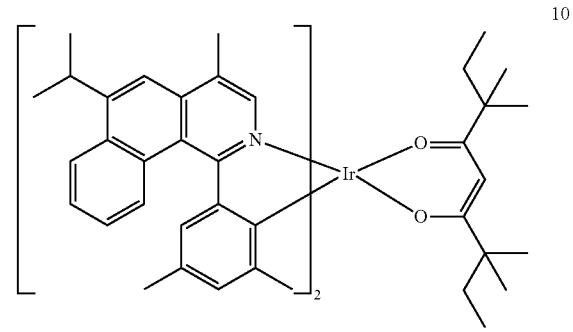
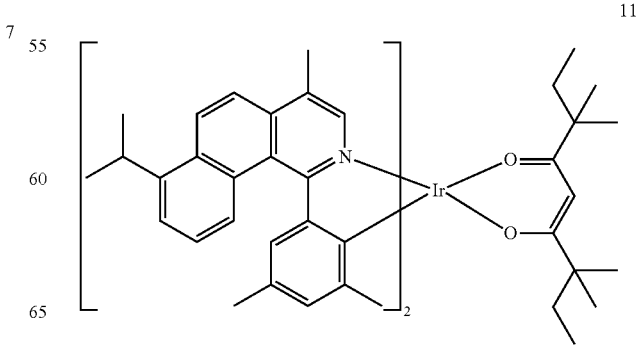

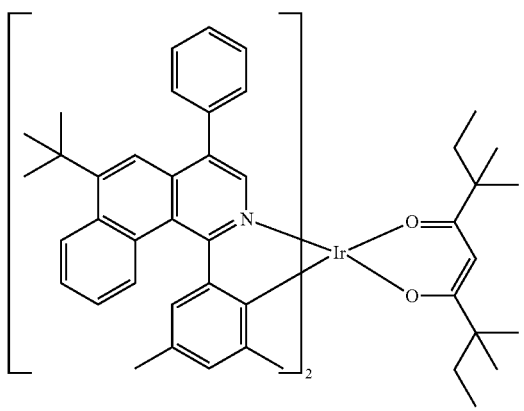
12
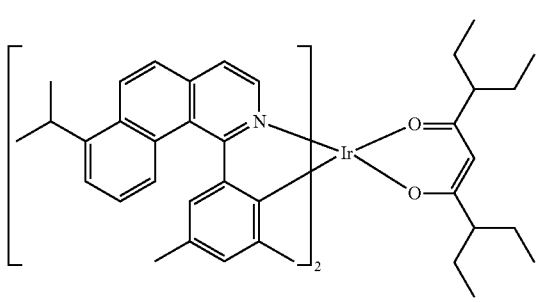
13
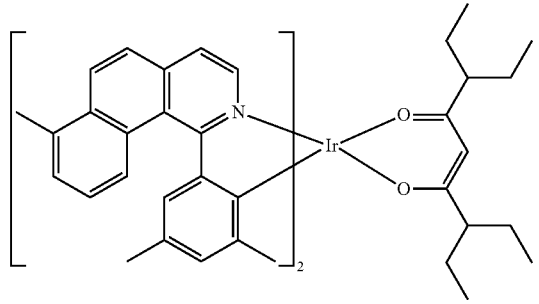
14
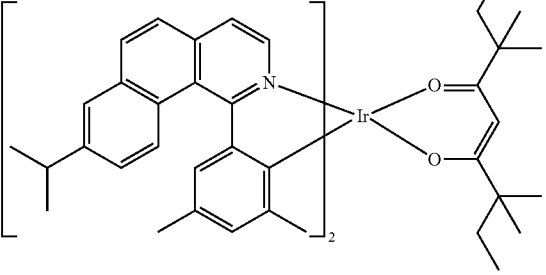
15
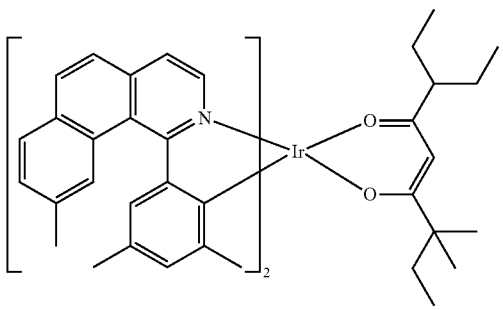
16
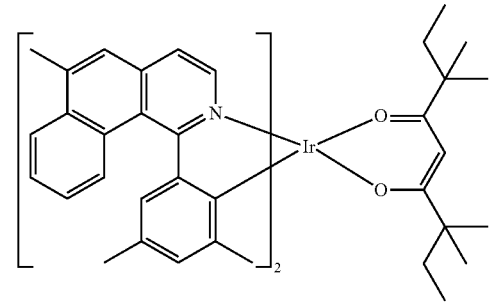
17
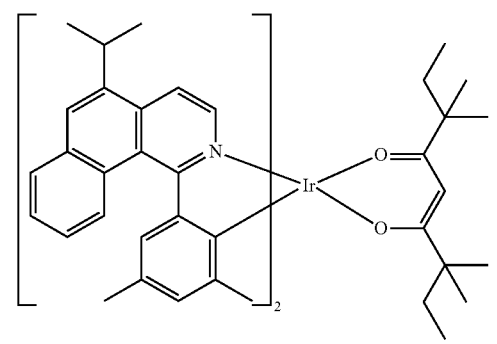
18
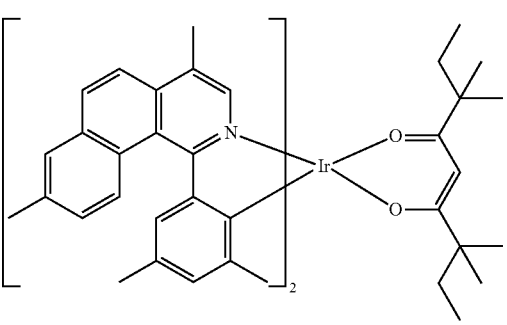
19
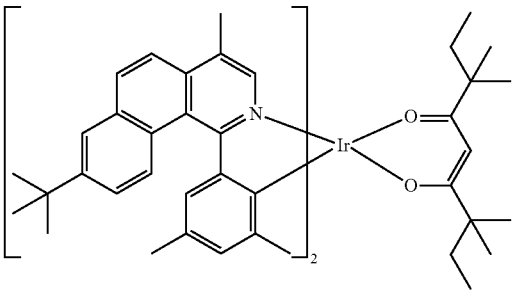
20

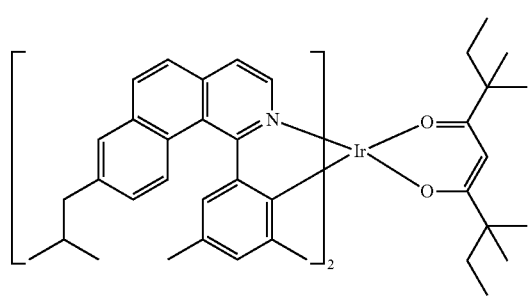
21
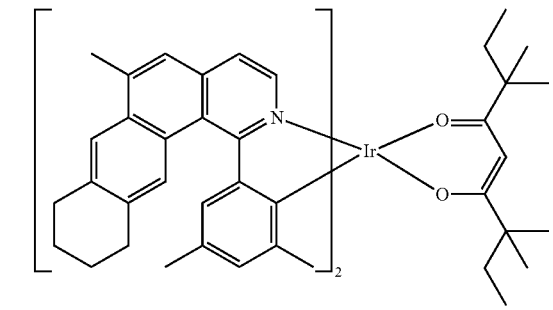
26
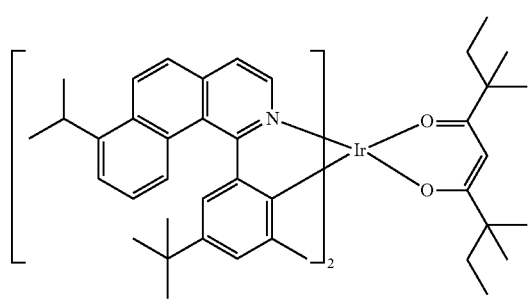
22
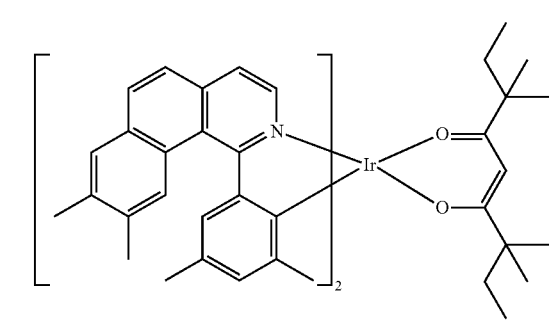
27
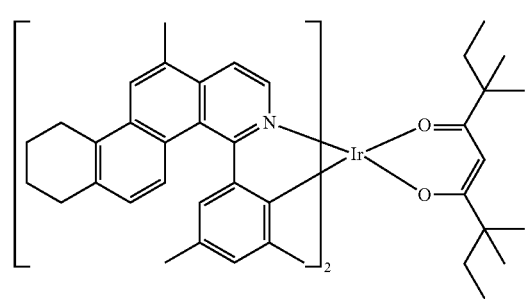
23
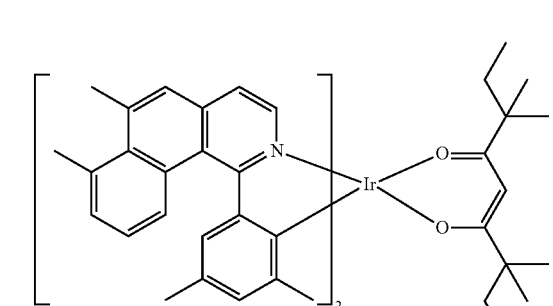
28
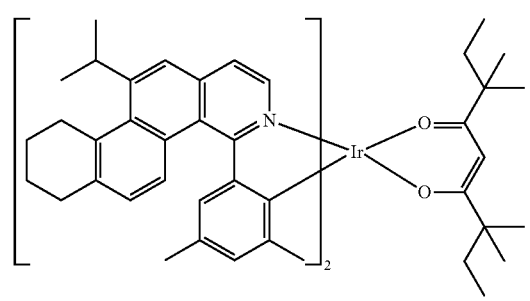
24
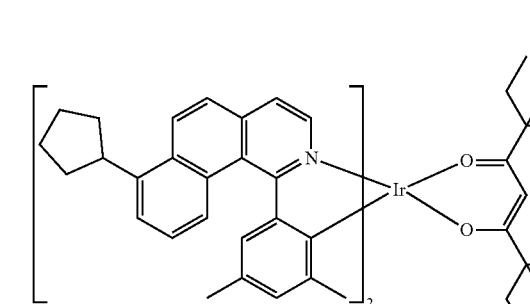
29
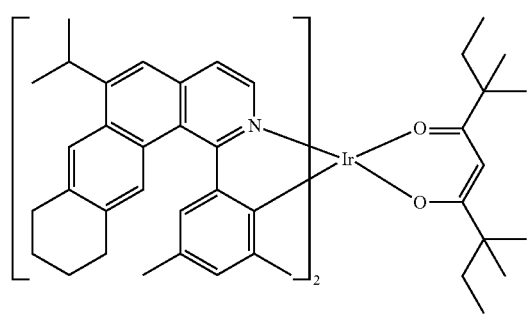
25
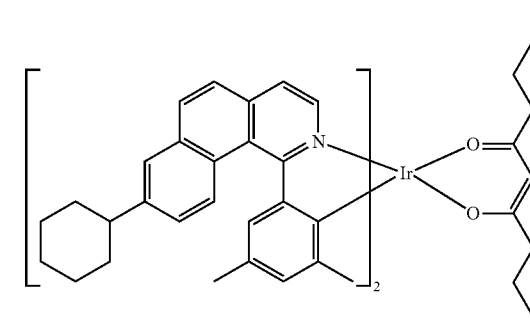
30

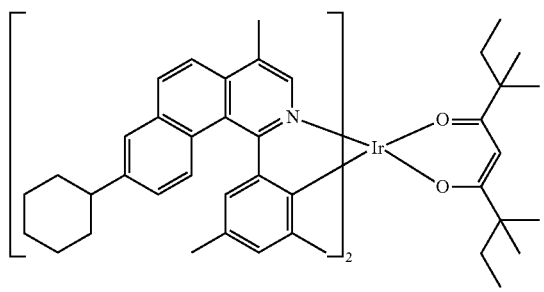
31
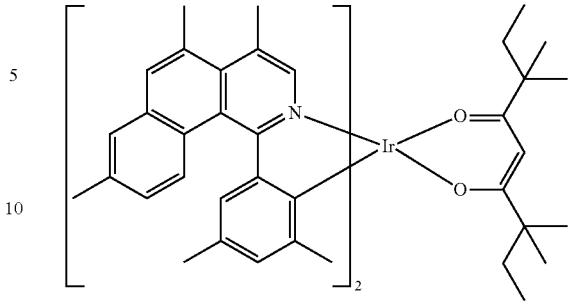
36
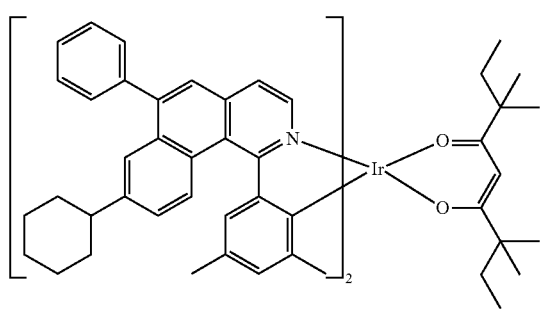
32
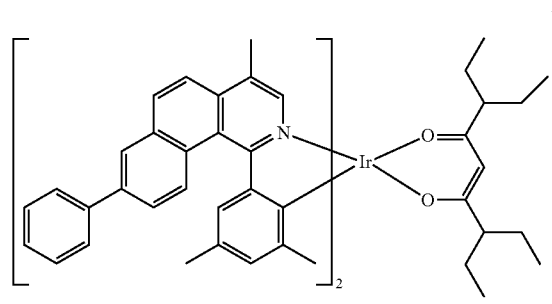
37
33
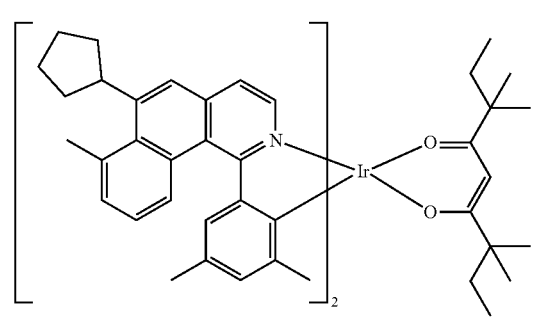
38
34
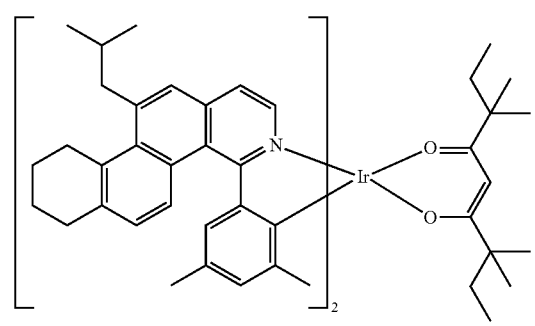
39
35
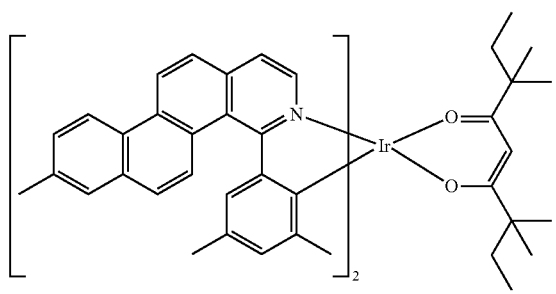
40

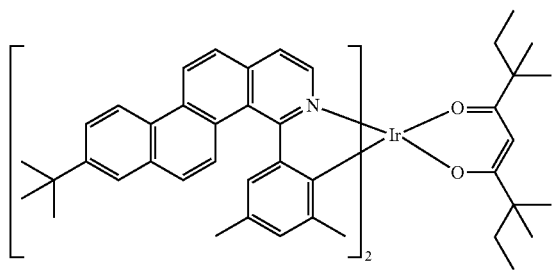
41
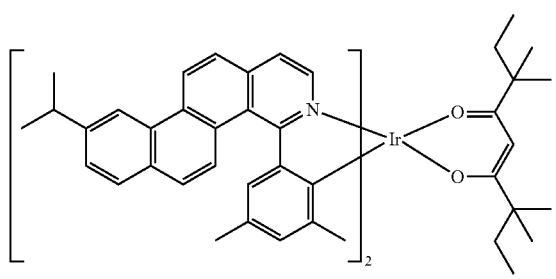
42
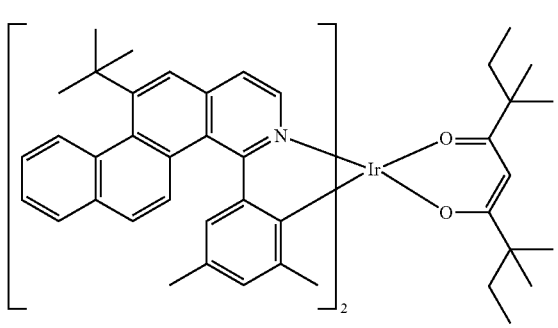
43
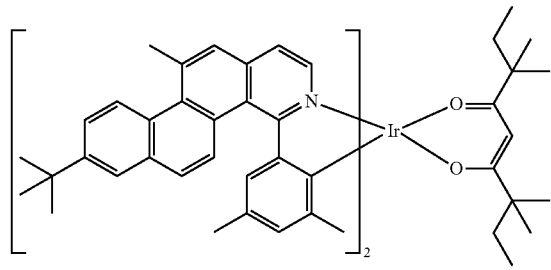
44
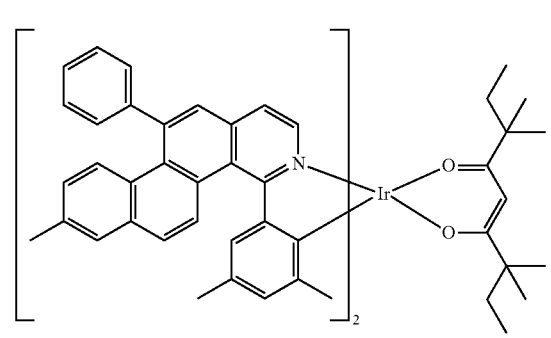
45
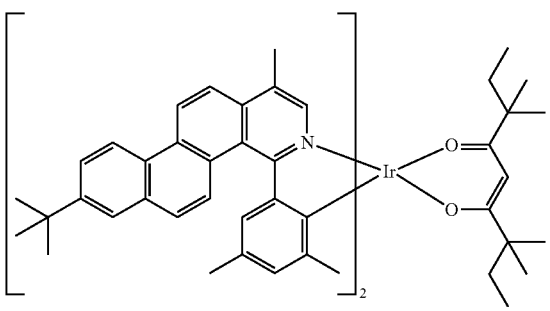
46
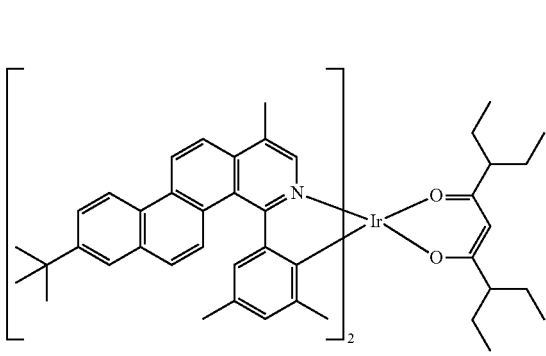
47
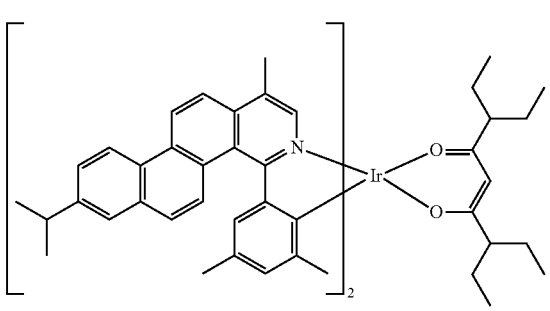
48
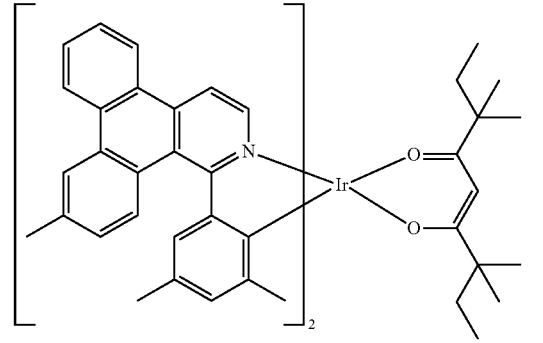
49

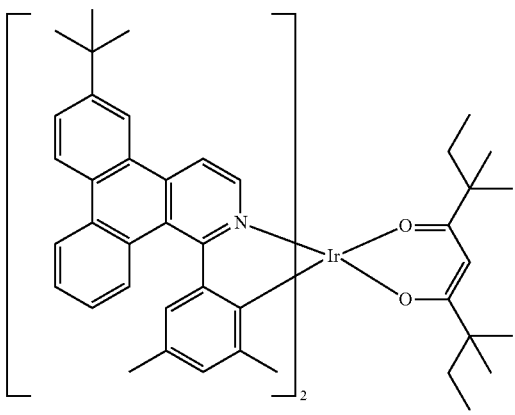

50

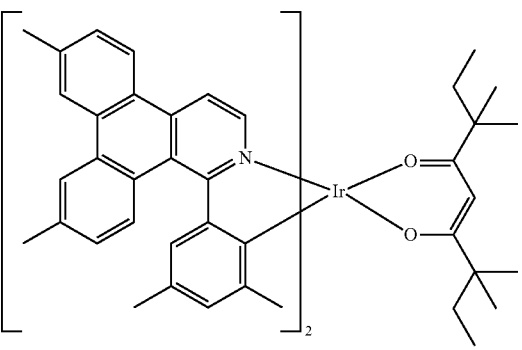

51

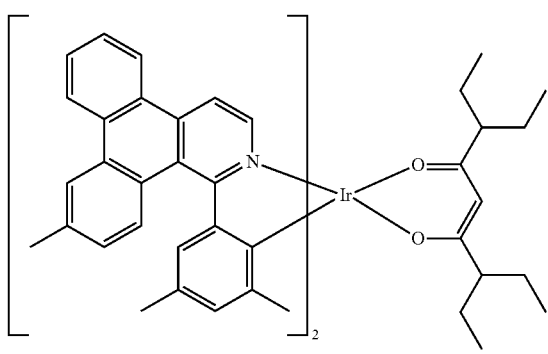

52

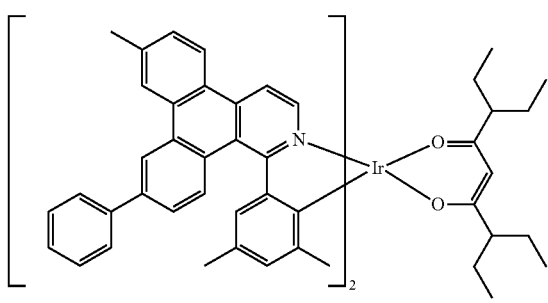

53

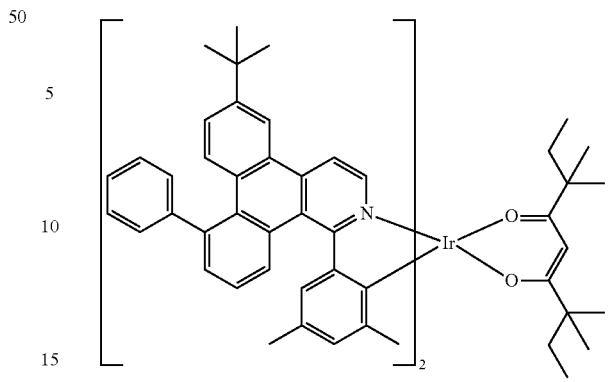

54

In Formula 1, ring $CY_1$ may be a group represented by Formula 1-1 or 1-2 below. Accordingly, a conjugation plane of the organometallic compound of Formula 1 may be lengthened, leading to increased dipolar moment in an excitation state of the organometallic compound represented by Formula 1 and thus improving the oscillator strength of the organometallic compound represented by Formula 1. Thus, an electronic device, for example, an organic light-emitting device, using the organometallic compound represented by Formula 1, may have improved emission efficiency.

In one or more embodiments, in Formula 1, at least one of $R_1(s)$ in number of a1 may be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, or a substituted or unsubstituted monovalent non-aromatic condensed polycyclic group. Accordingly, as a structural change of the organometallic compound represented by Formula 1 in an excitation state becomes smaller, the vibronic transition of the organometallic compound represented by Formula 1 may be reduced, so that an emission peak in the photoluminescent (PL) or electroluminescent (EL) spectrum of the organometallic compound represented by Formula 1 may have a relatively small full width at half maximum (FWHM). Therefore, an electronic device, for example, an organic light-emitting device, including the organometallic compound, may have high emission efficiency and/or long lifetime.

<Formula 1>

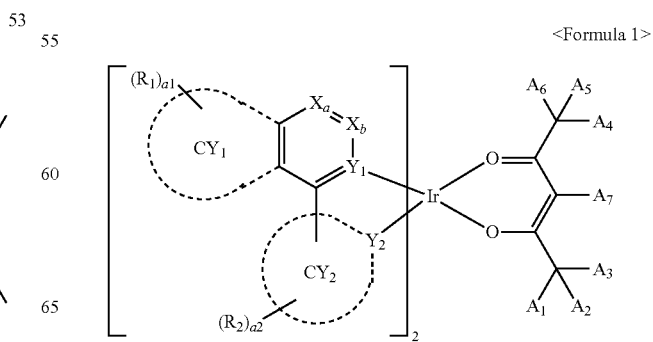

-continued 1-1

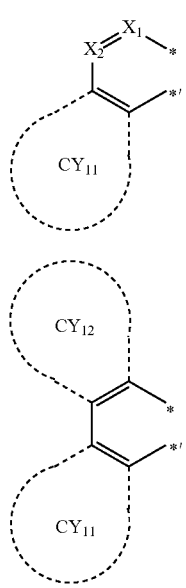

1-2

In one or more embodiments, when at least one of $A_1$ to $A_6$ in Formula 1 includes carbon, Ligand 2 (see Formula T below) in Formula 1 may have enhanced electron donating ability, leading to enhanced interaction between Ligand 1 and Ligand 2 in Formula 1. Accordingly, the organometallic compound represented by Formula 1 may have improved emission transition characteristics, improved photo orientation characteristics, and improved structural rigidity. Thus, an electronic device, for example, an organic light-emitting device, including the organometallic compound represented by Formula 1, may have high emission efficiency and increased lifetime.

<Formula 1'>

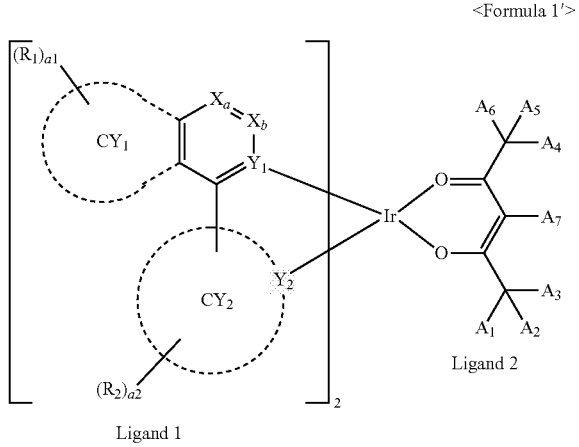

In one or more embodiments, when, in Formula 1, a2 is 2 and two $R_2$(s) are each independently a substituted or unsubstituted $C_1$-$C_{60}$ alkyl group, due to enhanced interaction between Ligand 1and Ligand 2 in Formula 1, the organometallic compound may have excellent rigidity, and thus reduced non-emission transition. Accordingly, an electronic device, for example, an organic light-emitting device, including the organometallic compound, may emit red light of high color purity.

In one or more embodiments, a full width at half maximum (FWHM) of the emission peak in the photoluminescence spectrum or electroluminescence spectrum of the organometallic compound may be about 57 nm or smaller. For example, a FWHM of the emission peak in the photoluminescence spectrum or electroluminescence spectrum of the organometallic compound may be about 45 nm to 57 nm, about 45 nm to 54 nm, about 45 nm to 52 nm, or about 45 nm to 50 nm.

In one or more embodiments, a maximum emission wavelength (emission peak wavelength, $\lambda_{max}$) of the emission peak in the photoluminescence spectrum or electroluminescence spectrum of the organometallic compound may be in a range of about 615 nm to 640 nm. For example, a maximum emission wavelength (emission peak wavelength, $\lambda_{max}$) of the emission peak in the photoluminescence spectrum or electroluminescence spectrum of the organometallic compound may be in a range of about 615 nm to 630 nm, or in a range of about 620 nm to 630 nm.

A horizontal orientation ratio of a transition dipole moment of the organometallic compound represented by Formula 1 may be about 90% to about 100%.

For example, a horizontal orientation ratio of a transition dipole moment of the organometallic compound represented by Formula 1 may be about 91% to 100%, about 92% to 100%, about 93% to 100%, about 94% to 100%, about 95% to 100%, about 96% to 100%, about 97% to 100%, about 98% to 100%, about 99% to 100%, or about 100%.

The horizontal orientation ratio of the transition dipole moment may be evaluated using an angle-dependent photoluminescent (PL) measurement device. Details of the angle-dependent PL measurement device will be understood with reference to an angle-dependent PL measurement device described in KR 2013-0150834, which is incorporated herein in its entirety by reference.

As described above, due to a high horizontal orientation ratio of the transition dipole moment of the organometallic compound, when an organic light-emitting device including the organometallic compound is operated, an electric field may be emitted substantially in a horizontal direction with respect to a film including the organometallic compound, thus reducing optical loss in a waveguide mode and/or surface plasmon polariton mode. The light emitted through such a mechanism may have high external extraction emission efficiency (i.e., an efficiency of external extraction of the light emitted from the organometallic compound through a device (for example, an organic light-emitting device) including a film (for example, an emission layer to be described later) including the organometallic compound). Accordingly, an electronic device, for example, an organic light-emitting device, including the organometallic compound, may achieve high emission efficiency.

The organometallic compound represented by Formula 1 may have a photoluminescence quantum yield (PLQY) in film of about 90% to about 100%. For example, the organometallic compound represented by Formula 1 may have a PLQY in film of about 91% to 100%, about 92% to 100%, about 93% to 100%, about 94% to 100%, about 95% to 100%, about 96% to 100%, about 97% to 100%, about 98% to 100%, about 99% to 100%, or about 100%.

In one or more embodiments, the organometallic compound may have a PLQY in film of about 95% to 99%, about 96% to 99%, about 97% to 99%, or about 98% to 99%.

Methods of synthesizing the organometallic compound represented by Formula 1 can be understood by a person of ordinary skill in the art with reference to the synthesis examples described below.

Accordingly, the organometallic compound represented by Formula 1 is suitable for use in an organic layer of an organic light-emitting device, for example, as a dopant in an emission layer of the organic layer. Therefore, another aspect of the present disclosure provides an organic light-emitting device including: a first electrode; a second electrode; and an organic layer disposed between the first electrode and the second electrode and including an emission layer, and wherein the organic layer includes at least one organometallic compound represented by Formula 1.

The organic light-emitting device may have, due to the inclusion of an organic layer including the above-described organometallic compound represented by Formula 1, excellent driving voltage, excellent external quantum efficiency, a relatively small FWHM of the emission peak in the PL or EL spectrum, and improved lifetime characteristics.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

In one or more embodiments, the emission layer may emit red light.

The expression "(an organic layer) includes at least one of the organometallic compound" as used herein may be construed as that the organic layer includes one organometallic compound belonging to the category of Formula 1, or that the organic layer includes two or more different organometallic compounds belonging to the category of Formula 1.

For example, the organic layer may include, as the organometallic compound, only Compound 1. In this regard, Compound 1 may be only in the emission layer of the organic light-emitting device. In one or more embodiments, the organic layer may include, as the organometallic compound, Compound 1 and Compound 2. In this regard, Compound 1 and Compound 2 may be in the same layer (For example, both Compound 1 and Compound 2 may be in the emission layer).

The first electrode may be an anode, which is a hole injection electrode, and the second electrode may be a cathode, which is an electron injection electrode. In other embodiments, the first electrode may be a cathode, which is an electron injection electrode, and the second electrode may be an anode, which is a hole injection electrode.

For example, in the organic light-emitting device, the first electrode may be an anode, the second electrode may be a cathode, the organic layer may further include a hole transport region between the first electrode and the emission layer and an electron transport region between the emission layer and the second electrode, the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" as used herein refers to a single layer and/or a plurality of layers disposed between the first electrode and the second electrode of an organic light-emitting device. The "organic layer" may include, in addition to an organic compound, an organometallic complex including metal.

FIGURE is a schematic cross-sectional view of an organic light-emitting device 10 according to an embodiment, hereinafter, the structure of an organic light-emitting device according to an embodiment and a method of manufacturing an organic light-emitting device according to an embodiment will be described with reference to FIGURE. The organic light-emitting device 10 may have a structure in which a first electrode 11, an organic layer 15, and a second electrode 19 which are sequentially stacked.

A substrate may be additionally disposed under the first electrode 11 or above the second electrode 19. For use as the substrate, any substrate that is used in general organic light-emitting devices may be used. The substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include a material(s) with a high work function to facilitate hole injection. The first electrode 11 may be a reflective electrode, a semi-reflective electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to the conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof.

m-MTDATA

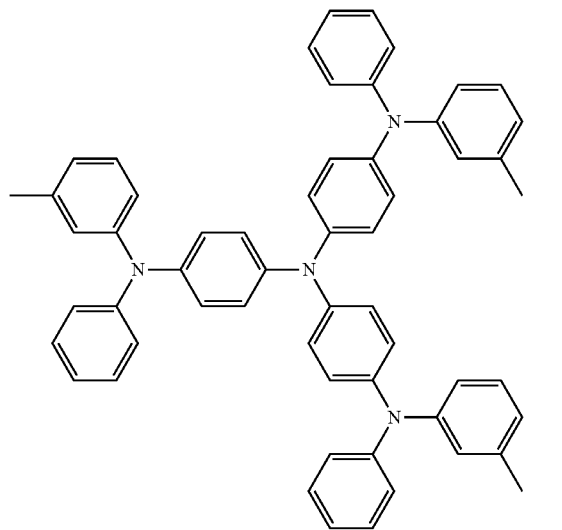

TDATA

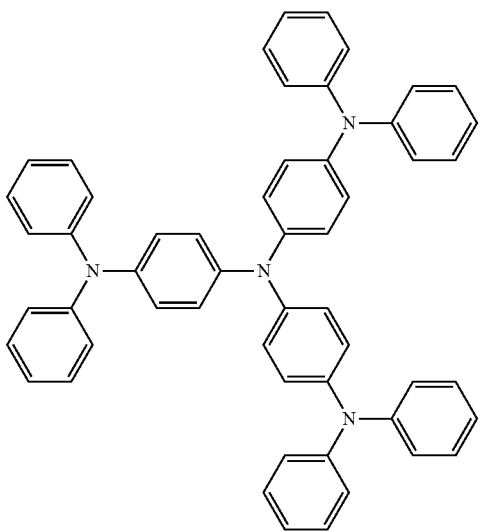

2-TNATA

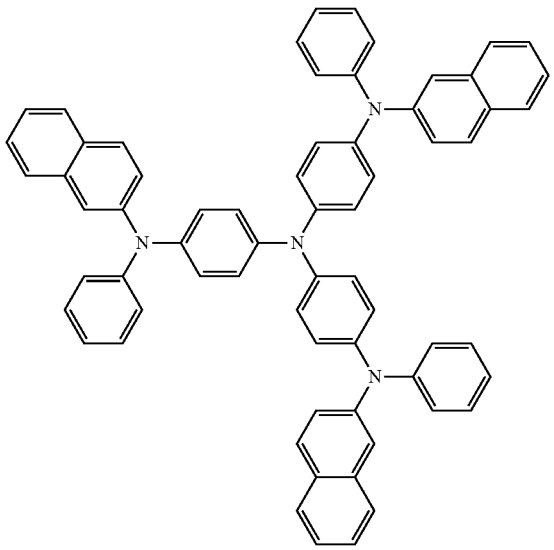

NPB

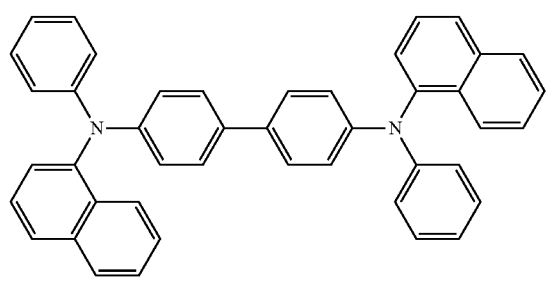

β-NPB

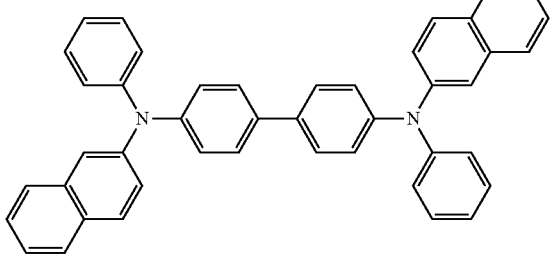

TPD

Spiro-TPD

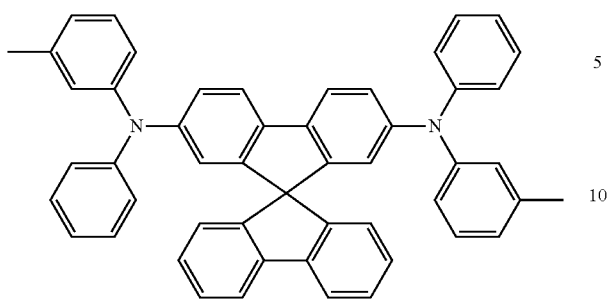

Spiro-NPB

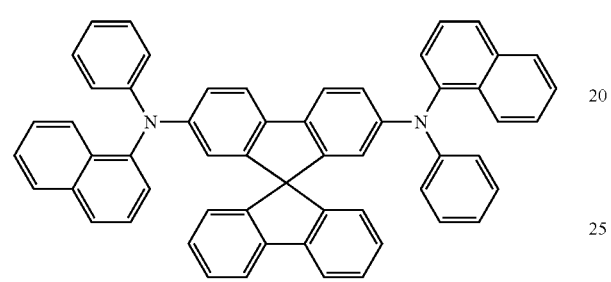

methylated NPB

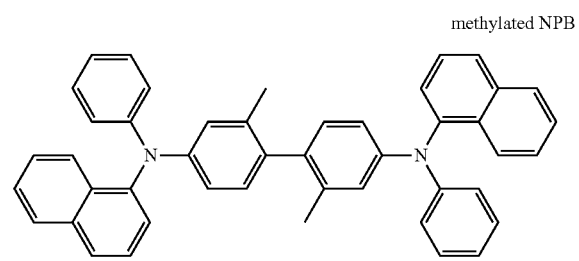

TAPC

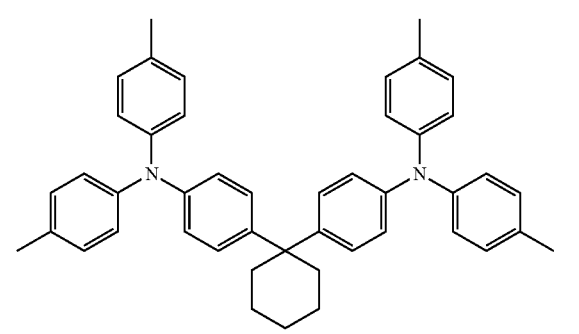

HMTPD

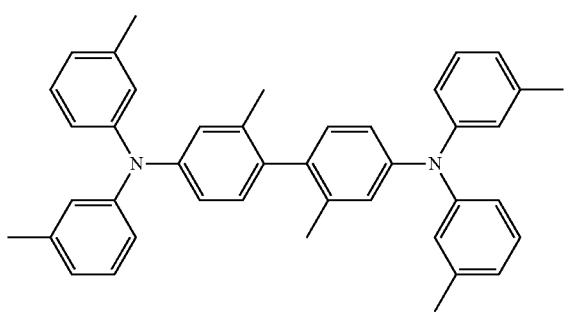

<Formula 201>

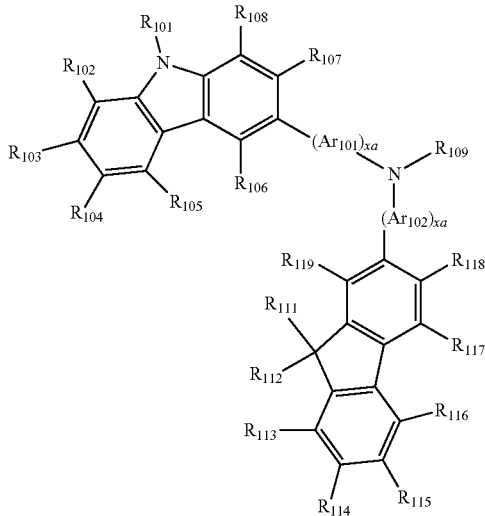

<Formula 202>

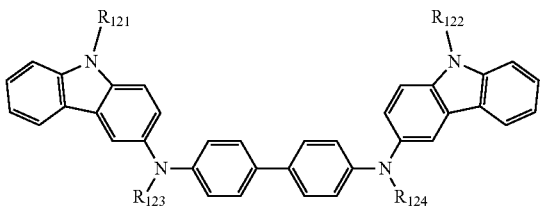

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or may be 0, 1 or 2. For example, xa may be 1 and xb may be 0. However, embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, or the like);

- a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or
- a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A.

<Formula 201A>

For example, the hole transport region may include one or a combination of Compounds HT1 to HT21.

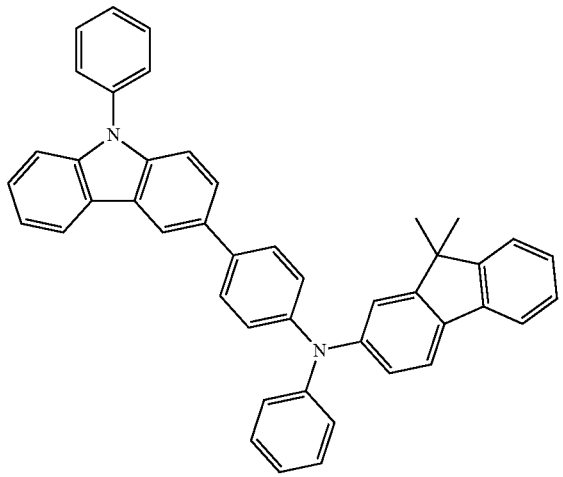

HT1

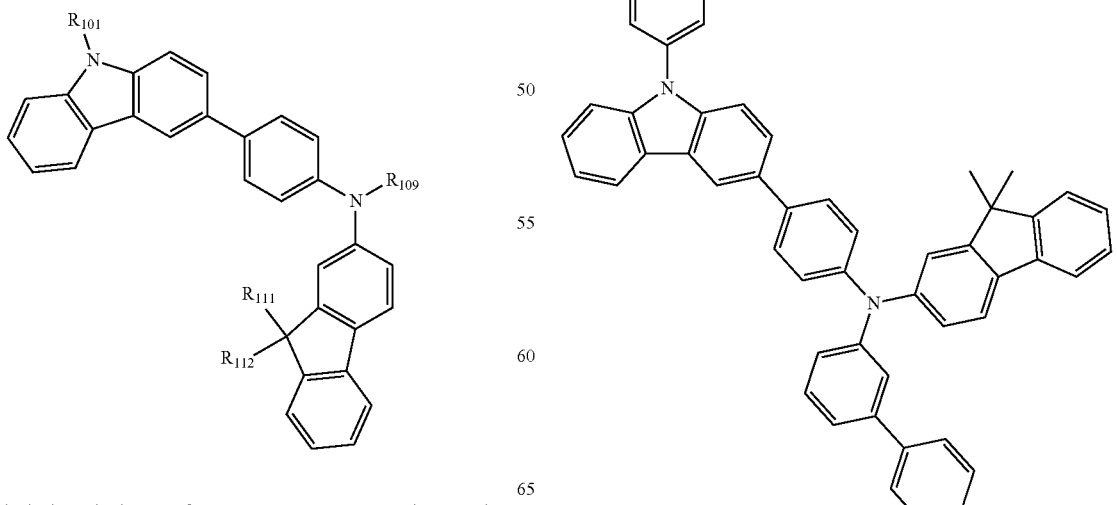

HT2

Detailed descriptions of $R_{101}$, $R_{111}$, $R_{112}$, and $R_{109}$ in Formula 201A are the same as described above.

HT3
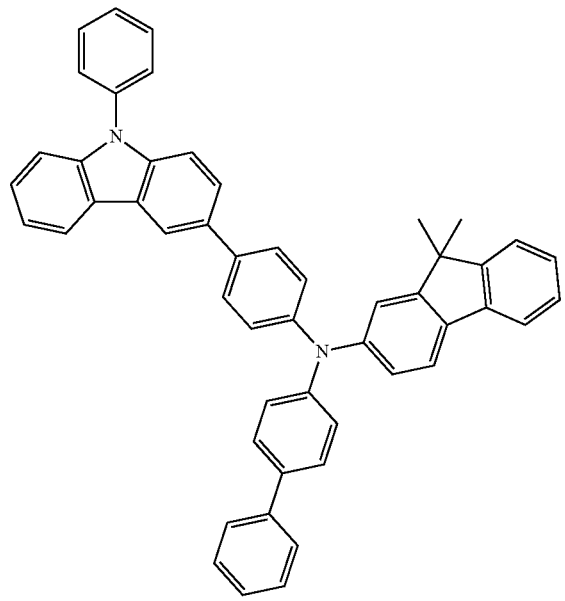
HT5
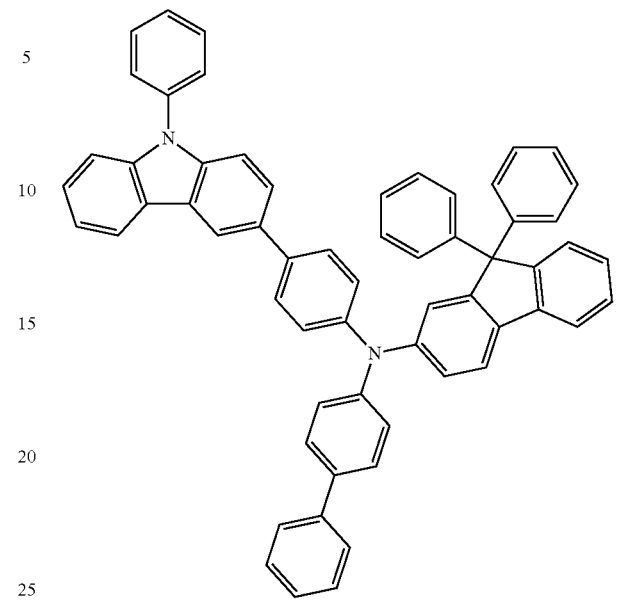
HT4
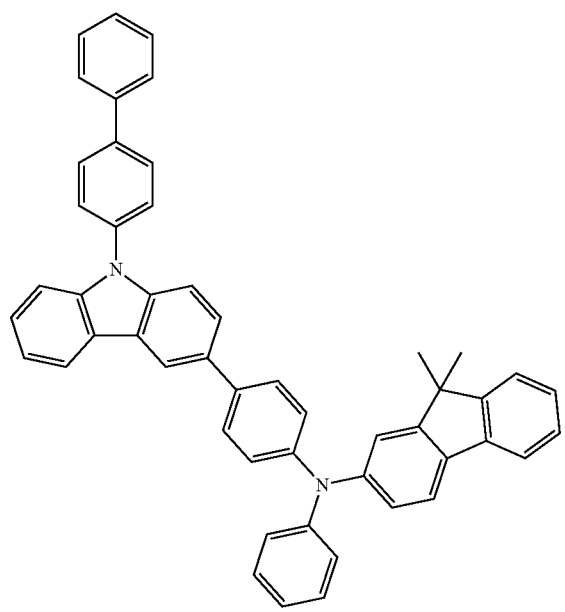
HT6
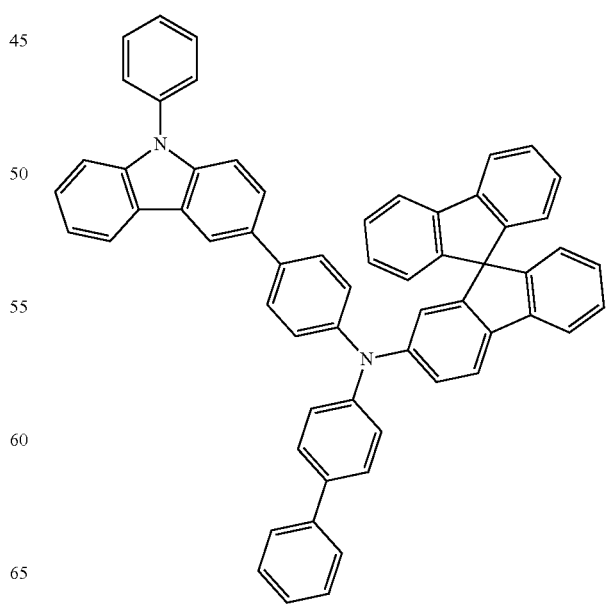

HT7
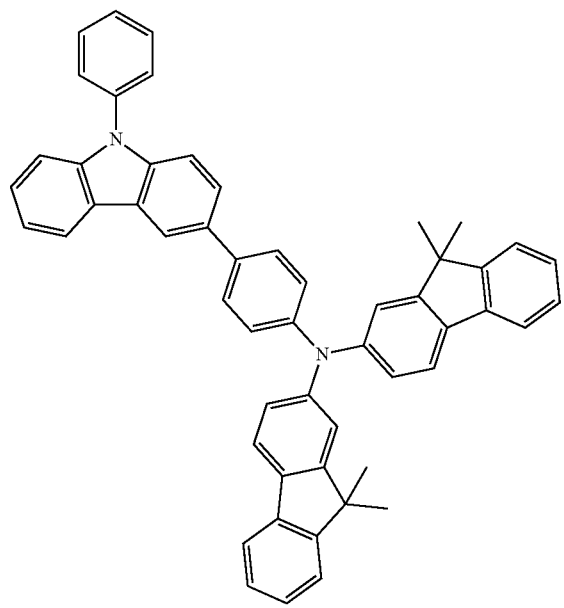
HT10
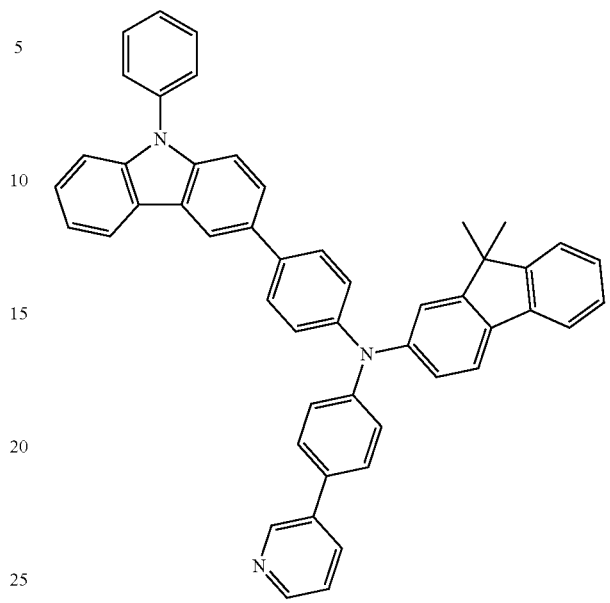
HT8
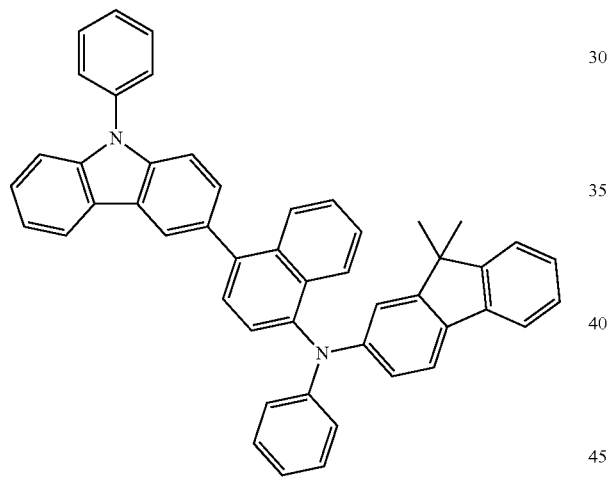
HT9
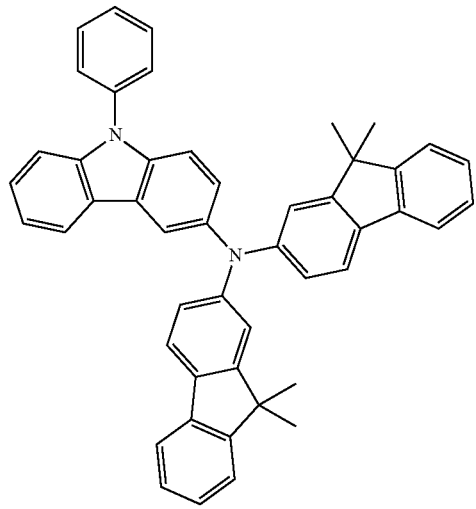
HT11
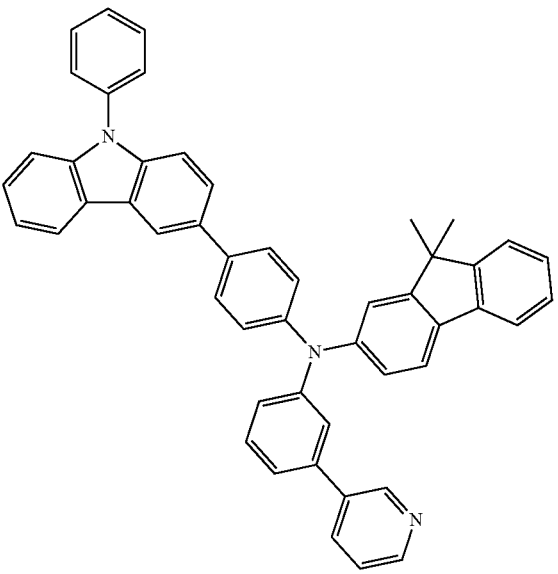

HT12
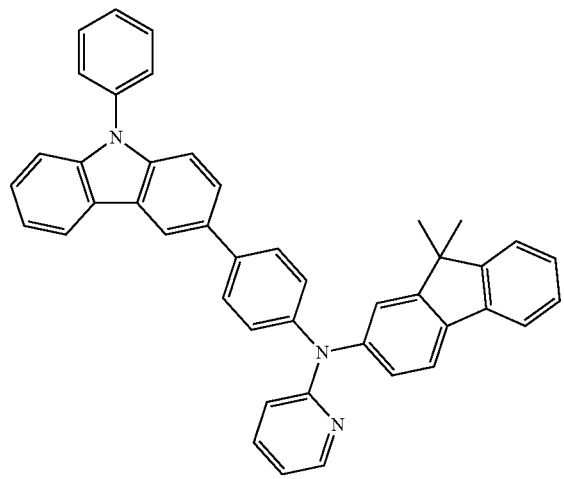
HT13
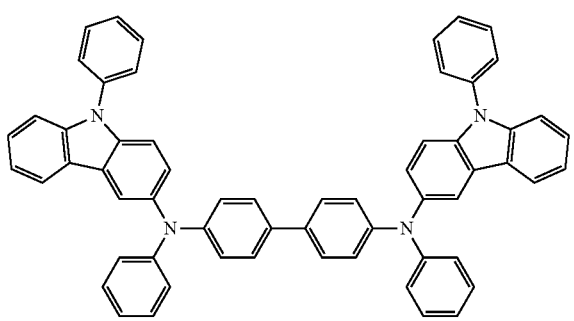
HT14
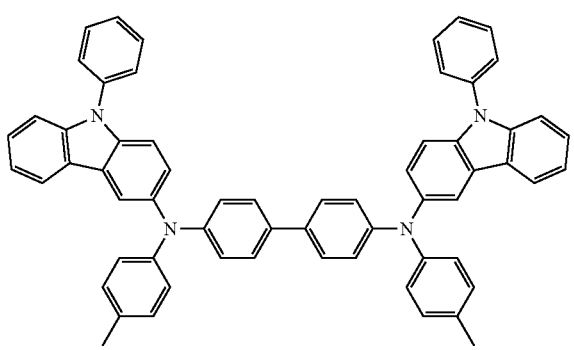
HT15
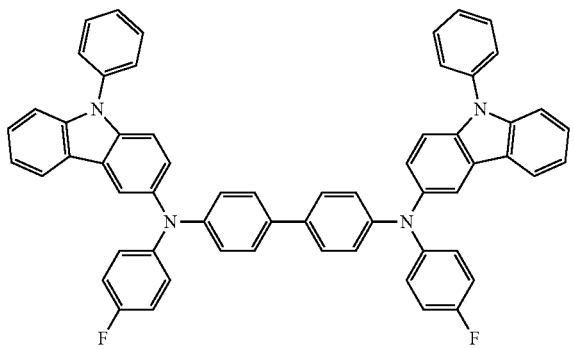
HT16
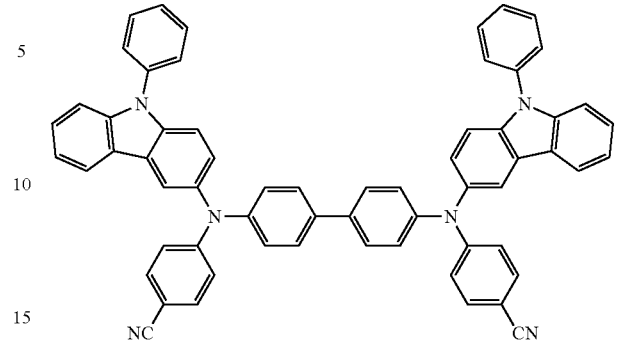
HT17
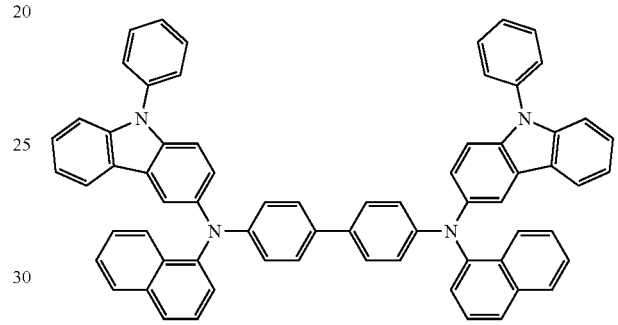
HT18
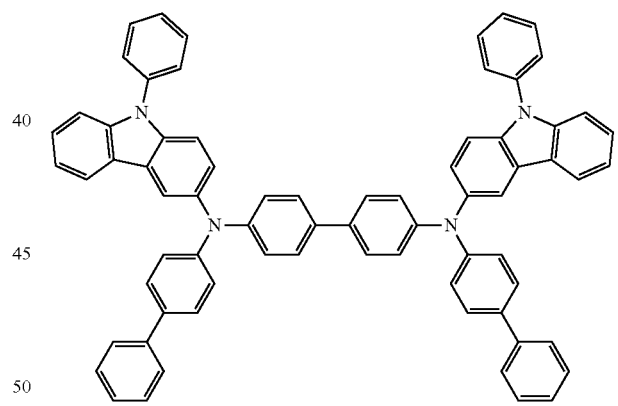
HT19
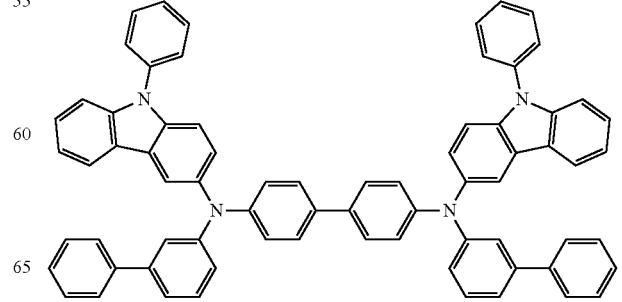

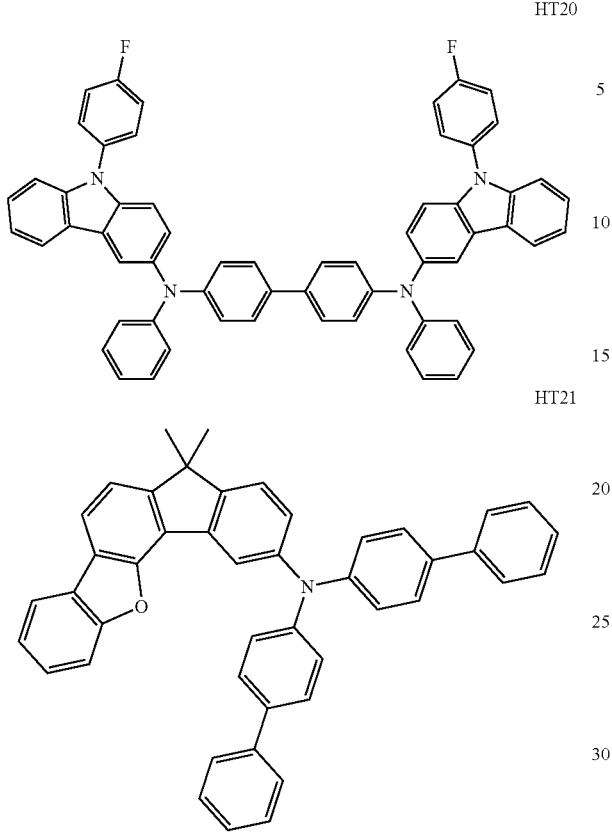

HT20

HT21

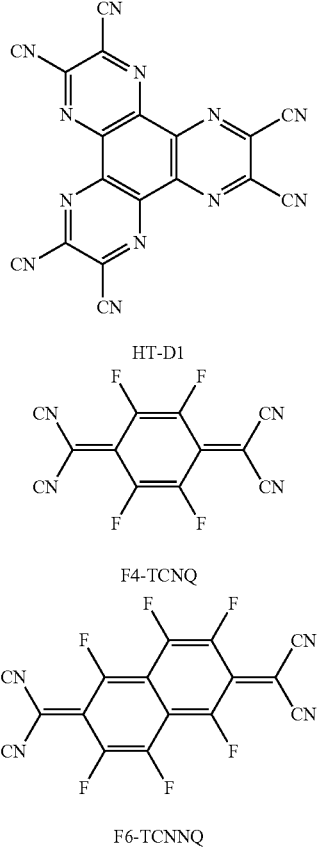

HT-D1

F4-TCNQ

F6-TCNNQ

A thickness of the hole transport region may be from about 100 Å to about 10,000 Å, for example, about 100 Å to about 1,000 Å. When the hole transport region includes a hole injection layer, a hole transport layer, an electron blocking layer, or any combination thereof, a thickness of the hole injection layer may be in a range of about 100 Å to about 10000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to the above-described materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof. For example, the p-dopant may be a quinone derivative, such as tetracyanoquinonedimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; or a cyano group-containing compound, such as Compound HT-D1; or any combination thereof.

The hole transport region may further include a buffer layer.

The buffer layer may compensate for an optical resonance distance according to a wavelength of light emitted from the emission layer, and thus increase efficiency.

Meanwhile, when the hole transport region includes an electron blocking layer, a material for the electron blocking layer may be materials for the hole transport region described above, materials for a host which will be described later, or any combination thereof. For example, when the hole transport region includes an electron blocking layer, a material for the electron blocking layer may be mCP, which will be explained later, Compound HT21, or any combination thereof.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

The emission layer may include a host and a dopant, and the dopant may include the organometallic compound represented by Formula 1 described herein.

The host may include TPBi, TBADN, ADN (also referred to as "DNA"), CBP, CDBP, TCP, mCP, Compounds H50, Compound H51, Compound H52, or any combination thereof.

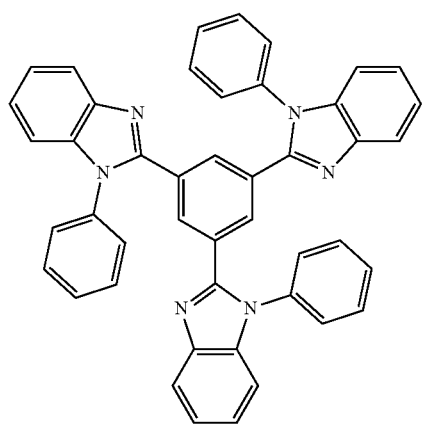
TPBi
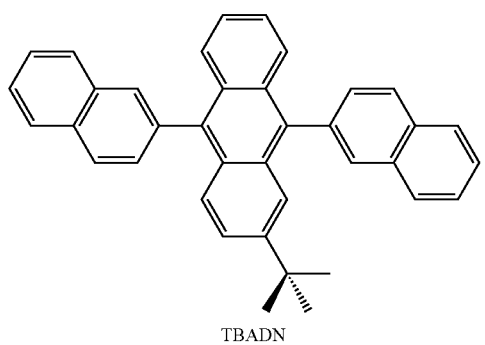
TBADN
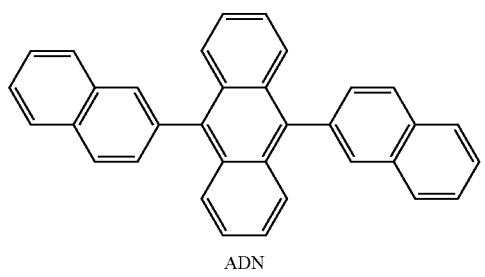
ADN
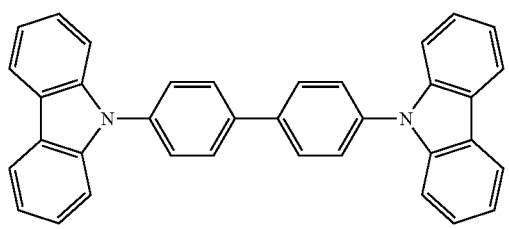
CBP
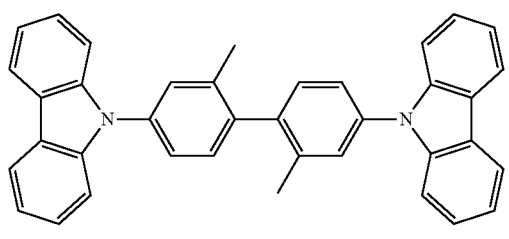
CDBP
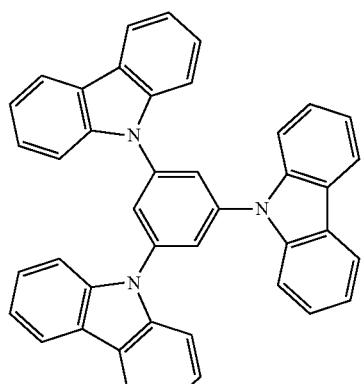
TCP
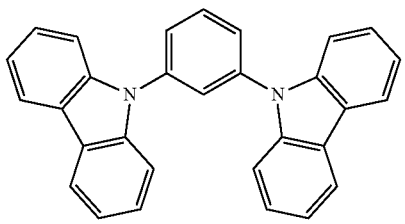
mCP
H50
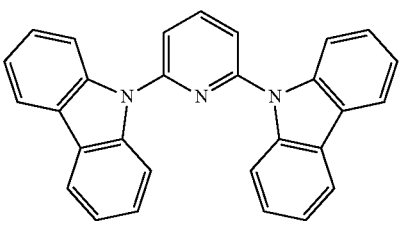
H51
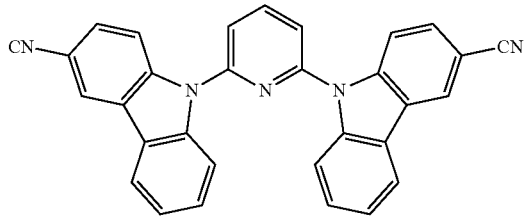

-continued

H52

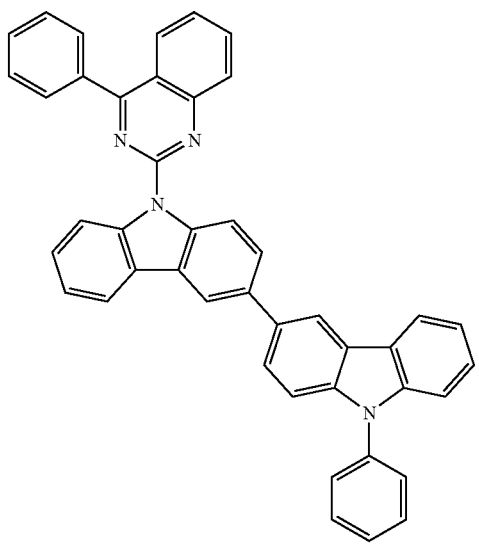

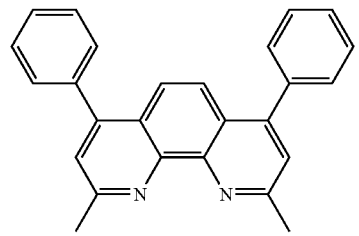

BCP

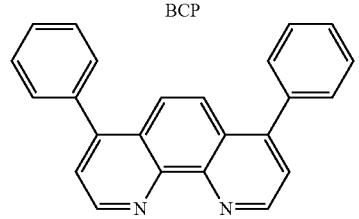

Bphen

When the organic light-emitting device is a full-color organic light-emitting device, the emission layer may be patterned into a red emission layer, a green emission layer, and/or a blue emission layer. In one or more embodiments, due to having a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

The dopant may be the organometallic compound represented by Formula 1 according to embodiments. For example, the dopant may be a red, green, or blue phosphorescent dopant. In one or more embodiments, the dopant may be a red phosphorescent dopant.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, BAlq, or any combination thereof.

In one or more embodiments, the hole blocking layer may include the host, materials for an electron transport layer and an electron injection layer, which will be described later, or any combination thereof.

A thickness of the hole blocking layer may be from about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, Alq$_3$, BAlq, TAZ, NTAZ, or any combination thereof.

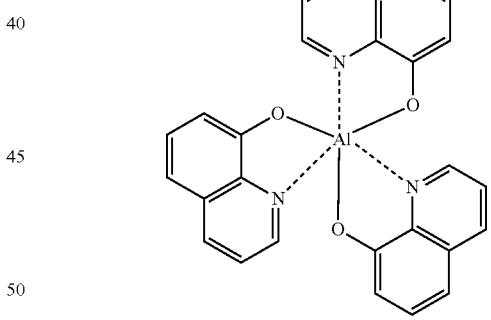

Alq$_3$

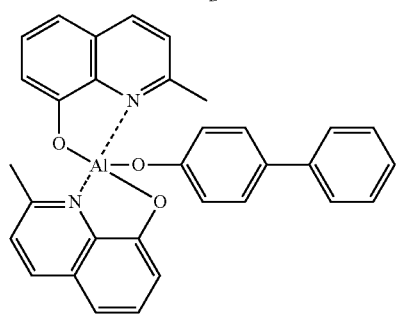

BAlq

127
-continued
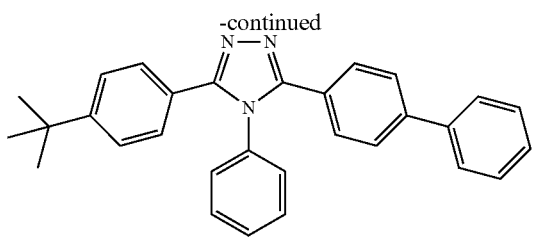
TAZ
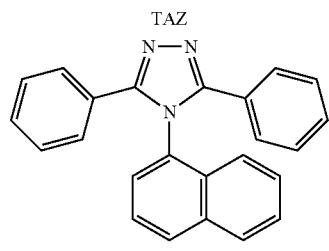
NTAZ
In one or more embodiments, the electron transport layer may include at least one of Compounds ET1 to ET25, or any combination thereof.
ET1
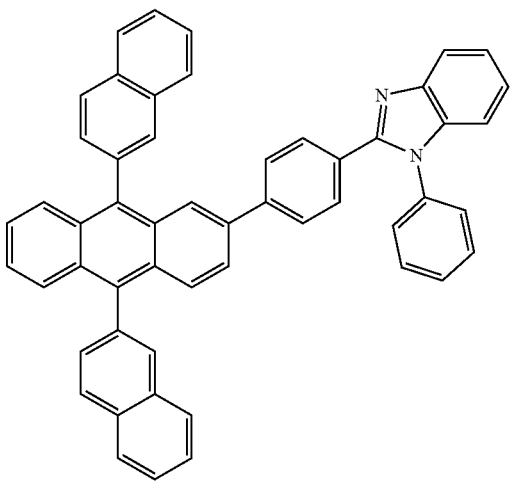
ET2
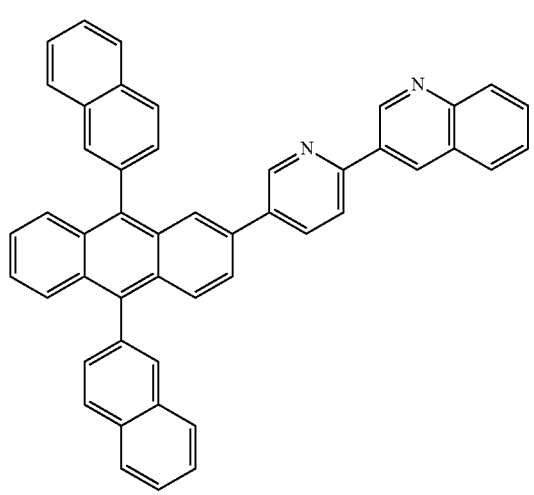
128
-continued
ET3
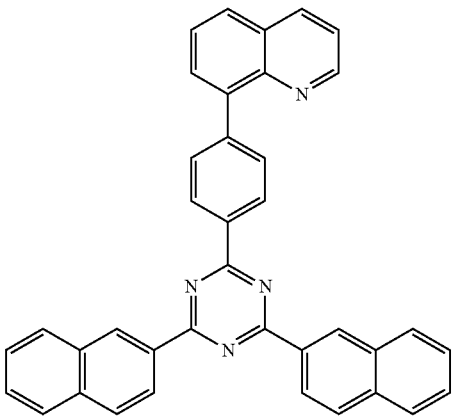
ET4
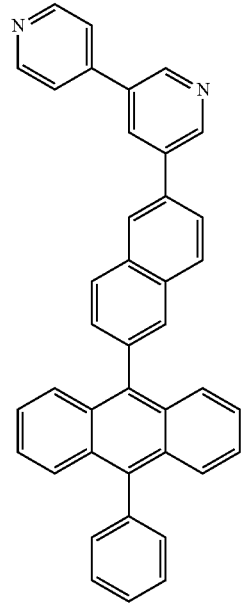
ET5
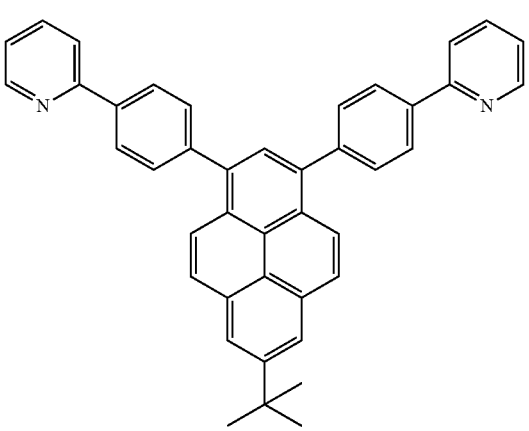

-continued
ET6
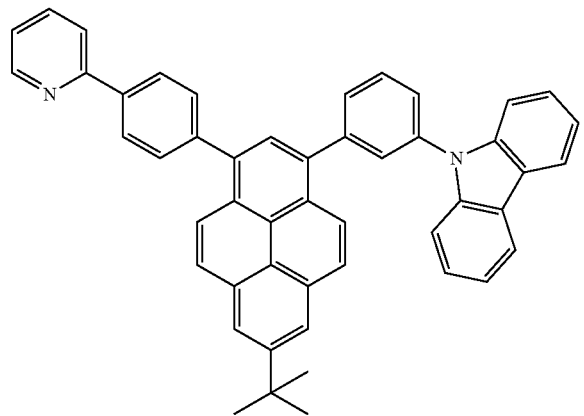
ET7
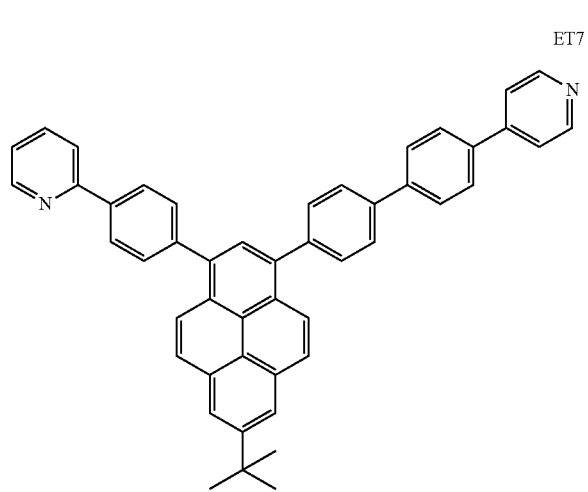
ET8
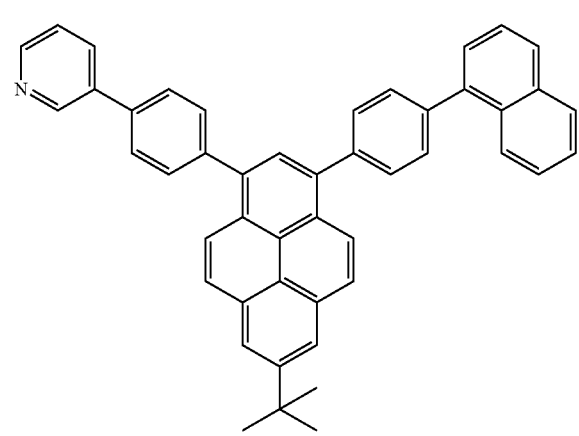
-continued
ET9
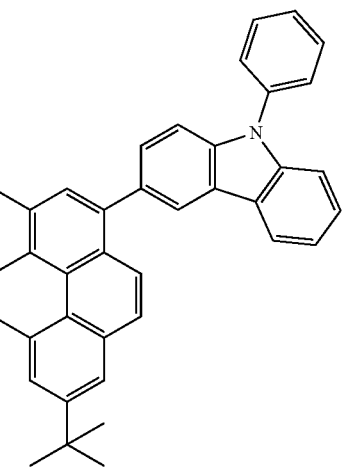
ET10
ET11
ET12
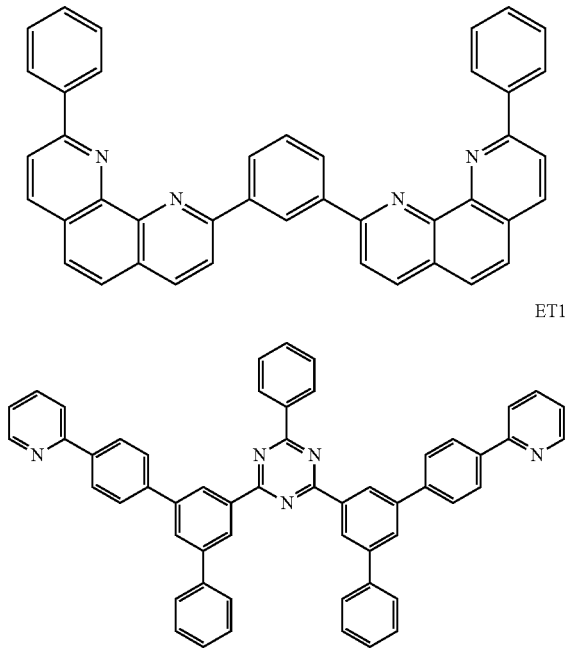

ET13
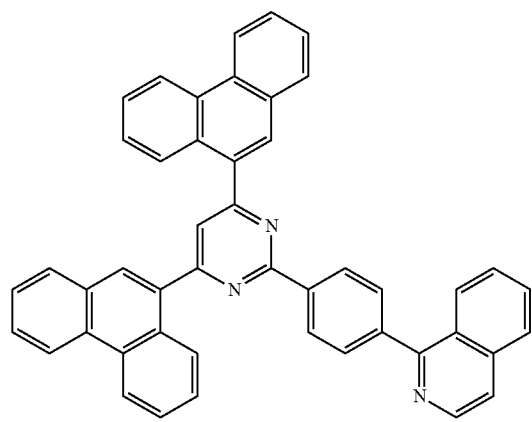
ET14
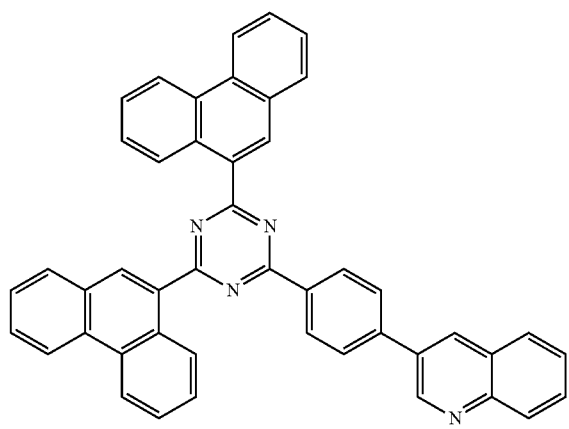
ET15
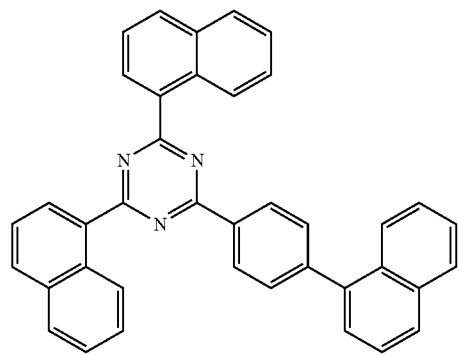
ET16
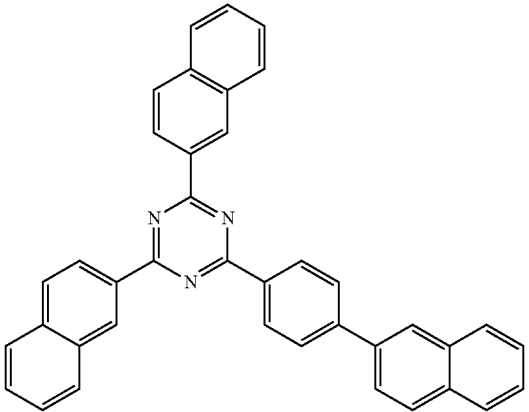
ET17
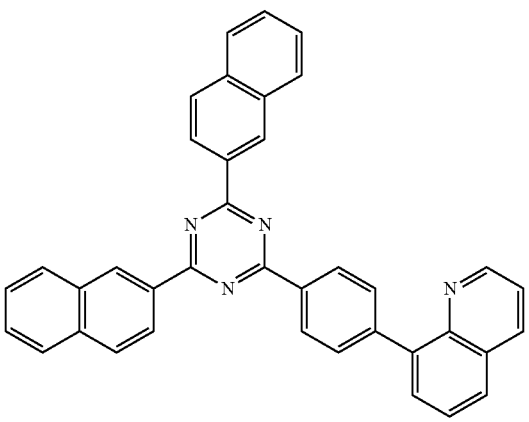
ET18
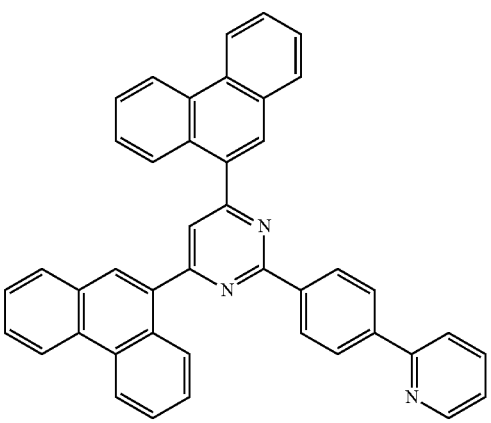

ET19
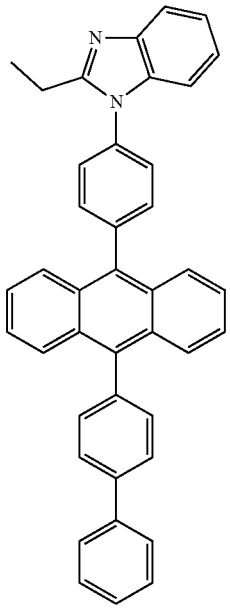
ET20
ET22
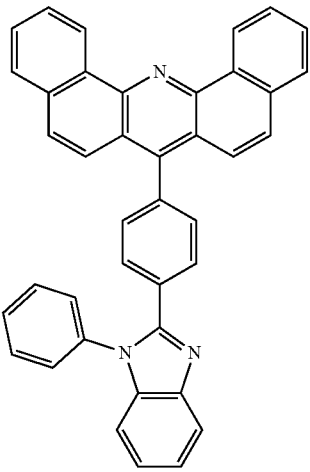
ET23
ET21
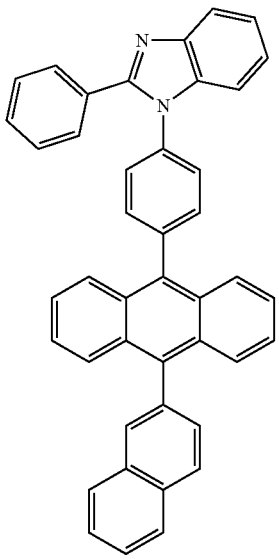
ET24
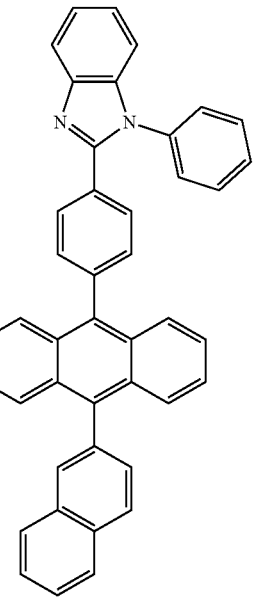

-continued

ET25

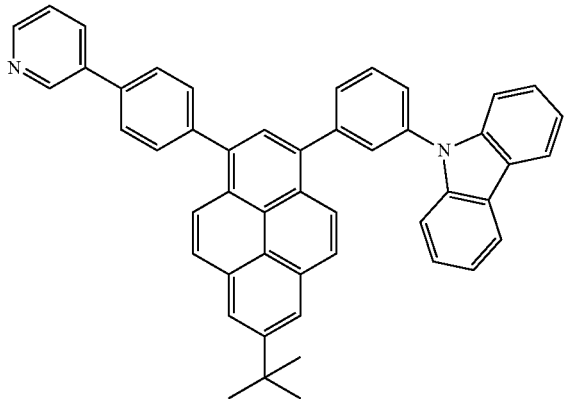

A thickness of the electron transport layer may be from about 100 Å to about 1,000 Å, for example, about 150 Å to about 500 Å. When the thickness of the electron transport layer is within the above-described ranges, the electron transport layer may have satisfactory electron transport characteristics without a substantial increase in driving voltage.

The electron transport layer may further include, in addition to the materials described above, a metal-containing material.

The metal-containing material may include a Li complex. The Li complex may include, for example, Compound ET-D1 (LiQ), Compound ET-D2, or any combination thereof.

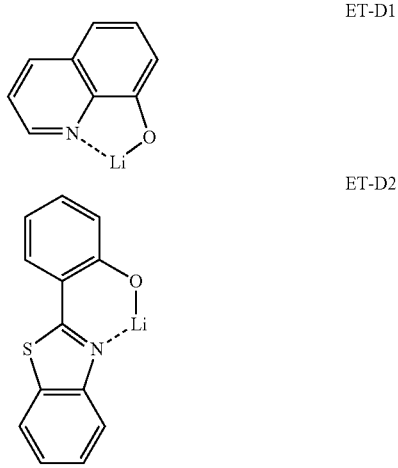

ET-D1

ET-D2

The electron transport region may include an electron injection layer that facilitates flow of electrons from the second electrode 19.

The electron injection layer may include LiF, NaCl, CsF, $Li_2O$, BaO, or any combination thereof.

A thickness of the electron injection layer may be from about 1 Å to about 100 Å, for example, about 3 Å to about 90 Å. When a thickness of the electron injection layer is within these ranges, satisfactory electron injection characteristics may be obtained without substantial increase in driving voltage.

The second electrode 19 is disposed on the organic layer 15. The second electrode 19 may be a cathode. A material for forming the second electrode 19 may be a metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg-In), or magnesium-silver (Mg—Ag) may be used as the material for forming the second electrode 19. To manufacture a top-emission type light-emitting device, a transmissive electrode formed using ITO or IZO may be used as the second electrode 19.

Hereinbefore, the organic light-emitting device according to an embodiment has been described with reference to FIGURE. However, embodiments are not limited thereto.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Non-limiting examples of the $C_1$-$C_{60}$ alkyl group, the $C_1$-$C_{20}$ alkyl group and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. For example, the group represented by Formula 9-33, as described above, which is a branched $C_6$ alkyl group, may be a tert-butyl group substituted with two methyl groups.

The term "$C_1$-$C_{60}$ alkoxy group" used herein refers to a monovalent group represented by —$OA_{101}$ (wherein $A_{101}$ is a $C_1$-$C_{30}$ alkyl group). Non-limiting examples of the $C_1$-$C_{30}$ alkoxy group, the $C_1$-$C_{20}$ alkoxy group, or the $C_1$-$C_{10}$ alkoxy group may include a methoxy group, an ethoxy group, a propoxy group, a butoxy group, and a pentoxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group"

as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Non-limiting examples of the $C_3$-$C_{10}$ cycloalkyl group include a cyclopropyl group, a cyclobutyl group, a cyclopentyl group, a cyclohexyl group, a cycloheptyl group, a cyclooctyl group, an adamantyl group, a bicyclo[1.1.1]pentyl group, a bicyclo[2.1.1]hexyl group, a bicyclo[2.2.1]heptyl group (a norbornyl group), and a bicyclo[2.2.2]octyl group.

The term "$C_1$-$C_{10}$ heterocycloalkyl group" as used herein refers to a monovalent monocyclic group having 1 to 10 carbon atoms and including, as a ring-forming atom, at least one N, O, P, Si, B, Se, Ge, Te, S, or any combination thereof. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group herein may include a silolanyl group, a silinanyl group, a tetrahydrofuranyl group, a tetrahydro-2H-pyranyl group, a tetrahydrothiophenyl group.

The term "$C_3$-$C_{10}$ cycloalkenyl group" as used herein refers to a monovalent monocyclic group having 3 to 10 carbon atoms and at least one carbon-carbon double bond in the ring thereof but no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group having 2 to 10 carbon atoms and including, as a ring-forming atom, at least one N, O, P, Si, B, Se, Ge, Te, S, or any combination thereof, and at least one double bond in the ring thereof. Non-limiting examples of the $C_2$-$C_{10}$ heterocycloalkenyl group include a 2,3-dihydrofuranyl group and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having 1 to 60 carbon atoms and including, as a ring-forming atom, at least one hetero atom selected from N, O, P, Si, B, Se, Ge, Te, S, or any combination thereof. The term "$C_1$-$C_{60}$ heteroarylene group" as used herein refers to a divalent group having a heterocyclic aromatic system having 1 to 60 carbon atoms and including, as a ring-forming atom, at least one hetero atom selected from N, O, P, Si, B, Se, Ge, Te, S, or any combination thereof. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" used herein indicates —$OA_{102}$ (wherein $A_{102}$ is a $C_6$-$C_{60}$ aryl group as described above), the term "$C_6$-$C_{60}$ arylthio group" used herein indicates —$SA_{103}$ (wherein $A_{103}$ is a $C_6$-$C_{60}$ aryl group as described above), and the term "$C_1$-$C_{60}$ alkylthio group" used herein indicates —$SA_{104}$ (wherein $A_{104}$ indicates a $C_1$-$C_{60}$ alkyl group as described above).

The term "monovalent non-aromatic condensed polycyclic group" as used herein refers to a monovalent group (for example, having 8 to 60 carbon atoms) having two or more rings condensed to each other, and only carbon atoms as ring-forming atoms, and in which the whole molecular structure has no aromaticity. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, and including as ring-forming atoms, in addition to carbon atoms, a heteroatom selected from N, O, P, Si, and S, and in which the whole molecular structure has no aromaticity. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. The term "$C_5$-$C_{30}$ carbocyclic group (unsubstituted or substituted with at least one $R_{1a}$)" may include, for example, an adamantane group, a norbornene group, a bicyclo[1.1.1]pentane group, a bicyclo[2.1.1]hexane group, a bicyclo[2.2.1]heptane group (norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group (, which are each unsubstituted or substituted with at least one $R_{1a}$).

The term "$C_1$-$C_{30}$ heterocyclic group" as used herein refers to a saturated or unsaturated cyclic group having, as ring-forming atoms, in addition to 1 to 30 carbon atoms, at least one hetero atom selected from N, O, P, Si, B, Ge, Se, Te, S, or any combination thereof. The $C_1$-$C_{30}$ heterocyclic group may be a monocyclic group or a polycyclic group. The "$C_1$-$C_{30}$ heterocyclic group (unsubstituted or substituted with at least one $R_{1a}$)" may be, for example, a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazol group, a benzopyrazole group, a benzimidazole group, a benzoxazole group, a benzothiazole group, a benzoxadiazole group, a benzothiadiazol group, a 5,6,7,8-tetrahydroisoquinoline group, or a 5,6,7,8-tetrahydroquinoline group, (which are each unsubstituted or substituted with at least one $R_{1a}$).

The terms "fluorinated $C_1$-$C_{60}$ alkyl group (or a fluorinated $C_1$-$C_{20}$ alkyl group, etc)," "fluorinated $C_3$-$C_{10}$ cycloalkyl group," "fluorinated $C_1$-$C_{10}$ heterocycloalkyl group," and "fluorinated phenyl group" as used herein, refer to, respectively a $C_1$-$C_{60}$ alkyl group, a $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The term "fluorinated $C_1$-$C_{60}$ alkyl group (or fluorinated $C_1$-$C_{20}$ alkyl group, etc.)," "fluorinated $C_3$-$C_{10}$ cycloalkyl group", "fluorinated $C_1$-$C_{10}$ heterocycloalkyl group", or "fluorinated phenyl group" may be, i) a fully fluorinated $C_1$-$C_{60}$ alkyl group (or a fully fluorinated $C_1$-$C_{20}$ alkyl group, etc.), a fully fluorinated $C_3$-$C_{10}$ cycloalkyl group, a fully fluorinated $C_1$-$C_{10}$ heterocycloalkyl group, a fully fluorinated phenyl group, all the hydrogens in each group substituted with fluoro groups, or ii) a partially fluorinated $C_1$-$C_{60}$ alkyl group (or partially fluorinated $C_1$-$C_{20}$ alkyl group, etc.), a partially fluorinated $C_3$-$C_{10}$ cycloalkyl group, a partially fluorinated $C_1$-$C_{10}$ heterocycloalkyl group, or partially fluorinated phenyl group, all the hydrogens in each group partially, i.e., not fully, substituted with fluoro groups.

The terms "deuterated $C_1$-$C_{60}$ alkyl group (or deuterated $C_1$-$C_{20}$ alkyl group, etc.)", "deuterated $C_3$-$C_{10}$ cycloalkyl group", "deuterated $C_1$-$C_{10}$ heterocycloalkyl group," and "deuterated phenyl group" as used herein may refer to, respectively, a $C_1$-$C_{60}$ alkyl group (or a $C_1$-$C_{20}$ alkyl group, etc.), a $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$ and —$CDH_2$. An example of the "deuterated $C_3$-$C_{10}$ cycloalkyl group" may be the group represented by Formula 10-501 as described above. The terms "deuterated $C_1$-$C_{60}$ alkyl group (or deuterated $C_1$-$C_{20}$ alkyl group, etc.)," "deuterated $C_3$-$C_{10}$ cycloalkyl group", "deuterated $C_1$-$C_{10}$ heterocycloalkyl group", or "deuterated phenyl group" may be i) a fully deuterated $C_1$-$C_{60}$ alkyl group (or fully a deuterated $C_1$-$C_{20}$ alkyl group, etc.), a fully deuterated $C_3$-$C_{10}$ cycloalkyl group, a fully deuterated $C_1$-$C_{10}$ heterocycloalkyl group, or a fully deuterated phenyl group, all the hydrogens in each group substituted with deuterium, or ii) a partially deuterated $C_1$-$C_{60}$ alkyl group (or partially deuterated $C_1$-$C_{20}$ alkyl group, etc.), a partially deuterated $C_3$-$C_{10}$ cycloalkyl group, a partially deuterated $C_1$-$C_{10}$ heterocycloalkyl group, or a partially deuterated phenyl group, all the hydrogens in each group partially, not fully, substituted with deuterium.

The term "($C_1$-$C_{20}$ alkyl) 'X' group" used herein refers to an 'X' group substituted with at least one $C_1$-$C_{20}$ alkyl group. For example, the term "($C_1$-$C_{20}$ alkyl)$C_3$-$C_{10}$ cycloalkyl group" as used herein indicates a $C_3$-$C_{10}$ cycloalkyl group substituted with at least one $C_1$-$C_{20}$ alkyl group, and the term "($C_1$-$C_{20}$ alkyl)phenyl group" indicates a phenyl group substituted with at least one $C_1$-$C_{20}$ alkyl group. For example, the ($C_1$ alkyl)phenyl group may be a toluyl group.

As used herein, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group may refer to hetero rings having the same backbone as an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group, respectively, at least one of the carbons forming the ring of each group substituted with nitrogen.

A substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group or a $C_1$-$C_{60}$ alkoxy group;

a $C_1$-$C_{60}$ alkyl group, a $C_2$-$C_{30}$ alkenyl group, a $C_2$-$C_{30}$ alkynyl group, or a $C_1$-$C_{30}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof.

As used herein, $Q_1$ to $Q_9$, $Q_{11}$ to $Q_{19}$, $Q_{21}$ to $Q_{29}$, and $Q_{31}$ to $C_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{30}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Hereinafter, compounds and organic light-emitting devices according to embodiments will now be described in detail with reference to synthesis examples and examples. However, these examples are only for illustrative purposes and are not intended to limit the scope of the one or more embodiments of the present disclosure. The wording "B was used instead of A" used in describing synthesis examples means that the amount of A used was identical to the amount of B used, in terms of a molar equivalent.

EXAMPLES

Synthesis Example 1 (Compound 1)

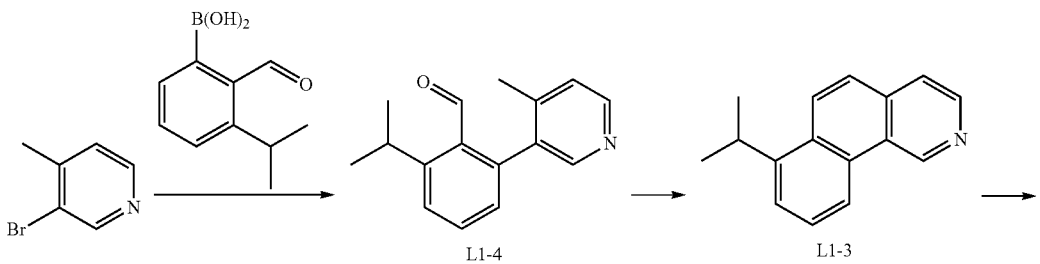

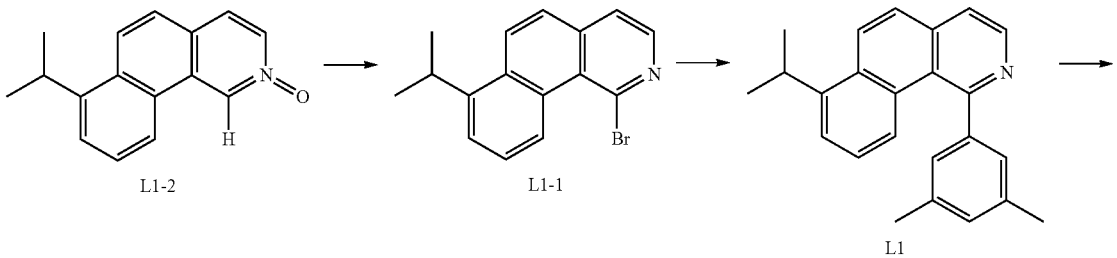

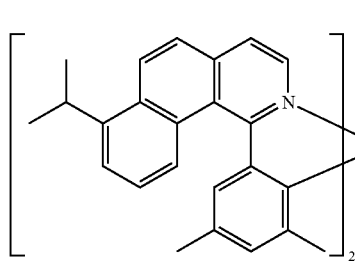

L1 Dimer

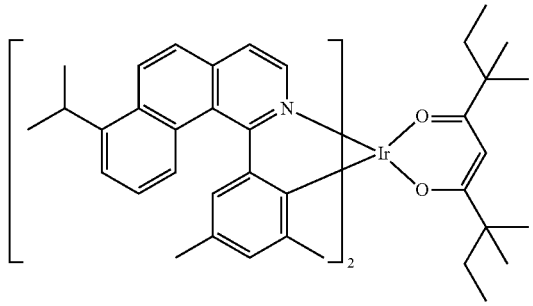

1

Synthesis of Intermediate L1-4

5 g (29.1 mmol) of 3-bromo-4-methylpyridine was mixed with 60 mL of acetonitrile and 15 mL of water, and then 1.43 g (2.04 mmol) of $PdCl_2(PPh_3)_2$, 5.5 g (29.1 mmol) of (2-formyl-3-isopropylphenyl)boronic acid, and 10.04 g (72.8 mmol) of $K_2CO_3$ were added thereto and heated under reflux at 80° C. for 18 hours. After the reaction was completed, the reaction mixture was concentrated under reduced pressure and then extracted with dichloromethane and water to obtain an organic phase. The obtained organic phase was dried with magnesium sulfate, distilled under reduced pressure, and then purified by column chromatography to obtain 5.71 g of Intermediate L1-4 (Yield: 82%).

HRMS (MALDI) calcd for $C_{16}H_{17}NO$: m/z 239.31

Synthesis of Intermediate L1-3

5.71 g (23.8 mmol) of Intermediate L1-4 was mixed with 70 mL of dimethylformamide (DMF). After a solution of 3.49 g (47.6 mmol) of potassium tert-butoxide (t-BuOK) mixed with 10 mL of DMF was slowly dropwise added to the mixture and then stirred at room temperature for a day. After the reaction was completed, the reaction mixture was concentrated under reduced pressure and then extracted with dichloromethane and water to obtain an organic phase. The obtained organic phase was dried with magnesium sulfate, distilled under reduced pressure, and then purified by column chromatography to obtain 4.00 g of Intermediate L1-3 (Yield: 76%).

HRMS (MALDI) calcd for $C_{16}H_{15}N$: m/z 221.30

Synthesis of Intermediate L1-2

After 4.00 g (18.1 mmol) of Intermediate L1-3 was dissolved in 60 mL of $CH_2Cl_2$, m-chloroperoxybenzoic acid (mCPBA) was slowly dropwise added thereto at 0° C. and then stirred for a day. After the reaction was completed, the reaction mixture was extracted with 6N KOFI aqueous solution to obtain an organic phase. The obtained organic phase was dried using magnesium sulfate, distilled under reduced pressure, and then purified by column chromatography to obtain 4.08 g of Intermediate L1-2 (Yield: 95%).

Synthesis of Intermediate L1-1

After 4.08 g (17.2 mmol) of Intermediate L1-2 was dissolved in 80 mL of $CH_2Cl_2$, 5.68 g (19.8 mmol) of $POBr_3$ was slowly dropwise added thereto at 0° C., and then 0.3 mL of DMF was added thereto and stirred at room temperature for a day. After the reaction was completed, the reaction mixture was extracted with saturated sodium bicarbonate to obtain an organic phase. The obtained organic phase was dried using magnesium sulfate, distilled under reduced pressure, and then purified by column chromatography to obtain 3.51 g of Intermediate L1-1 (Yield: 68%).

HRMS (MALDI) calcd for $C_{16}H_4BrN$: m/z 300.19

Synthesis of Intermediate L1

After 3.51 g (11.7 mmol) of Intermediate L1-1 was mixed with 45 mL of THF and 15 mL of water, 1.93 g (12.9 mmol) of 3,5-dimethylphenylboronic acid, 1.23 g (0.82 mmol) of $Pd(PPh_3)_4$, and 4.04 g (29.3 mmol) of $K_2CO_3$ were added thereto and then heated under reflux at 75° C. for a day. After the reaction was completed, the reaction mixture was extracted with ethyl acetate and water to obtain an organic phase. The obtained organic phase was dried using magnesium sulfate, distilled under reduced pressure, and then purified by column chromatography to obtain 2.15 g of Intermediate L1 (Yield: 74%).

HRMS (MALDI) calcd for $C_{24}H_{23}N$: m/z 325.45

Synthesis of Intermediate L1 Dimer 2.15 g (6.6 mmol) of Intermediate L1 and 1.11 g (3.1 mmol) of iridium chloride were mixed with 40 mL of ethoxyethanol and 15 mL of distilled water, and then heated under reflux for 24 hours. After the reaction was completed, the temperature was lowered to room temperature to obtain a solid product. This solid product was filtered and then washed sufficiently with water, methanol, and then hexane. The obtained solid was dried in a vacuum oven to obtain 2.54 g of Intermediate L1 Dimer.

Synthesis of Compound 1

2.54 g (1.45 mmol) of Intermediate L1 Dimer, 1.33 g (7.25 mmol) of 3,3,7,7-tetramethylnonane-4,6-dione, and 0.76 g (7.25 mmol) of $Na_2CO_3$ were mixed with 40 mL of ethoxyethanol, and then stirred at 90° C. for 24 hours to allow reaction. After the reaction was completed, the temperature was lowered to room temperature to obtain a solid product. This obtained solid product was filtered and then purified by column chromatography to obtain 1.6 g of Compound 1 (Yield: 55%).

HRMS (MALDI) calcd for $C_{61}H_{67}FIrN_2O_2$: m/z 1052.41

Synthesis Example 2 (Compound 5)

Synthesis of Intermediate L5-4

After 13.5 g (64 mmol) of 4-isobutyl-1-naphthaldehyde was mixed with 100 mL of chloroform, 10 mL (96 mmol) of aminoacetaldehyde dimethyl acetal was slowly added thereto at room temperature and then stirred. After one hour, the mixture was heated to 100° C. to remove the solvent. The obtained reaction mixture was cooled down to room temperature to thereby obtain, without additional purification, 19 g of Intermediate L5-4 (Yield: 99%).

HRMS (MALDI) calcd for $C_{19}H_{25}NO_2$: m/z 299.19

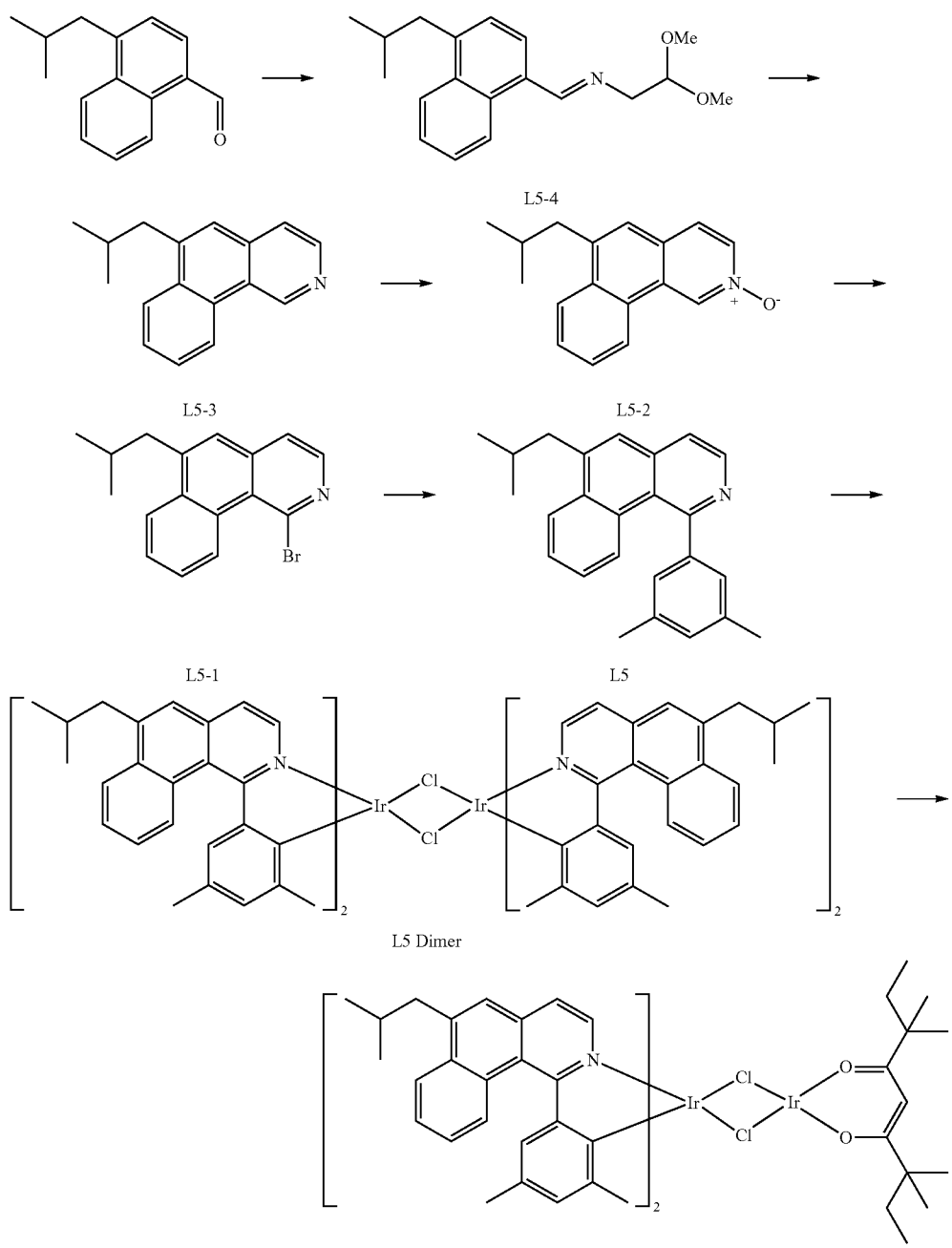

Synthesis of Intermediate L5-3

After 19 g (63 mmol) of Intermediate L5-4 was mixed with 100 mL of chloroform, 6 mL (63 mmol) of chloroformate and then 9 mL (74 mmol) of trimethylphosphite were slowly dropwise added thereto at 0° C. The resulting reaction mixture was stirred at room temperature for about 48 hours, and 250 mL (250 mmol) of 1.0M $TiCl_4$ solution was slowly dropwise added thereto at 0° C. and then heated under reflux for about 48 hours. After the reaction was completed, the reaction mixture was cooled down to room temperature and then put in ice water to obtain an aqueous phase. The obtained aqueous phase was washed with dichloromethane. After 140 g (495 mmol) of an aqueous tartrate solution was added thereto, the resulting mixture was neutralized with a saturated aqueous solution of $NaHCO_3$ and extracted with dichloromethane to obtain an organic phase. This organic phase was purified by column chromatography to obtain 4.7 g of Intermediate L5-3 (Yield: 34%).

HRMS (MALDI) calcd for $C_{16}H_{14}N$: m/z 220.11

Synthesis of Intermediate L5-2

After 4.5 g (20 mmol) of Intermediate L5-3 was mixed with 60 mL of dichloromethane, 6.7 g (40 mmol) of mCPBA was dropwise added thereto at 0° C. The reaction mixture was stirred at room temperature for about 18 hours, and then extracted with an aqueous solution of 6N KOH to obtain an organic phase. The obtained organic phase was dried using magnesium sulfate to thereby obtain, without additional purification, 5 g of Intermediate L5-2 (Yield: 99%).

Synthesis of Intermediate L5-1

After 5 g (19.9 mmol) of Intermediate L5-2 was mixed with 60 mL of dichloromethane, 7 g (23.9 mmol) of $POBr_3$ was slowly dropwise added thereto at 0° C. and then 0.8 mL (9 mmol) of DMF was slowly added thereto and stirred at room temperature for about 18 hours. After the reaction was completed, the resulting product was neutralized with a saturated aqueous solution of $NaHCO_3$ to obtain an organic phase. This organic phase was dried using a magnesium sulfate and then purified by column chromatography to obtain 2 g of Intermediate L5-1 (Yield: 30%).

HRMS (MALDI) calcd for $C_{17}H_{16}BrN$: m/z 313.05

Synthesis of Intermediate L5

1.5 g of Intermediate L5 (Yield: 75%) was synthesized in the same manner as in the synthesis method of Intermediate L1 of Synthesis Example 1, except that Intermediate L5-1 was used instead of Intermediate L1-1.

HRMS (MALDI) calcd for $C_{25}H_{25}N$: m/z 339.20

Synthesis of Intermediate L5 Dimer

Intermediate L5 Dimer was synthesized in the same manner as in the synthesis method of Intermediate L1 Dimer of Synthesis Example 1, except that Intermediate L5 was used instead of Intermediate L1.

Synthesis of Compound 5

0.7 g of Compound 5 (Yield: 47%) was obtained in the same manner as in the synthesis method of Compound 5 of Synthesis Example 1, except that Intermediate L5 Dimer was used instead of Intermediate L1 Dimer.

HRMS (MALDI) calcd for $C_{63}H_{71}IrN_2O_2$: m/z 1080.49

Synthesis Example 3 (Compound 11)

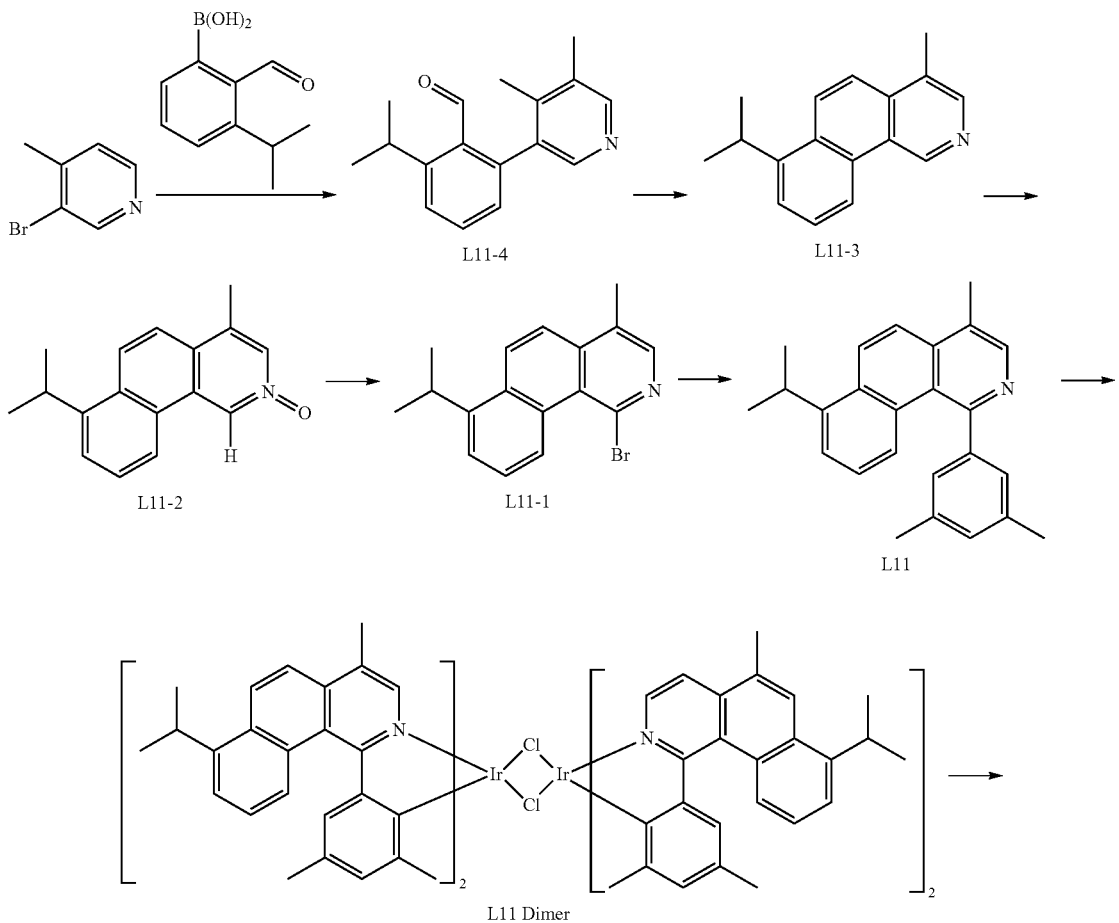

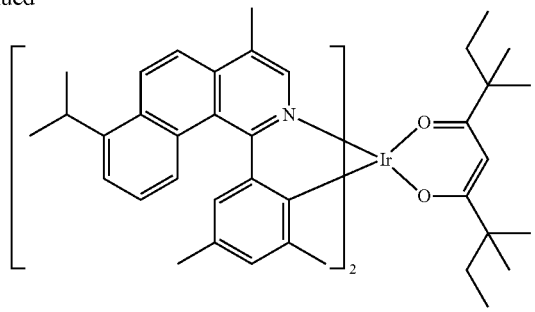

Intermediate L11-4, Intermediate L11-3, Intermediate L11-2, Intermediate L11-1, Intermediate L11, Intermediate L11 Dimer, and 0.5 g of Compound 11 (Yield: 50%) were sequentially synthesized in the same manner as in the synthesis methods of Intermediate L1-4, Intermediate L1-3, Intermediate L1-2, Intermediate L1-1, Intermediate L1, Intermediate L1 Dimer, and Compound 1 of Synthesis Example 1, respectively, except that 3-bromo-4,5-dimethylpyridine was used instead of 3-bromo-4-methylpyridine in the synthesis of Intermediate L1-4.

HRMS (MALDI) calcd for $C_{63}H_{71}IrN_2O_2$: m/z 1080.51

Synthesis Example 4 (Compound 29)

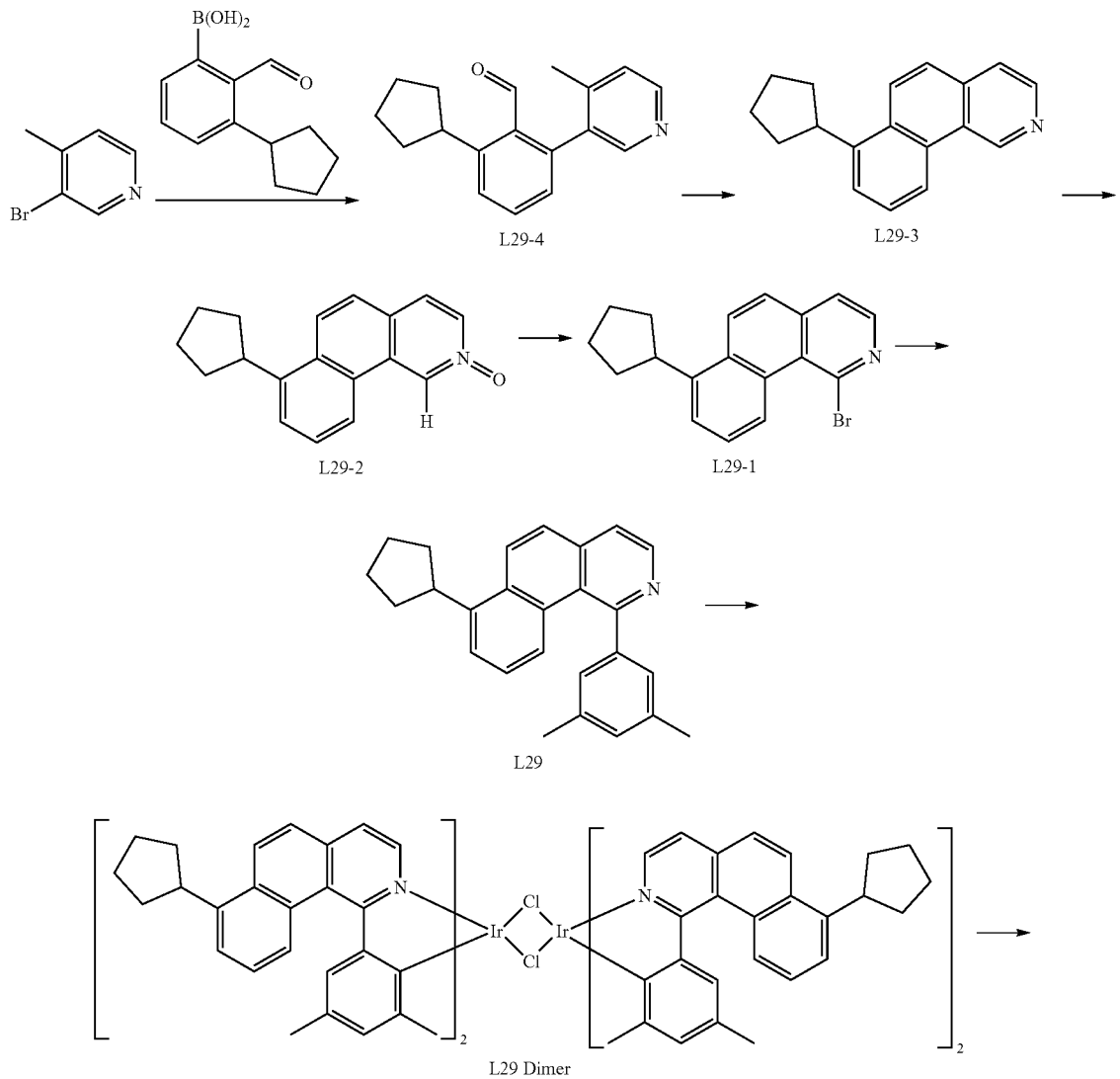

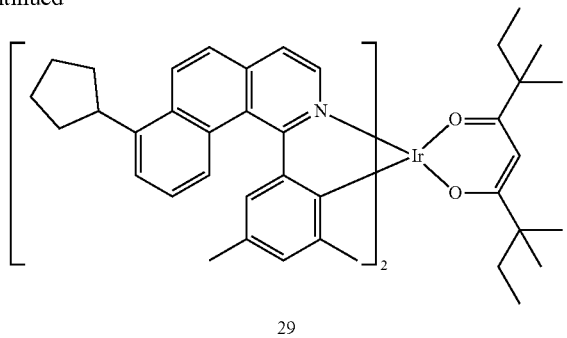

29

Intermediate L29-4, Intermediate L29-3, Intermediate L29-2, Intermediate L29-1, Intermediate L29, Intermediate L29 Dimer, and 1 g of Compound 29 (Yield: 45%) were sequentially synthesized in the same manner as in the synthesis methods of Intermediate L1-4, Intermediate L1-3, Intermediate L1-2, Intermediate L1-1, Intermediate L1, Intermediate L1 Dimer, and Compound 1 of Synthesis Example 1, respectively, except that (3-cyclopentyl-2-formylphenyl)boronic acid was used instead of (2-formyl-3-isopropylphenyl)boronic acid in the synthesis of Intermediate L1-4.

HRMS (MALDI) calcd for $C_{65}H_{71}IrN_2O_2$: m/z 1104.51

Synthesis Example 5 (Compound 31)

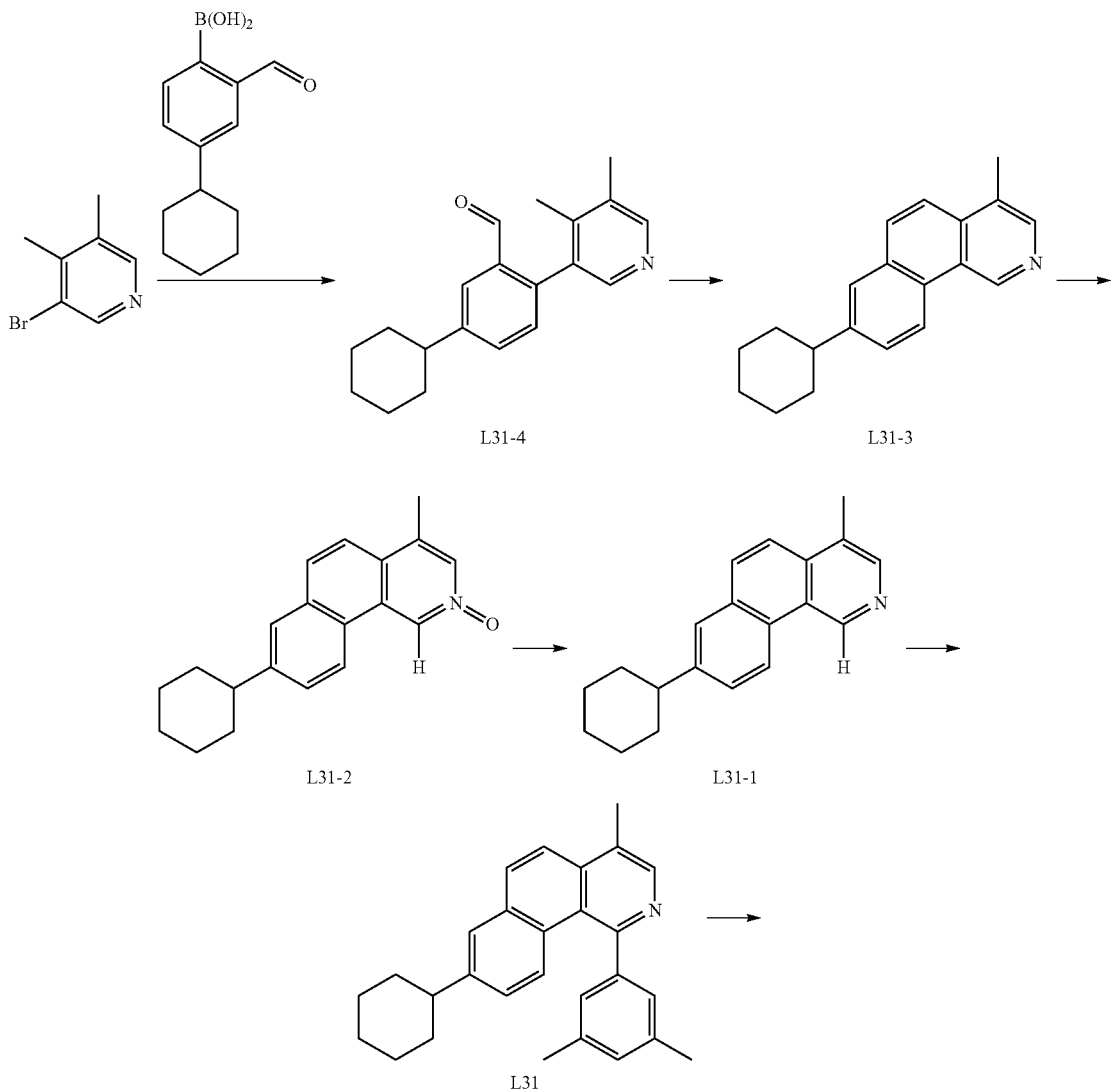

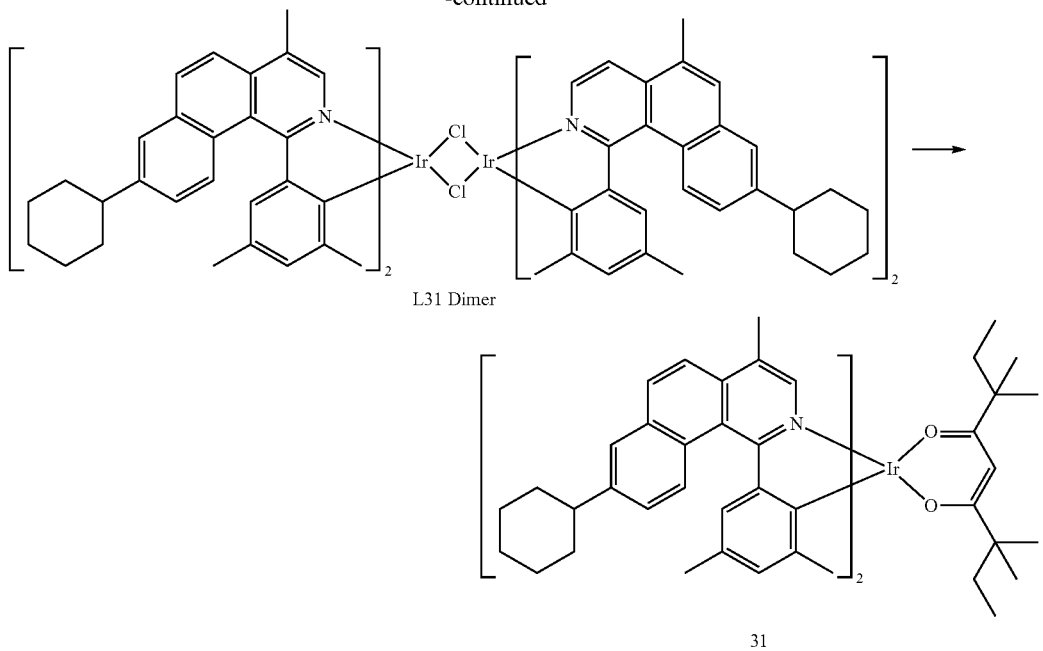

L31 Dimer

31

Intermediate L31-4, Intermediate L31-3, Intermediate L31-2, Intermediate L31-1, Intermediate L31, Intermediate L31 Dimer, and 0.8 g of Compound 31 (Yield: 48%) were sequentially synthesized in the same manner as in the synthesis methods of Intermediate L1-4, Intermediate L1-3, Intermediate L1-2, Intermediate L1-1, Intermediate L1, Intermediate L1 Dimer, and Compound 1 of Synthesis Example 1, respectively, except that 3-bromo-4,5-dimethylpyridine and (4-cyclohexyl-2-formylphenyl)boronic acid were used instead of 3-bromo-4-methylpyridine and (2-formylphenyl)boronic acid respectively in the synthesis of Intermediate L1-4.

HRMS (MALDI) calcd for $C_{69}H_{79}IrN_2O_2$: m/z 1160.58

Synthesis Example 6 (Compound 33)

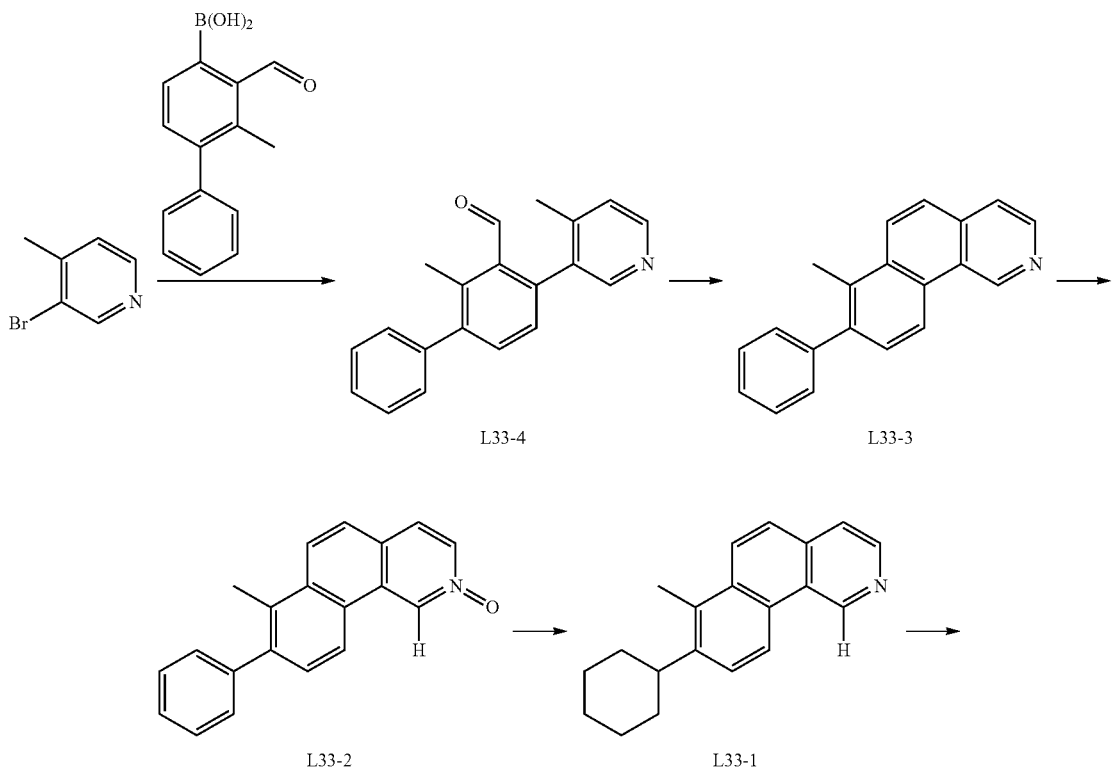

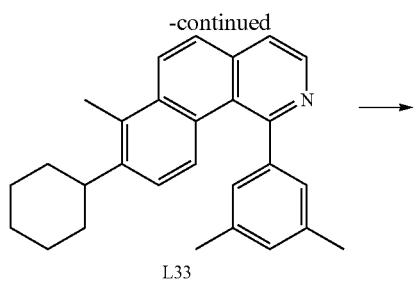

L33

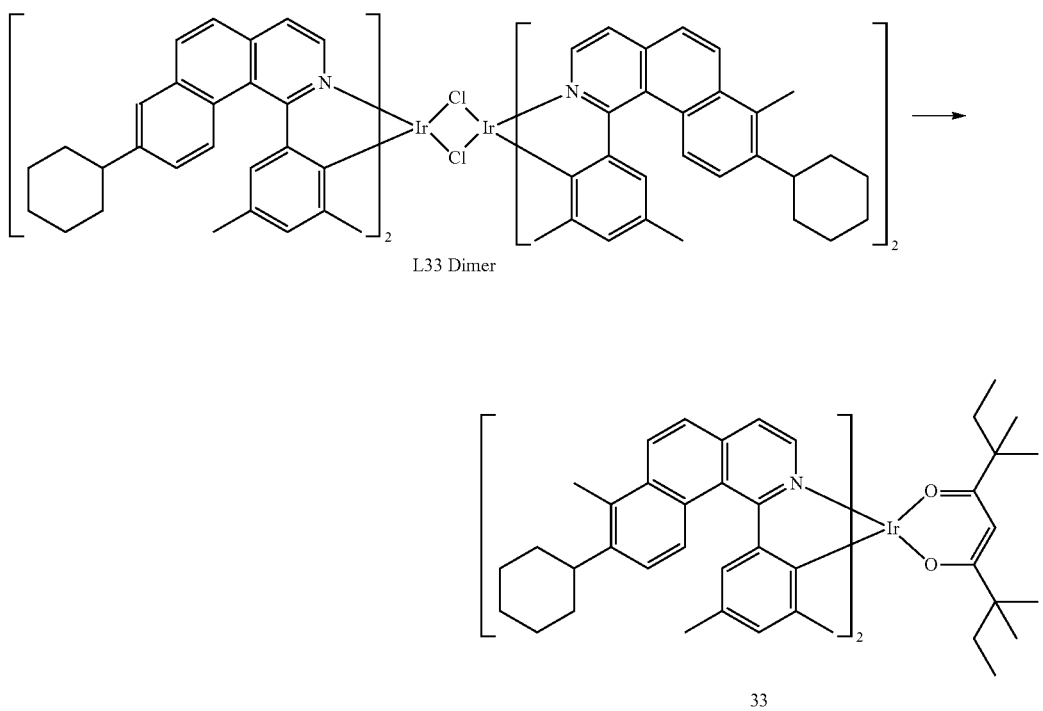

L33 Dimer

33

Intermediate L33-4, Intermediate L33-3, Intermediate L33-2, Intermediate L33-1, Intermediate L33, Intermediate L33 Dimer, and 0.6 g of Compound 33 (Yield: 46%) were sequentially synthesized in the same manner as the synthesis methods of Intermediate L1-4, Intermediate L1-3, Intermediate L1-2, Intermediate L1-1, Intermediate L1, Intermediate L1 Dimer, and Compound 1 of Synthesis Example 1, respectively, except that (3-formyl-2-methyl-[1,1'-biphenyl]-4-yl)boronic acid was used instead of (2-formylphenyl) boronic acid in the synthesis of Intermediate L1-4.

HRMS (MALDI) calcd for $C_{69}H_{67}IrN_2O_2$: m/z 1148.48

Example 1

A glass substrate with an ITO pattern thereon as an anode was cut to a size of 50 mm×50 mm×0.5 mm, ultrasonicated using isopropyl alcohol and pure water for 5 minutes each, and then irradiated with ultraviolet light for 30 minutes and exposed to ozone for cleaning. Then, the resultant glass substrate was loaded onto a vacuum deposition apparatus.

Compound HT3 and F6-TCNNQ were co-deposited under vacuum in a weight ratio of 98:2 on the ITO anode to form a hole injection layer having a thickness of 100 Å, Compound HT3 was vacuum-deposited on the hole injection layer to form a hole transport layer having a thickness of 1,350 Å, and then Compound HT21 was vacuum-deposited on the hole transport layer to form an electron blocking layer having a thickness of 300 Å.

Subsequently, Compound H52 (host) and Compound 1 (dopant) were co-deposited in a weight ratio of 98:2 on the electron blocking layer to form an emission layer having a thickness of 400 Å.

Then, Compound ET3 and ET-D1 were co-deposited in a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby manufacturing an organic light-emitting device having a structure of ITO (1500 Å)/HT3+F6-TCNNQ (2 wt %) (100 Å)/HT3 (1350 Å)/HT21 (300 Å)/H52+Compound 1 (2 wt %) (400 Å)/ET3+ET-D1 (50%) (350 Å)/ET-D1 (10 Å)/Al (1000 Å).

HT3

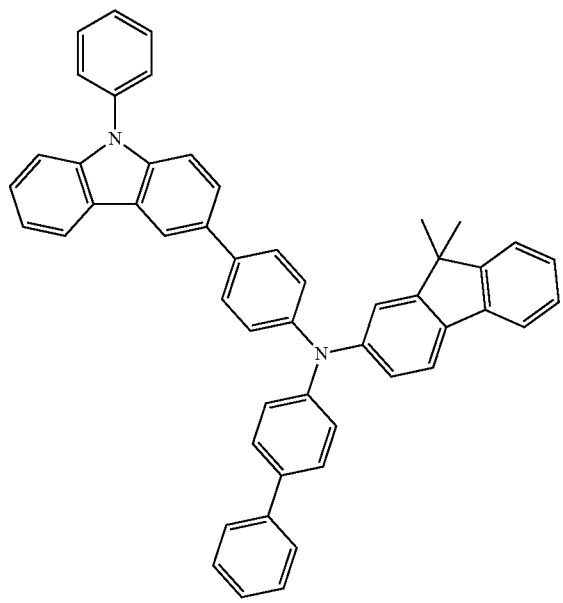

F6-TCNNQ

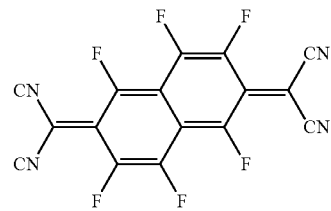

HT21

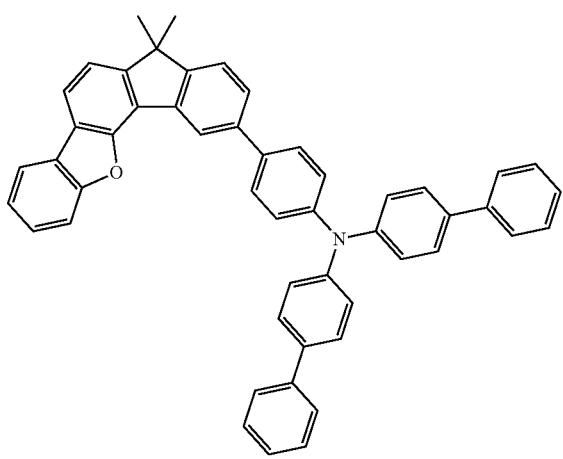

-continued

H52

ET3

ET-D1

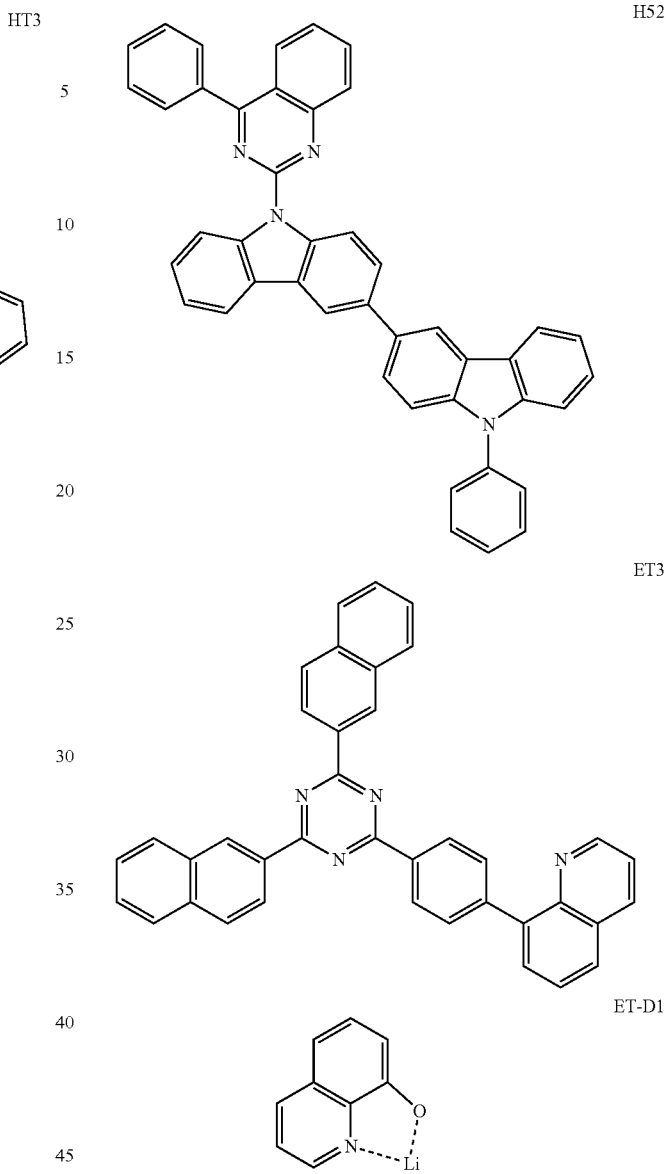

Examples 2 to 5 and Comparative Examples A and B

Organic light-emitting devices were manufactured in the same manner as in Example 1, except that compounds shown in Table 1 were used, respectively, instead of Compound 1, as a dopant in forming an emission layer.

Evaluation Example 1: Characteristics Evaluation of Organic Light-Emitting Devices The driving voltage, current density, maximum external quantum efficiency (Max EQE), the full width at half maximum (FWHM) of the maximum emission peak (peak emission wavelength, λmax) in electroluminescence (EL) spectra, and lifetime ($LT_{97}$) of each of the organic light-emitting devices manufactured in Examples 1 to 5 and Comparative Examples A and B were evaluated. The results are shown in Tables 1 and 2. This evaluation was performed using a current-voltage meter (Keithley 2400) and a luminescence meter (Minolta Cs-1,000A), and the lifetime (LT$_{97}$) (at 3500 nit) was evaluated as the time (hr) it took until the luminance was reduced to 97% with respect to 100% of the initial luminance and represented as a relative value (%).

TABLE 1

| | Dopant compound No. in emission layer | Driving voltage (V) | Current density (mA/cm²) | Max EQE (%) | FWHM (nm) |
|---|---|---|---|---|---|
| Example 1 | 1 | 4.2 | 10 | 29 | 49 |
| Example 2 | 5 | 4.2 | 10 | 30 | 50 |
| Example 3 | 11 | 4.1 | 10 | 28 | 48 |
| Example 4 | 29 | 4.0 | 10 | 29 | 51 |
| Example 5 | 33 | 4.2 | 10 | 30 | 49 |
| Comparative Example A | A | 4.5 | 10 | 25 | 76 |
| Comparative Example B | B | 4.2 | 10 | 24 | 58 |

TABLE 2

| | Dopant compound No. in emission layer | $\lambda_{max}$ (nm) | Lifetime (LT$_{97}$) (relative value) (%) |
|---|---|---|---|
| Example 1 | 1 | 623 | 120 |
| Example 2 | 5 | 624 | 130 |
| Example 3 | 11 | 621 | 110 |
| Example 4 | 29 | 623 | 120 |
| Example 5 | 33 | 626 | 120 |
| Comparative Example A | A | 614 | 90 |
| Comparative Example B | B | 624 | 100 |

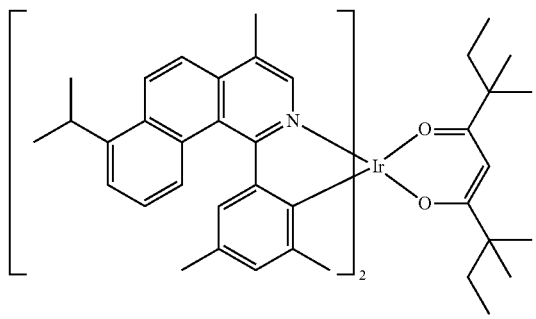

11

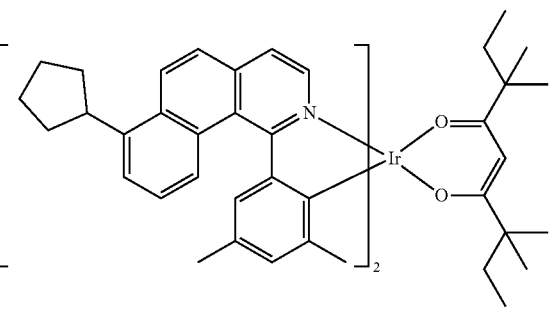

29

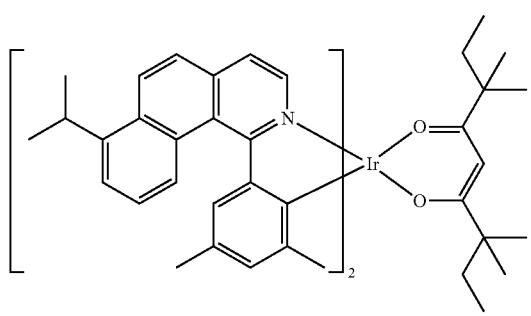

1

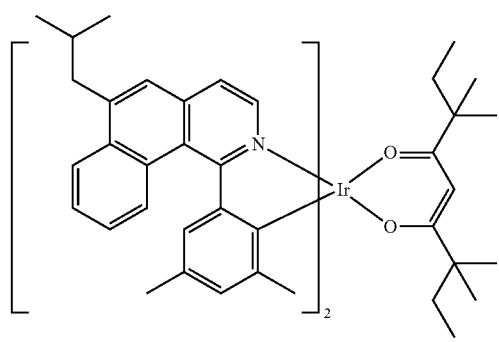

5

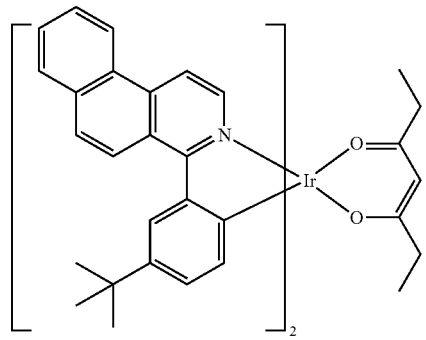

A

-continued

33

-continued

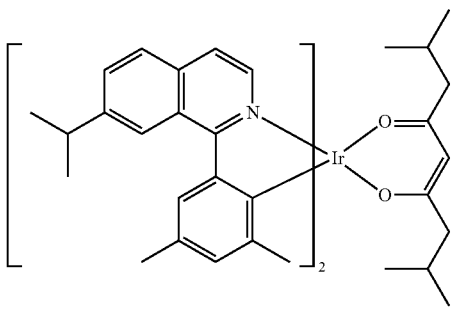

B

Referring to Tables 1 and 2, it is found that the light emitted from the organic light-emitting devices of Examples 1 to 5 had a relatively small FWHM compared to that of the organic light-emitting device of Comparative Examples A and B, and thus may have a higher color purity than that of the organic light-emitting devices of Comparative examples A and B. It is also confirmed that the organic light-emitting devices of Examples 1 to 5 have an improved driving voltage, an improved external quantum efficiency, and improved lifetime characteristics, as compared with the organic light-emitting devices of Comparative Examples A and B.

As described above, according to the one or more embodiments, the organometallic compound represented by Formula 1 may have excellent external quantum efficiency and horizontal orientation ratio, and thus an emission peak in the electroluminescence (EL) spectrum of an organic light-emitting device using the organometallic compound may have a relatively narrow small full width at half maximum (FWHM), and the organic light-emitting device including the organometallic compound may have excellent external quantum efficiency and lifetime characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

<Formula 1>

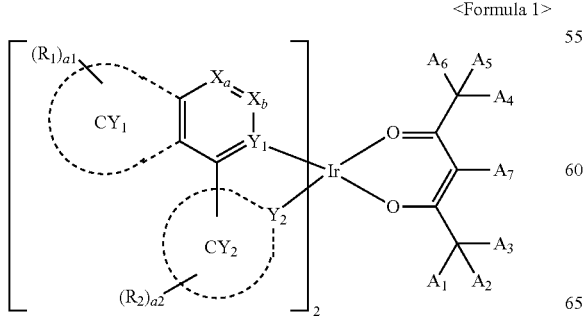

wherein, in Formula 1, $Y_1$ is N, $Y_2$ is C, and ring $CY_1$ is a group represented by Formula 1-1 or 1-2, 1-1

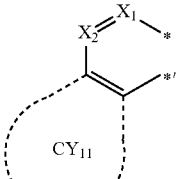

1-2

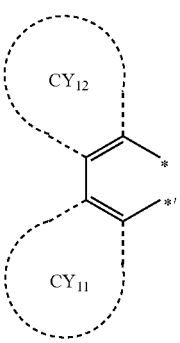

in Formulae 1, 1-1 and 1-2, ring $CY_2$, ring $CY_{11}$ and ring $CY_{12}$ are each independently a $C_5$-$C_{30}$ carbocyclic group or a $C_1$-$C_{30}$ heterocyclic group,
in Formula 1, $X_a$ is N or $C(T_a)$, and $X_b$ is N or $C(T_b)$,
in Formula 1-1, $X_1$ is N or $C(R_{11})$, and $X_2$ is N or $C(R_{12})$,
in Formulae 1-1 and 1-2, * and *' are condensation sites to the adjacent 6-membered ring of Formula 1,
a group represented by

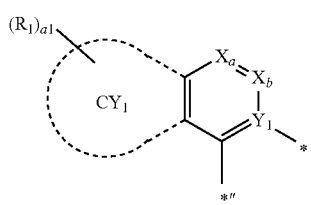

is a group represented by one of Formulae 3-1 to 3-36 and 3-38 to 3-48:

3-1

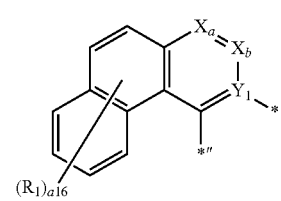

3-2

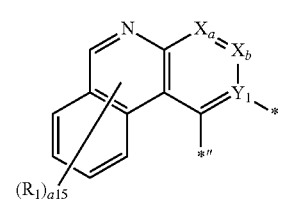

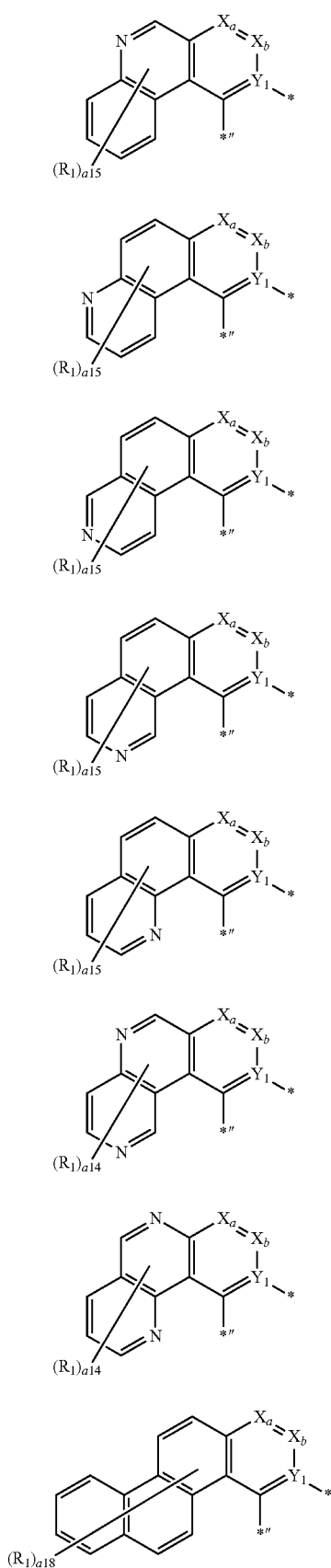

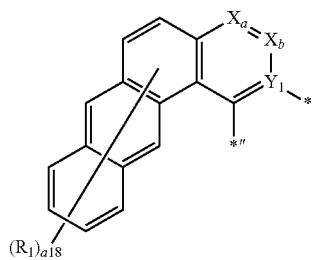
3-19
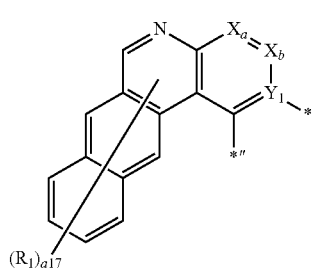
3-20
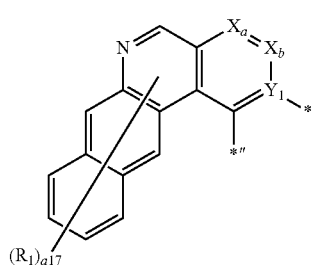
3-21
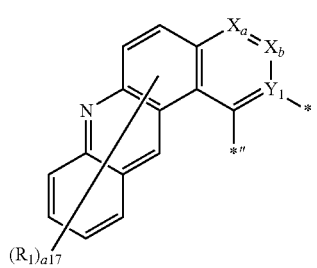
3-22
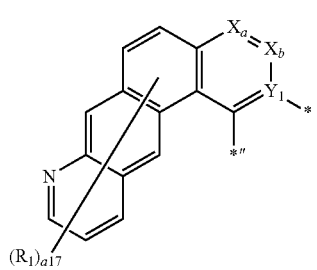
3-23
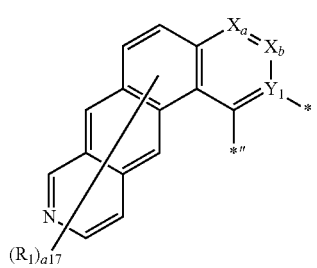
3-24
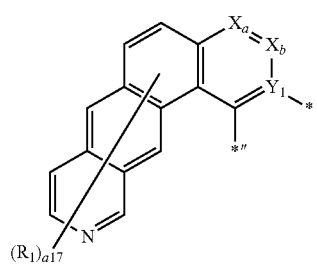
3-25
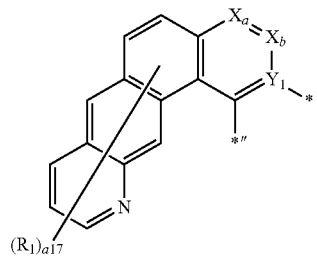
3-26
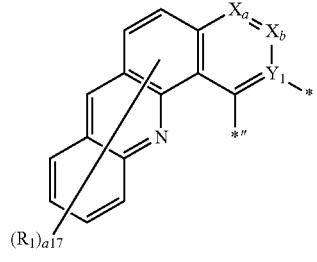
3-27
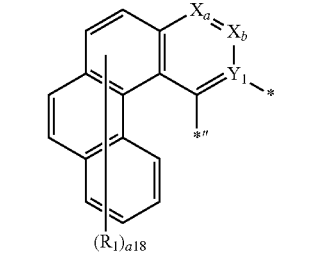
3-28
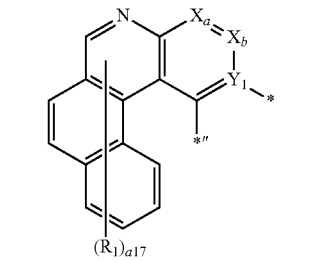
3-29
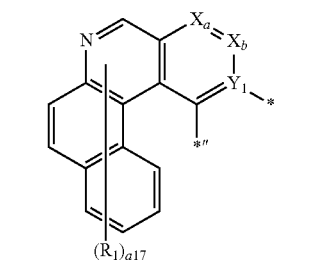
3-30

3-31
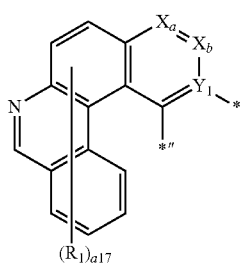
3-32
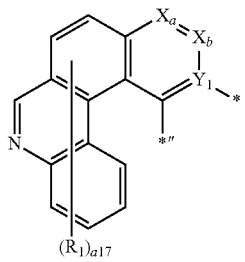
3-33
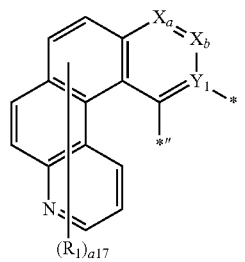
3-34
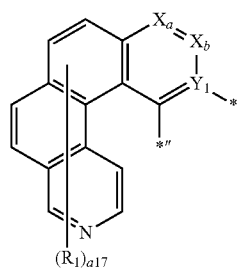
3-35
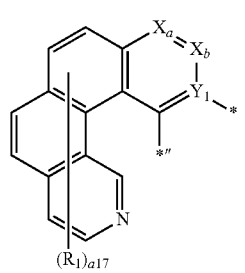
3-36
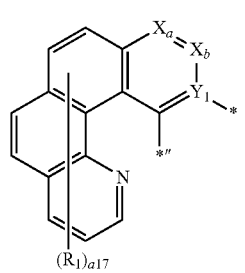
3-38
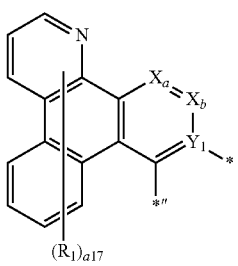
3-39
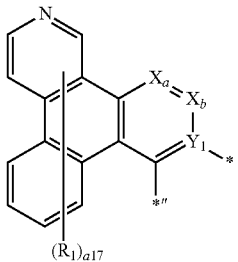
3-40
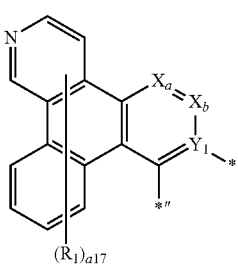
3-41
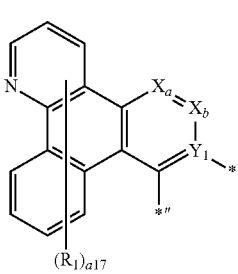
3-42
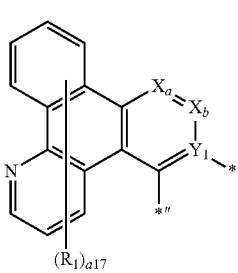
3-43
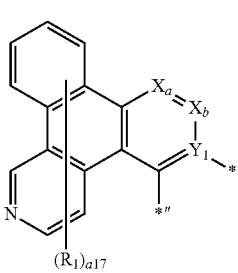

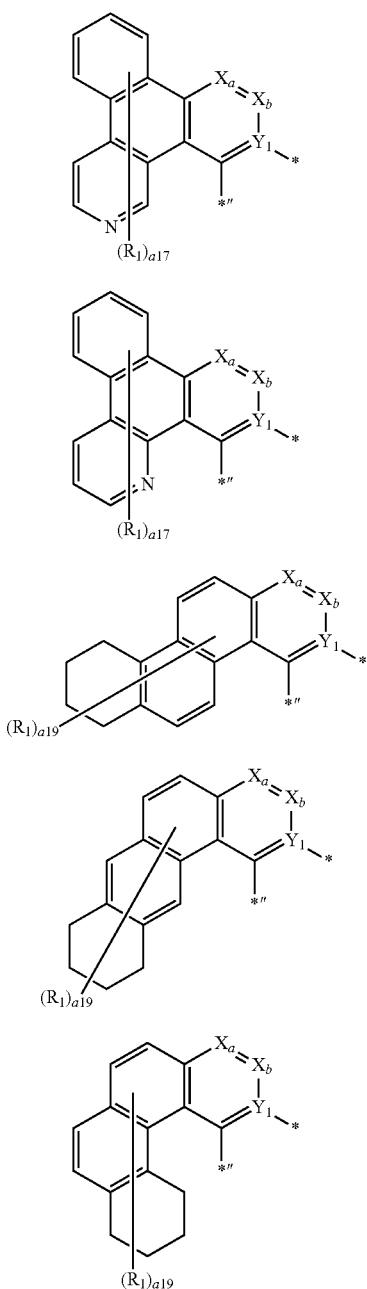

wherein, in Formulae 3-1 to 3-36 and 3-38 to 3-48,
$X_a$ is $C(T_a)$, and $X_b$ is $C(T_b)$, or $X_a$ is N and $X_b$ is N,
a19 is an integer of 0 to 12,
a18 is an integer of 0 to 8,
a17 is an integer of 0 to 7,
a16 is an integer of 0 to 6,
a15 is an integer of 0 to 5,
a14 is an integer of 0 to 4,
* is a binding site to Ir in Formula 1, and
*" is a binding site to an adjacent atom in Formula 1,
in Formulae 1, $R_1$, $R_2$, $T_a$, $T_b$, and $A_1$ to $A_7$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), $R_{11}$ and $R_{12}$ are the same as defined above in connection with $R_1$, a1 is an integer of 1 to 20, and when a1 is 2 or greater, two or more of $R_1$(s) are identical to or different from each other, a2 is an integer of 0 to 20, and when a2 is 2 or greater, two or more of $R_2$(s) are identical to or different from each other, at least one of $R_1$(s) in number of a1 is a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, or a substituted or unsubstituted monovalent non-aromatic condensed polycyclic group, two or more of $R_1$(s) in number of a1 are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $R_2$(s) in number of a2 are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, $R_1$ and $R_2$ are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, two or more of $A_1$ to $A_7$ are optionally linked to each other to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, $R_{1a}$ is the same as defined in connection with $A_7$, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group or a C$_1$-C$_{60}$ alkoxy group;

a C$_1$-C$_{60}$ alkyl group, a C$_2$-C$_{60}$ alkenyl group, a C$_2$-C$_{60}$ alkynyl group, or a C$_1$-C$_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_1$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —Ge(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or any combination thereof;

a C$_3$-C$_{10}$ cycloalkyl group, a C$_1$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), —P(=O)(Q$_{28}$)(Q$_{29}$), —P(Q$_{28}$)(Q$_{29}$), or any combination thereof;

—N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$); or any combination thereof, and Q$_1$ to Q$_9$, Q$_{11}$ to Q$_{19}$, Q$_{21}$ to Q$_{29}$, and Q$_{31}$ to Q$_{39}$ are each independently hydrogen;

deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a C$_1$-C$_{60}$ alkyl group unsubstituted or substituted with deuterium, a C$_1$-C$_{60}$ alkyl group, a C$_6$-C$_{60}$ aryl group, or any combination thereof; a C$_2$-C$_{60}$ alkenyl group; a C$_2$-C$_{60}$ alkynyl group; a C$_1$-C$_{60}$ alkoxy group; a C$_3$-C$_{10}$ cycloalkyl group; a C$_1$-C$_{10}$ heterocycloalkyl group; a C$_3$-C$_{10}$ cycloalkenyl group; a C$_2$-C$_{10}$ heterocycloalkenyl group; a C$_6$-C$_{60}$ aryl group unsubstituted or substituted with deuterium, a C$_1$-C$_{60}$ alkyl group, a C$_6$-C$_{60}$ aryl group, or any combination thereof; a C$_6$-C$_{60}$ aryloxy group; a C$_6$-C$_{60}$ arylthio group; a C$_1$-C$_{60}$ heteroaryl group; a monovalent non-aromatic condensed polycyclic group; or a monovalent non-aromatic condensed heteropolycyclic group.

2. The organometallic compound of claim 1, wherein, in Formula 1, ring CY$_2$ is a benzene group, a naphthalene group, a 1,2,3,4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group, and in Formulae 1-1 and 1-2, ring CY$_{11}$ and ring CY$_{12}$ are each independently a benzene group, a naphthalene group, a 1,2,3,4-tetrahydronaphthalene group, a pyridine group, a pyrimidine group, a quinoline group, an isoquinoline group, a quinazoline group, or a quinoxaline group.

3. The organometallic compound of claim 1, wherein R$_1$, R$_2$, T$_a$, T$_b$, and A$_1$ to A$_7$ are each independently hydrogen, deuterium, a substituted or unsubstituted C$_1$-C$_{20}$ alkyl group, a substituted or unsubstituted C$_3$-C$_{10}$ cycloalkyl group, a substituted or unsubstituted phenyl group, —Si(Q$_3$)(Q$_4$)(Q$_5$), or —Ge(Q$_3$)(Q$_4$)(Q$_5$).

4. The organometallic compound of claim 1, wherein R$_1$, R$_2$, T$_a$, T$_b$, and A$_1$ to A$_7$ are each independently:

hydrogen or deuterium;

a C$_1$-C$_{30}$ alkyl group, a C$_3$-C$_{10}$ cycloalkyl group, or a phenyl group, each unsubstituted or substituted with deuterium, a C$_1$-C$_{30}$ alkyl group, a deuterated C$_1$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, a biphenyl group, or any combination thereof; or —Si(Q$_3$)(Q$_4$)(Q$_5$), or —Ge(Q$_3$)(Q$_4$)(Q$_5$).

5. The organometallic compound of claim 1, wherein, in Formula 1, at least one of R$_1$(s) in number of a1 is a group having three or more carbons.

6. The organometallic compound of claim 1, wherein, in Formula 1, at least one of R$_1$(s) in number of a1 is a C$_1$-C$_{30}$ alkyl group, a C$_3$-C$_{10}$ cycloalkyl group, or a phenyl group, each unsubstituted or substituted with deuterium, a C$_1$-C$_{30}$ alkyl group, a deuterated C$_1$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, a biphenyl group, or any combination thereof.

7. The organometallic compound of claim 1, wherein, in Formula 1, at least one of R$_1$(s) in number of a1 is a group represented by Formula 2:

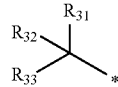

wherein, in Formula 2, $R_{31}$ to $R_{33}$ are each independently hydrogen, deuterium, a $C_1$-$C_{30}$ alkyl group, a deuterated $C_1$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, or a biphenyl group; and * is a binding site to an adjacent atom.

8. The organometallic compound of claim 7, wherein the group represented by Formula 2 satisfies at least one of <Condition A> and <Condition B>:

<Condition A> in Formula 2, two or more of $R_{31}$ to $R_{33}$ are each independently a $C_1$-$C_{30}$ alkyl group, a deuterated $C_1$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, or a biphenyl group; and <Condition B> in Formula 2, one or more of $R_{31}$ to $R_{33}$ are each independently a $C_2$-$C_{30}$ alkyl group, a deuterated $C_2$-$C_{30}$ alkyl group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a phenyl group, a deuterated phenyl group, a ($C_1$-$C_{20}$ alkyl)phenyl group, or a biphenyl group.

9. The organometallic compound of claim 1, wherein, in Formula 1, the number of carbons in a group represented by *—$C(A_1)(A_2)(A_3)$ is 5 or greater, and the number of carbons in a group represented by *—$C(A_4)(A_5)(A_6)$ is 5 or greater.

10. The organometallic compound of claim 1, wherein the organometallic compound satisfies at least one of <Condition 1> to <Condition 3>:

<Condition 1>

$A_1$ to $A_6$ in Formula 1 are each independently a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group;

<Condition 2> at least one of $A_1$ to $A_6$ in Formula 1 is a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group; and <Condition 3>

$A_7$ in Formula 1 is a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

11. The organometallic compound of claim 1, wherein the organometallic compound satisfies at least one of <Condition 4> and <Condition 5>:

<Condition 4> in Formula 1, two or more of $A_1$ to $A_3$ of the group represented by *—$C(A_1)(A_2)(A_3)$ are linked with C in the group represented by *—$C(A_1)(A_2)(A_3)$ to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$; and <Condition 5>

In Formula 1, two or more of $A_4$ to $A_6$ of the group represented by *—$C(A_4)(A_5)(A_6)$ are linked with C in the group represented by *—$C(A_4)(A_5)(A_6)$ to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$.

12. The organometallic compound of claim 1, wherein, in Formula 1, a group represented by

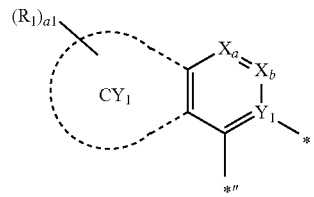

is a group represented by one of Formulae 4-1 to 4-60 and 4-97 to 4-126:

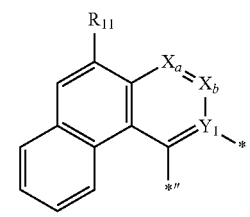

4-1

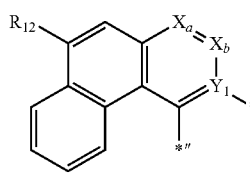

4-2

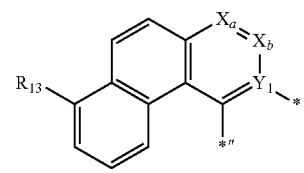

4-3

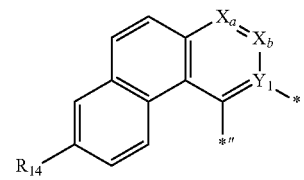

4-4

175
-continued
4-5
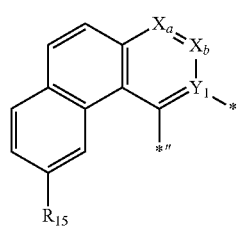
4-6
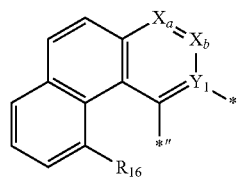
4-7
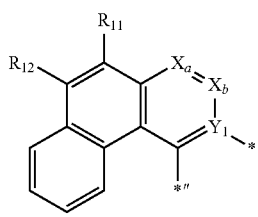
4-8
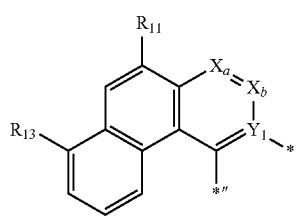
4-9
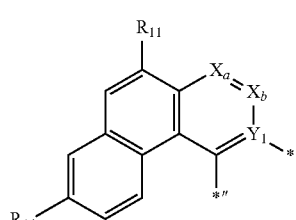
4-10
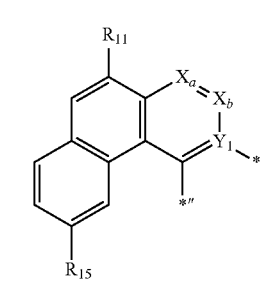
4-11
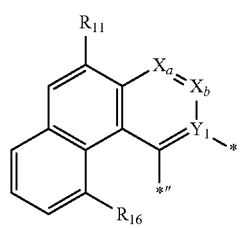
176
-continued
4-12
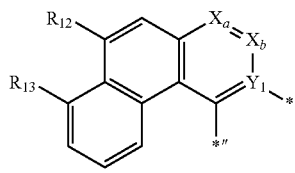
4-13
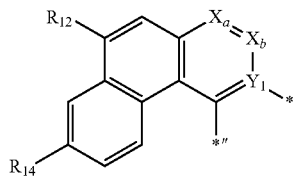
4-14
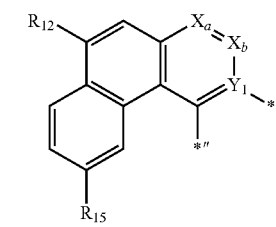
4-15
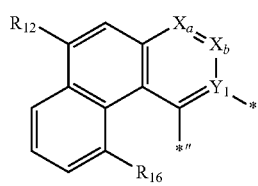
4-16
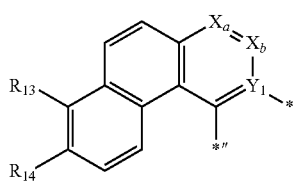
4-17
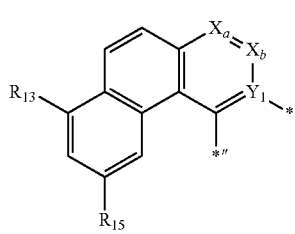
4-18
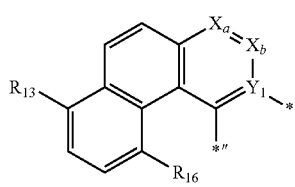
4-19

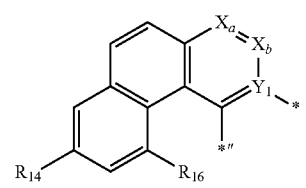
4-20
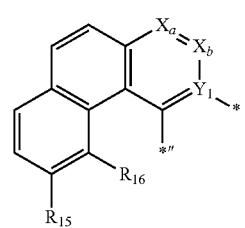
4-21
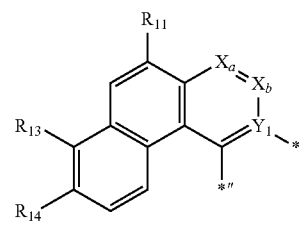
4-22
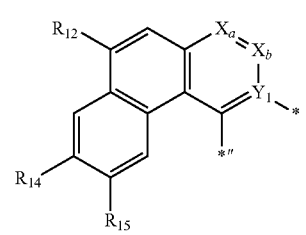
4-23
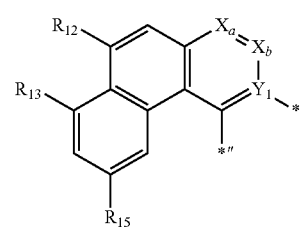
4-24
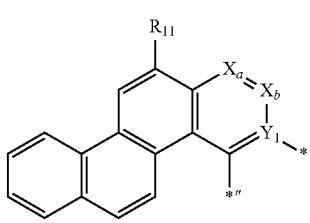
4-25
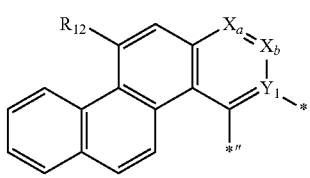
4-26
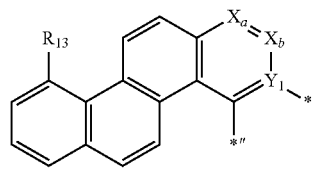
4-27
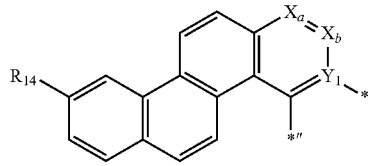
4-28
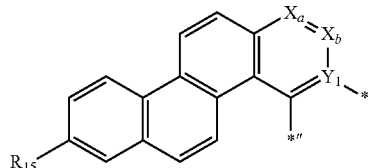
4-29
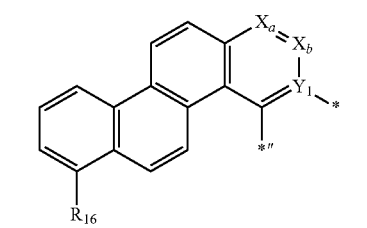
4-30
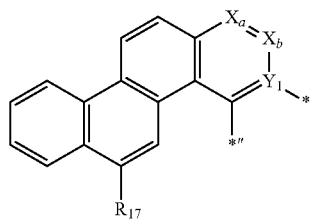
R-31
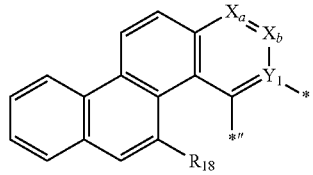
R-32
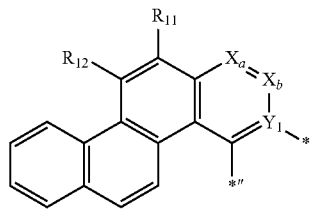
R-33
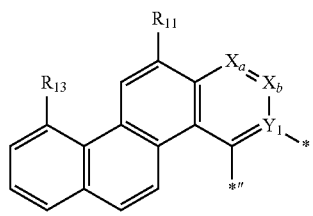
R-34

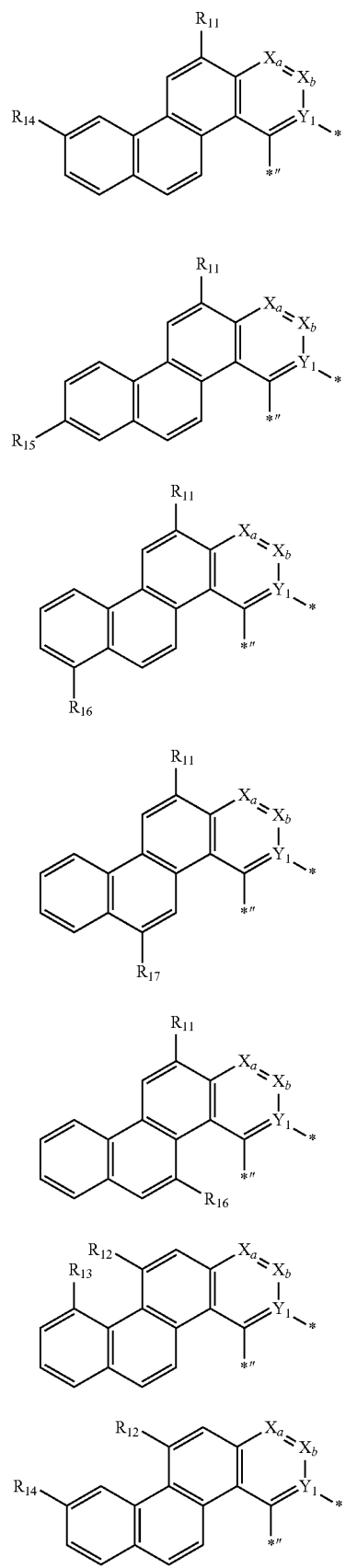
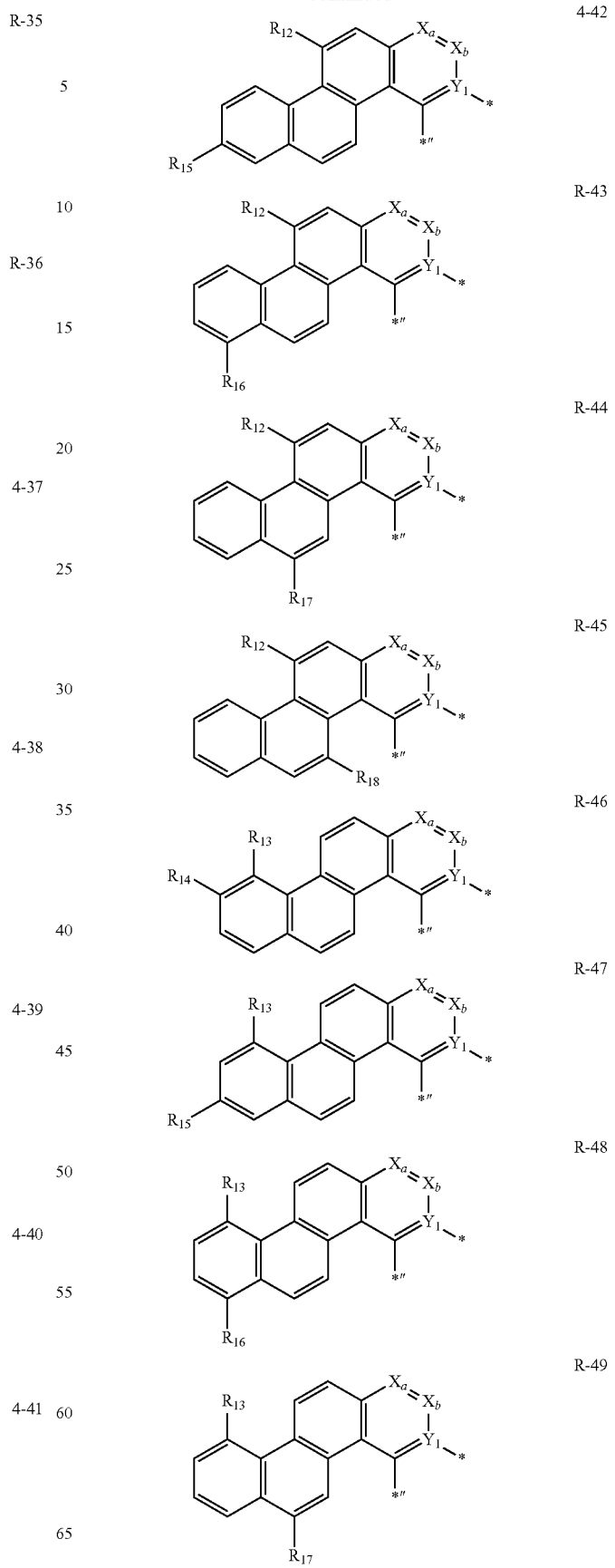

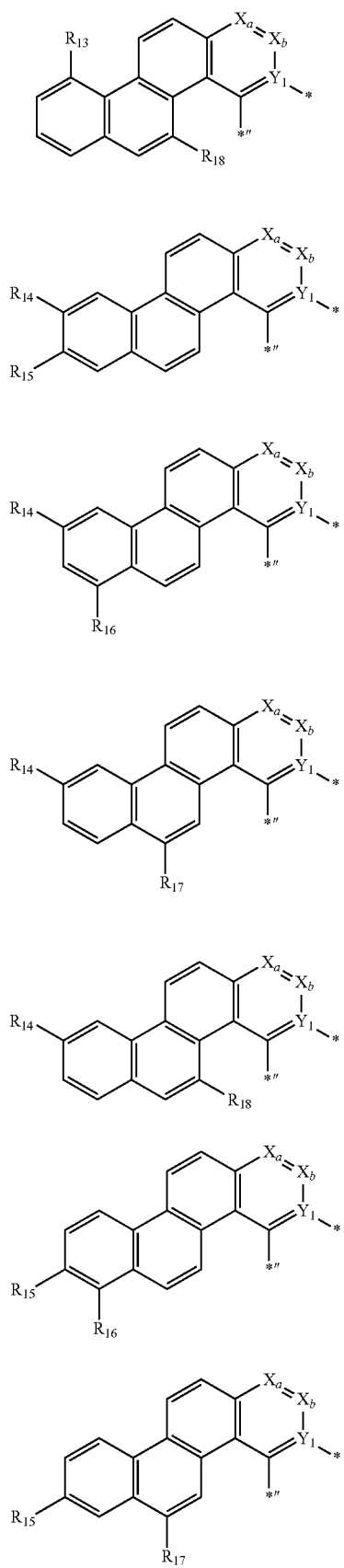
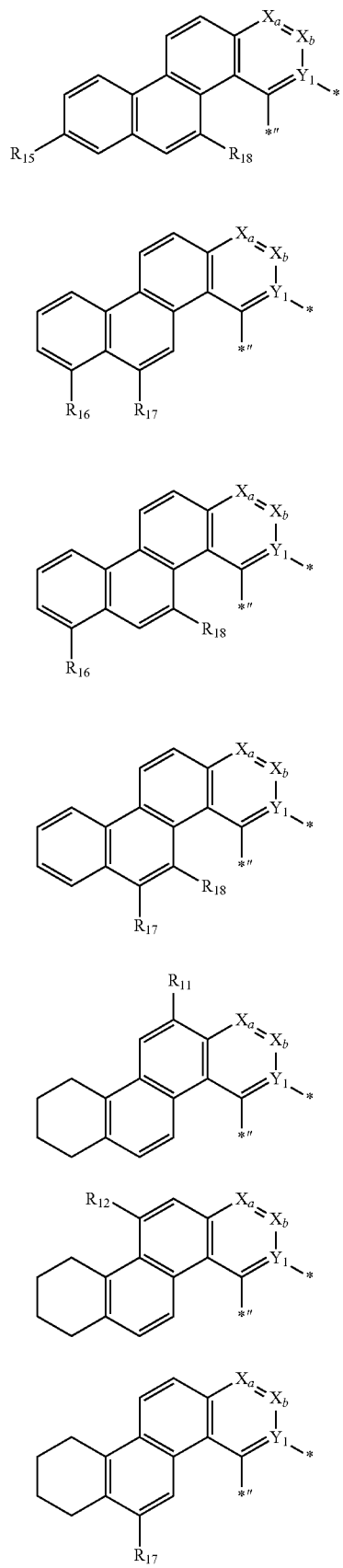

4-100 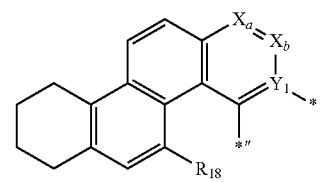
4-101 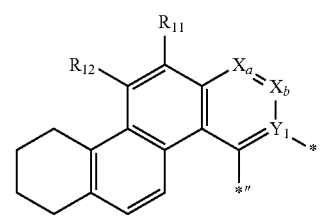
4-102 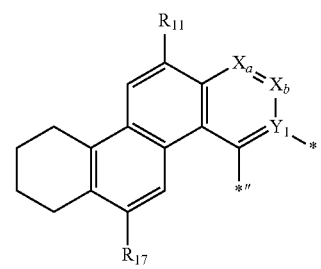
4-103 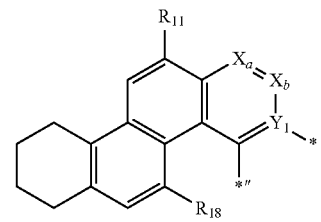
4-104 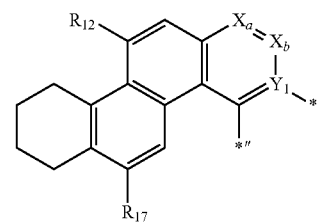
R-105 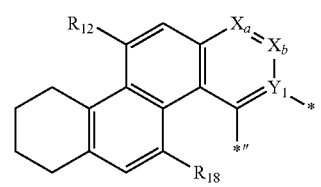
R-106 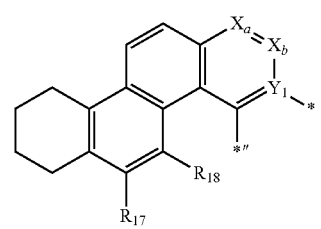
R-107 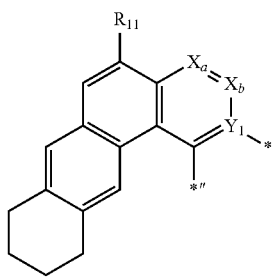
R-108 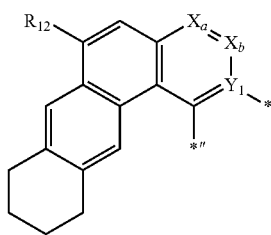
R-109 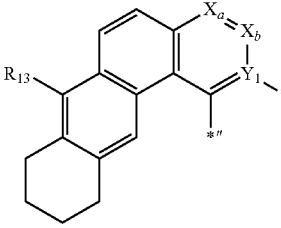
R-110 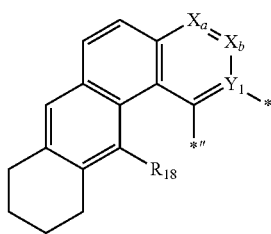
R-111 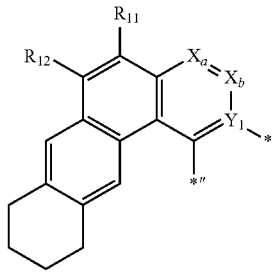
4-112 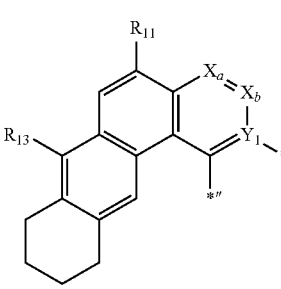

185
-continued
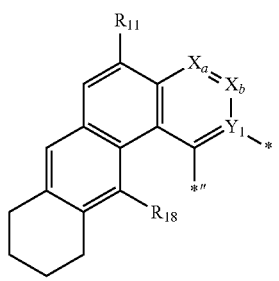
4-113
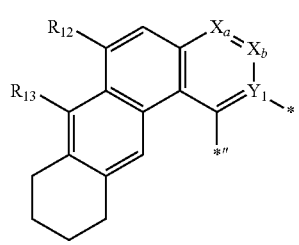
4-114
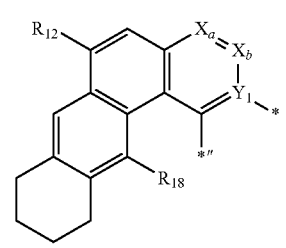
4-115
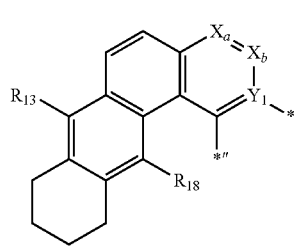
4-116
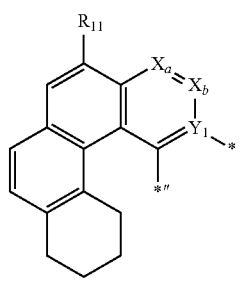
4-117
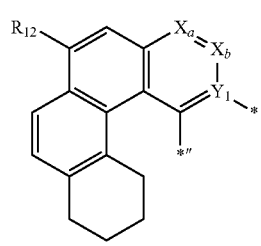
4-118
186
-continued
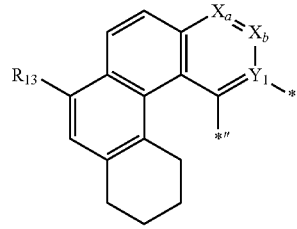
4-119
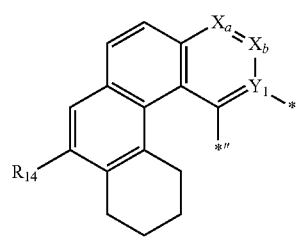
4-120
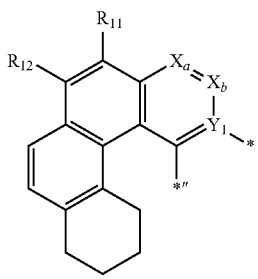
4-121
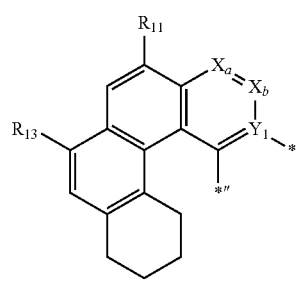
4-122
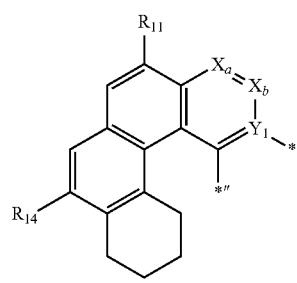
4-123
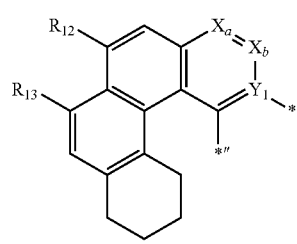
4-124

-continued 4-125

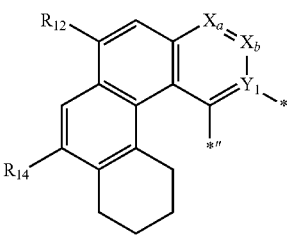

4-126

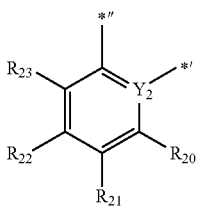

wherein, in Formulae 4-1 to 4-126, $Y_1$, $X_a$, and $X_b$ are the same as defined in claim 1, $R_{11}$ to $R_{18}$ are each independently a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, or a substituted or unsubstituted monovalent non-aromatic condensed polycyclic group,

* is a binding site to Ir in Formula 1, and

*‴ is a binding site to an adjacent atom in Formula 1.

13. The organometallic compound of claim 1, wherein, in Formula 1, a group represented by

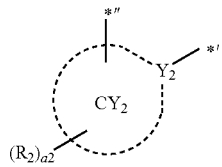

is a group represented by one of Formulae $CY_2$-1 to $CY_2$-7:

CY2-1

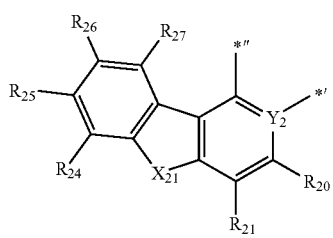

-continued

CY2-2

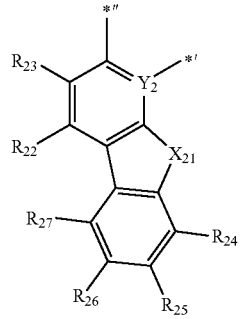

CY2-3

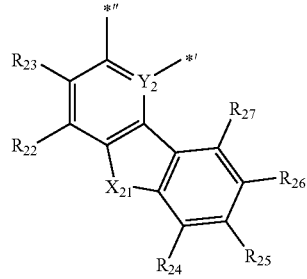

CY2-4

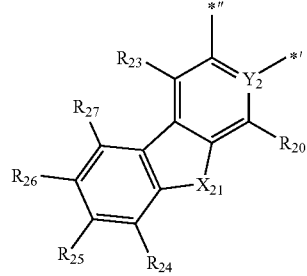

2-5

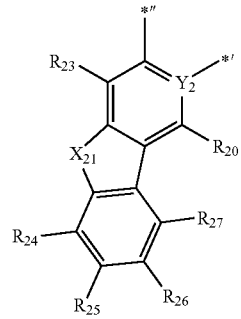

CY2-6

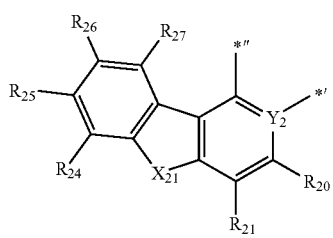

-continued

CY2-7

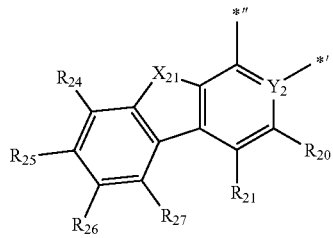

wherein, in Formulae CY$_1$-1 to CY$_2$-7,

Y$_2$ is C,

X$_{21}$ is O, S, N(R$_{28}$), C(R$_{28}$)(R$_{29}$), or Si(R$_{28}$)(R$_{29}$),

R$_{20}$ to R$_{29}$ are the same as defined in connection with R$_2$ in claim 1,

*' is a binding site to Ir in Formula 1, and

*'' is a binding site to an adjacent atom in Formula 1.

14. The organometallic compound of claim 13, wherein, in Formula CY$_2$-1, R$_{20}$ and R$_{22}$ are each independently a C$_1$-C$_{30}$ alkyl group, a C$_3$-C$_{10}$ cycloalkyl group, or a phenyl group, each unsubstituted or substituted with deuterium, a C$_1$-C$_{30}$ alkyl group, a deuterated C$_1$-C$_{30}$ alkyl group, a C$_3$-C$_{10}$ cycloalkyl group, a deuterated C$_3$-C$_{10}$ cycloalkyl group, a (C$_1$-C$_{20}$ alkyl)C$_3$-C$_{10}$ cycloalkyl group, a phenyl group, a deuterated phenyl group, a (C$_1$-C$_{20}$ alkyl)phenyl group, a biphenyl group, or any combination thereof.

15. The organometallic compound of claim 1, wherein the organometallic compound is at least one of Compounds 1 to 48:

1

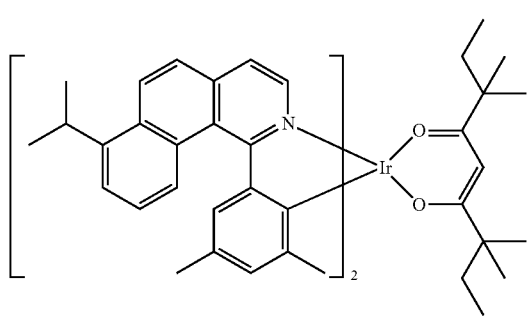

2

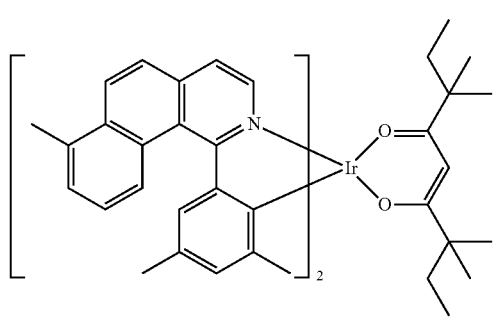

3

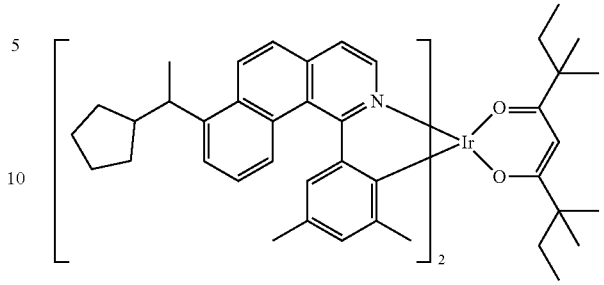

4

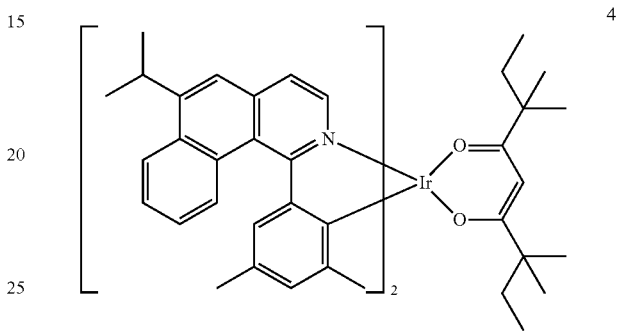

5

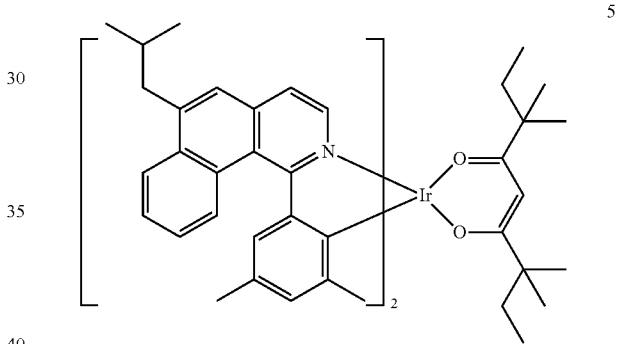

6

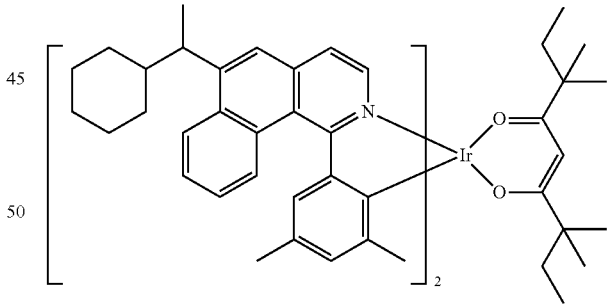

7

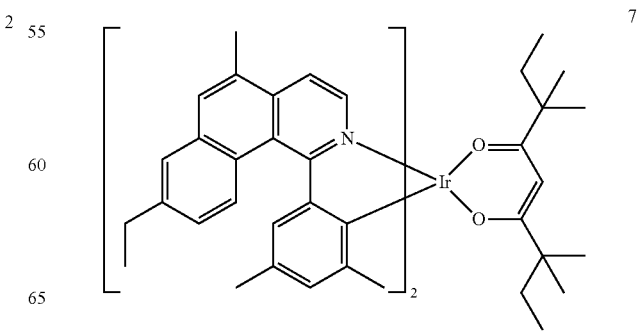

8
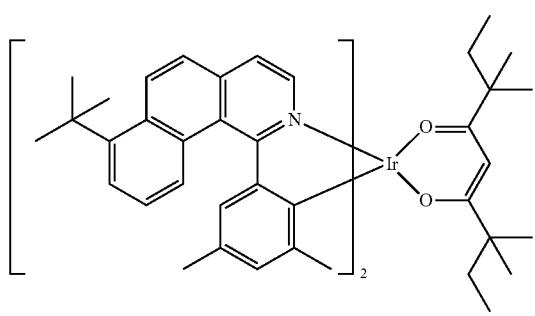
9
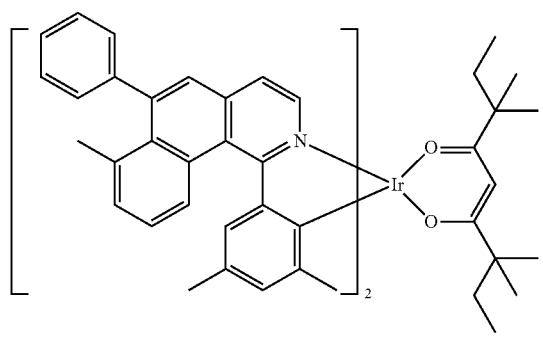
10
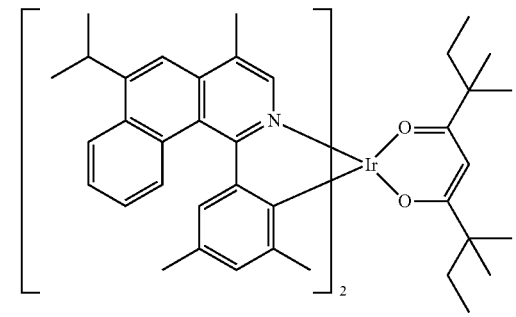
11
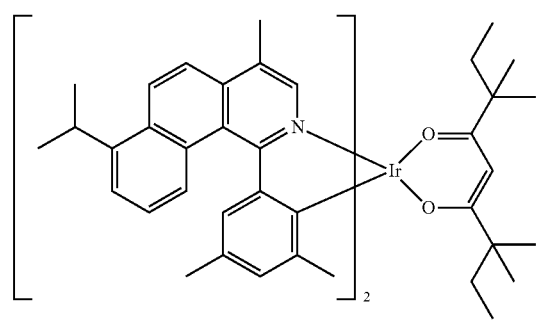
12
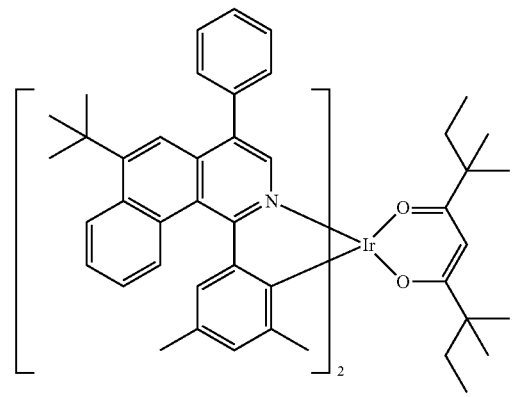
13
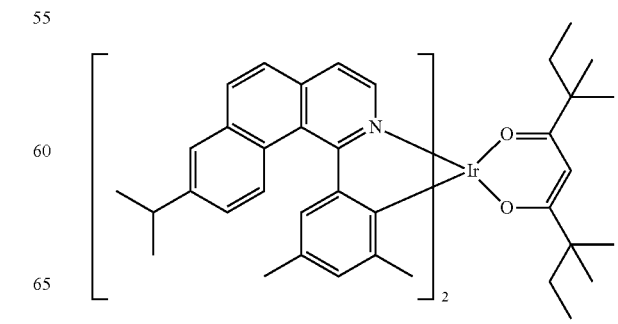
14
15

16
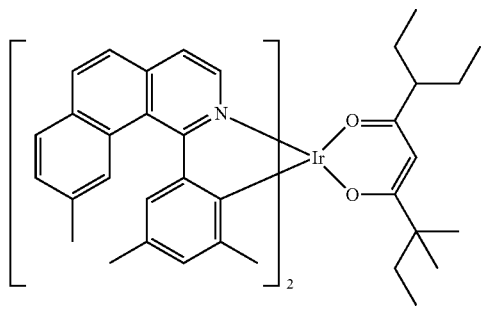
20
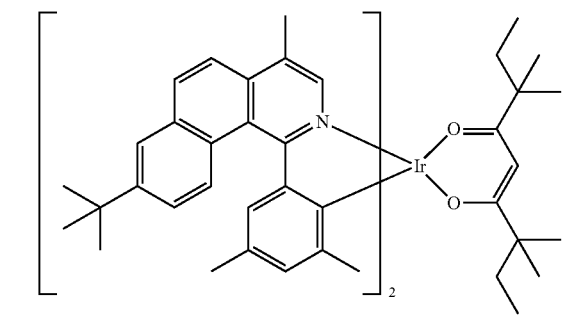
17
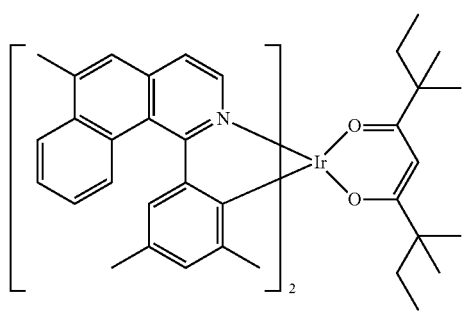
21
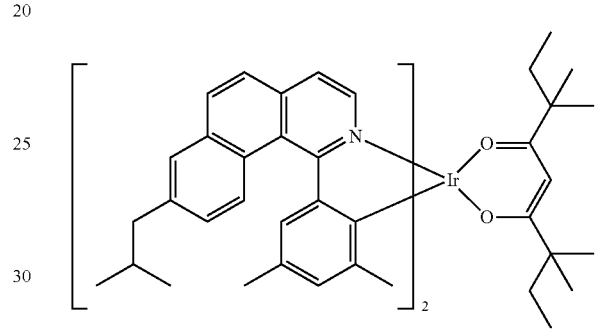
18
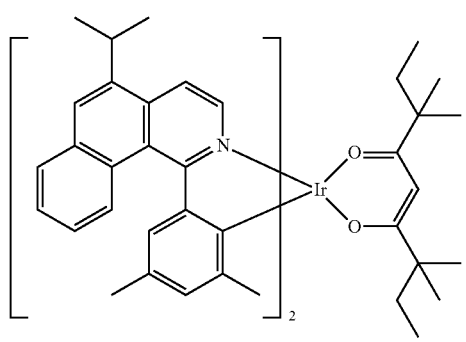
22
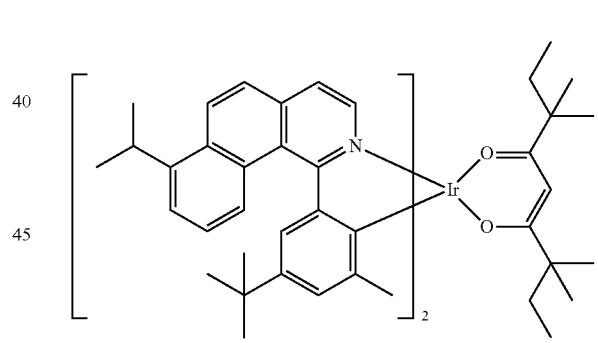
19
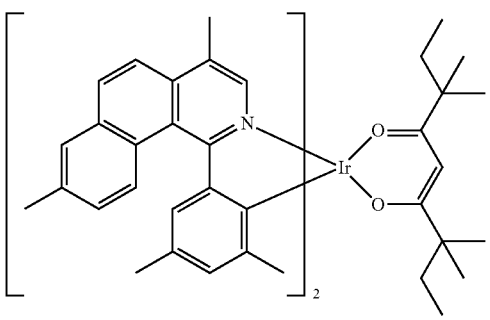
23
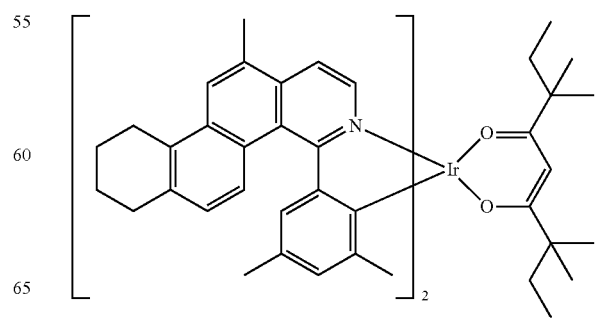

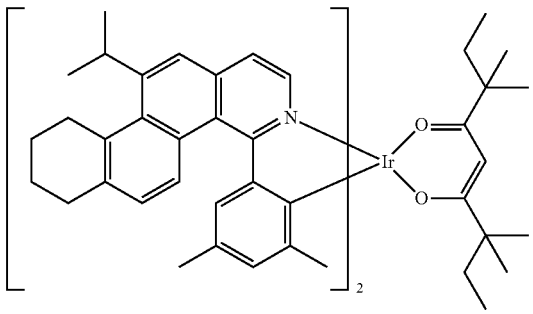
24
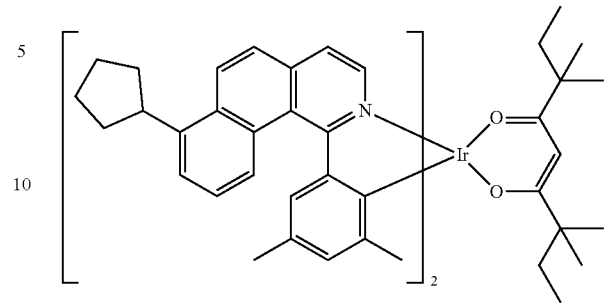
29
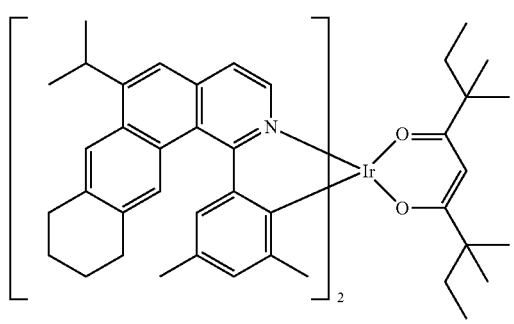
25
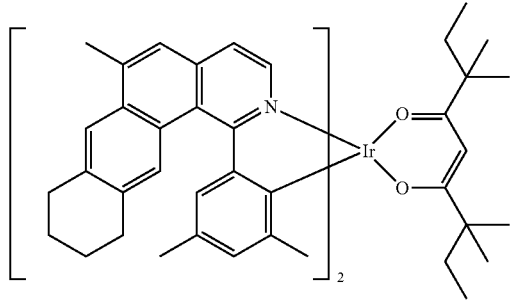
26
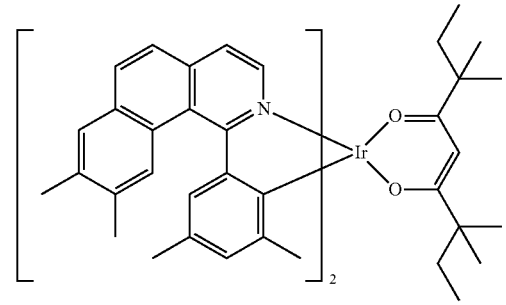
27
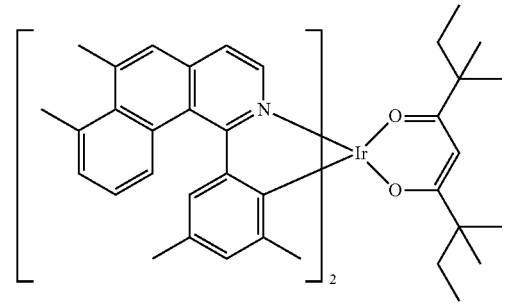
28
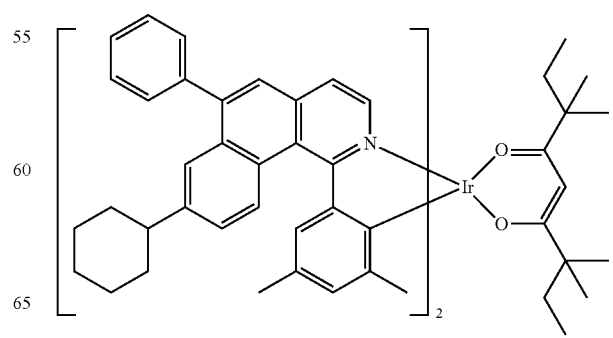
30
31
32

33
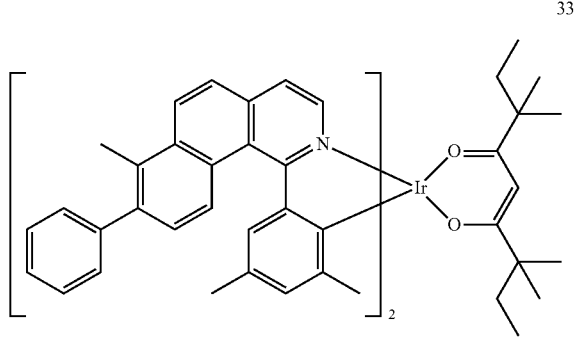
34
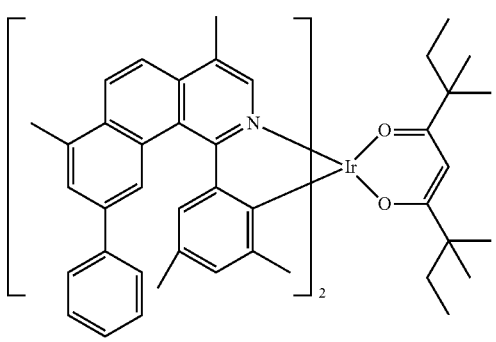
35
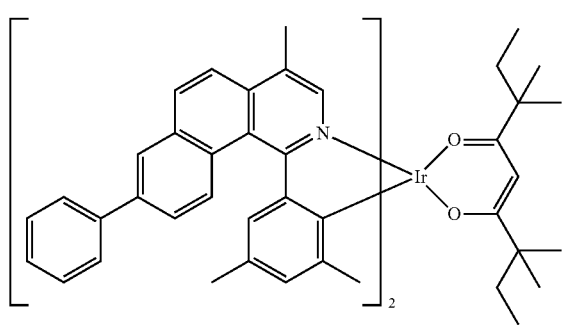
36
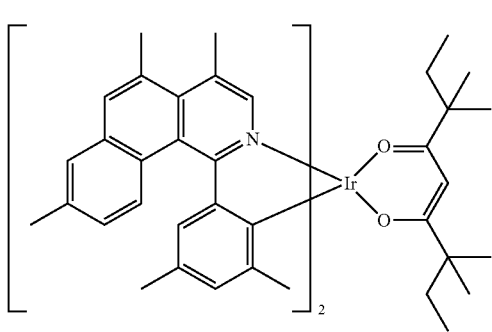
37
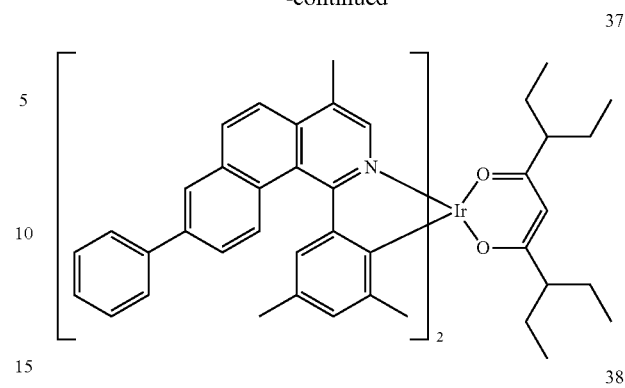
38
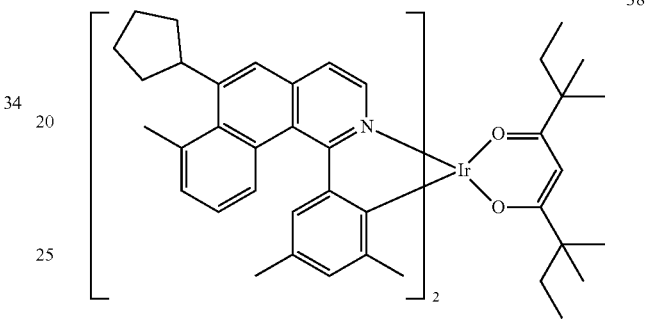
39
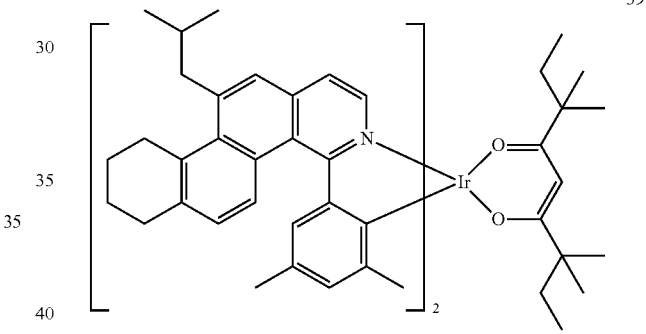
40
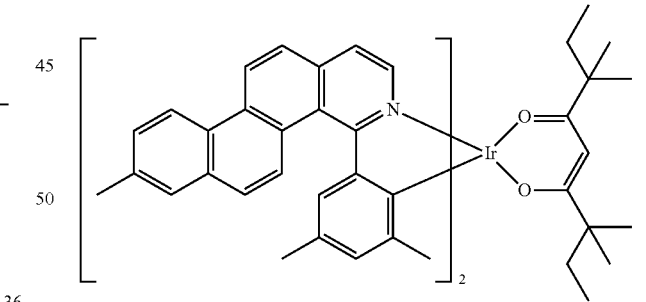
41
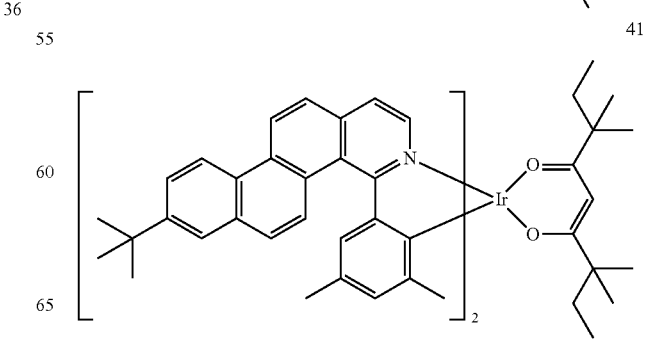

42

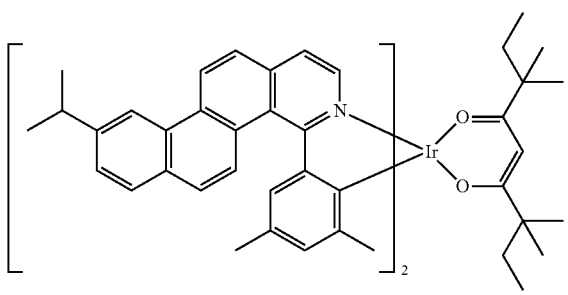

43

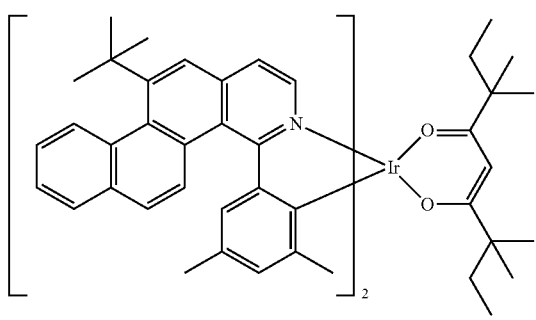

44

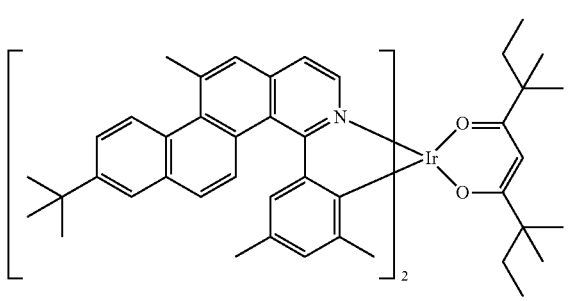

45

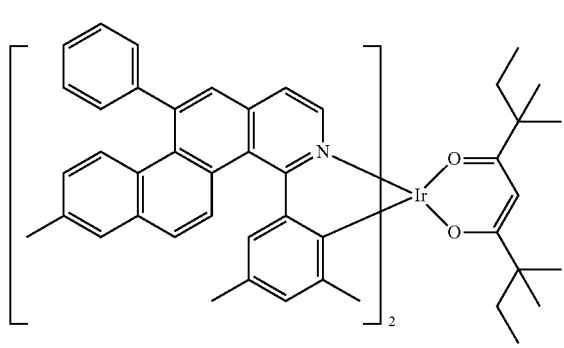

46

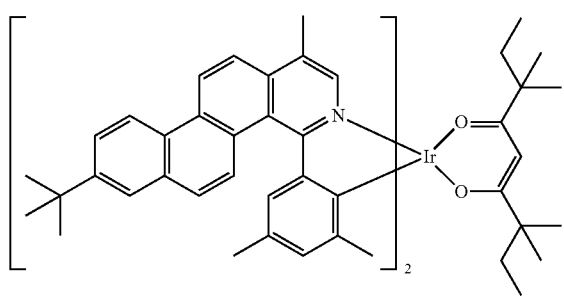

47

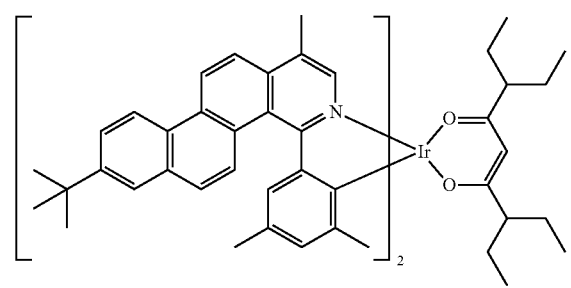

48

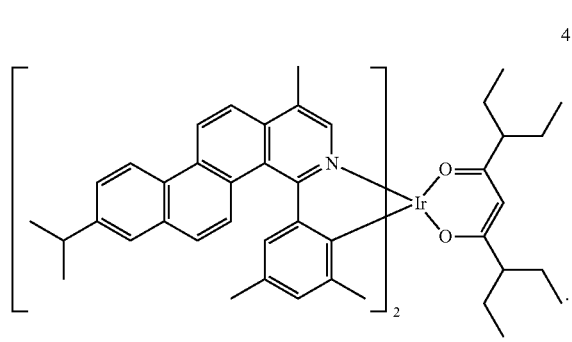

16. An organic light-emitting device comprising:
a first electrode;
a second electrode; and
an organic layer disposed between the first electrode and the second electrode and comprising an emission layer, wherein the organic layer includes at least one organometallic compound represented by Formula 1 of claim 1.

17. The organic light-emitting device of claim 16, wherein
the first electrode is an anode,
the second electrode is a cathode,
the organic layer further comprises a hole transport region between the first electrode and the emission layer, and an electron transport region between the emission layer and the second electrode,
the hole transport region comprises a hole injection layer, a hole transport layer, an electron blocking layer, a buffer layer or any combination thereof, and
the electron transport region comprises a hole blocking layer, an electron transport layer, an electron injection layer, or any combination thereof.

18. The organic light-emitting device of claim 16, wherein the organometallic compound is in the emission layer.

19. The organic light-emitting device of claim 18, wherein the emission layer further comprises a host, and an amount of the host in the emission layer is larger than an amount of the organometallic compound in the emission layer.

* * * * *